US010158377B2

(12) United States Patent
Indeck et al.

(10) Patent No.: US 10,158,377 B2
(45) Date of Patent: Dec. 18, 2018

(54) METHOD AND SYSTEM FOR ACCELERATED STREAM PROCESSING

(71) Applicant: IP Reservoir, LLC, St. Louis, MO (US)

(72) Inventors: Ronald S. Indeck, St. Louis, MO (US); David Mark Indeck, Highlands Ranch, CO (US); Naveen Singla, St. Louis, MO (US); Jason R. White, Manchester, MO (US)

(73) Assignee: IP RESERVOIR, LLC, St. Louis, MO (US)

( * ) Notice: Subject to any disclaimer, the term of this patent is extended or adjusted under 35 U.S.C. 154(b) by 0 days.

(21) Appl. No.: 15/404,794

(22) Filed: Jan. 12, 2017

(65) Prior Publication Data

US 2017/0123866 A1  May 4, 2017

Related U.S. Application Data

(62) Division of application No. 13/759,430, filed on Feb. 5, 2013, now Pat. No. 9,547,824, which is a division (Continued)

(51) Int. Cl.
*H03M 13/00* (2006.01)
*G06N 5/02* (2006.01)
(Continued)

(52) U.S. Cl.
CPC .......... *H03M 13/00* (2013.01); *G06F 9/542* (2013.01); *G06F 17/30466* (2013.01); *G06F 17/30516* (2013.01); *G06N 5/025* (2013.01)

(58) Field of Classification Search
CPC ............... G06F 9/542; G06F 17/30466; G06F 17/30516
See application file for complete search history.

(56) References Cited

U.S. PATENT DOCUMENTS 3,601,808 A   8/1971   Vlack
3,611,314 A  10/1971   Pritchard, Jr. et al.
(Continued)

FOREIGN PATENT DOCUMENTS

| EP | 0573991 | 12/1993 |
|----|---------|---------|
| EP | 0880088 | 11/1996 |
| EP | 0851358 A | 7/1998 |
| EP | 0887723 | 12/1998 |

(Continued)

OTHER PUBLICATIONS

"A Reconfigurable Computing Model for Biological Research Application of Smith-Waterman Analysis to Bacterial Genomes" A White Paper Prepared by Star Bridge Systems, Inc. [retrieved Dec. 12, 2006]. Retrieved from the Internet: <URL: http://www.starbridgesystems.com/resources/whitepapers/Smith%20Waterman%20Whitepaper.pdf.

(Continued)

*Primary Examiner* — Ajay Ojha
(74) *Attorney, Agent, or Firm* — Thompson Coburn LLP

(57) ABSTRACT

Disclosed herein are methods and systems for hardware-accelerating various data processing operations in a rule-based decision-making system such as a business rules engine, an event stream processor, and a complex event stream processor. Preferably, incoming data streams are checked against a plurality of rule conditions. Among the data processing operations that are hardware-accelerated include rule condition check operations, filtering operations, and path merging operations. The rule condition check operations generate rule condition check results for the processed data streams, wherein the rule condition check results are indicative of any rule conditions which have been satisfied by the data streams. The generation of such results with a low degree of latency provides enterprises with the ability to perform timely decision-making based on the data present in received data streams.

83 Claims, 30 Drawing Sheets

Related U.S. Application Data of application No. 12/121,473, filed on May 15, 2008, now Pat. No. 8,374,986.

(51) Int. Cl.
  *G06F 9/54*  (2006.01)
  *G06F 17/30*  (2006.01)

(56) References Cited

U.S. PATENT DOCUMENTS

| | | | |
|---|---|---|---|
| 3,729,712 A | 4/1973 | Glassman | |
| 3,824,375 A | 7/1974 | Gross et al. | |
| 3,848,235 A | 11/1974 | Lewis et al. | |
| 3,906,455 A | 9/1975 | Houston et al. | |
| 4,081,607 A | 3/1978 | Vitols et al. | |
| 4,298,898 A | 11/1981 | Cardot | |
| 4,314,356 A | 2/1982 | Scarbrough | |
| 4,385,393 A | 5/1983 | Chaure et al. | |
| 4,464,718 A | 8/1984 | Dixon et al. | |
| 4,550,436 A | 10/1985 | Freeman et al. | |
| 4,823,306 A | 4/1989 | Barbic et al. | |
| 4,941,178 A | 7/1990 | Chuang | |
| 5,023,910 A | 6/1991 | Thomson | |
| 5,050,075 A | 9/1991 | Herman et al. | |
| 5,101,424 A | 3/1992 | Clayton et al. | |
| 5,140,692 A | 8/1992 | Morita | |
| 5,161,103 A | 11/1992 | Kosaka et al. | |
| 5,163,131 A | 11/1992 | Row et al. | |
| 5,179,626 A | 1/1993 | Thomson | |
| 5,226,165 A | 7/1993 | Martin | |
| 5,243,655 A | 9/1993 | Wang | |
| 5,249,292 A | 9/1993 | Chiappa | |
| 5,255,136 A | 10/1993 | Machado et al. | |
| 5,263,156 A | 11/1993 | Bowen et al. | |
| 5,265,065 A | 11/1993 | Turtle | |
| 5,267,148 A | 11/1993 | Kosaka et al. | |
| 5,313,560 A | 5/1994 | Maruoka et al. | |
| 5,319,776 A | 6/1994 | Hile et al. | |
| 5,327,521 A | 7/1994 | Savic et al. | |
| 5,339,411 A | 8/1994 | Heaton, Jr. | |
| 5,347,634 A | 9/1994 | Herrell et al. | |
| 5,371,794 A | 12/1994 | Diffie et al. | |
| 5,388,259 A | 2/1995 | Fleischman et al. | |
| 5,396,253 A | 3/1995 | Chia | |
| 5,404,411 A | 4/1995 | Banton et al. | |
| 5,404,488 A | 4/1995 | Kerrigan et al. | |
| 5,418,951 A | 5/1995 | Damashek | |
| 5,421,028 A | 5/1995 | Swanson | |
| 5,432,822 A | 7/1995 | Kaewell, Jr. | |
| 5,440,723 A | 8/1995 | Arnold et al. | |
| 5,461,712 A | 10/1995 | Chelstowski et al. | |
| 5,463,701 A | 10/1995 | Kantner, Jr. et al. | |
| 5,465,353 A | 11/1995 | Hull et al. | |
| 5,481,735 A | 1/1996 | Mortensen et al. | |
| 5,488,725 A | 1/1996 | Turtle et al. | |
| 5,497,488 A | 3/1996 | Akizawa et al. | |
| 5,517,642 A | 5/1996 | Bezek et al. | |
| 5,544,352 A | 8/1996 | Egger | |
| 5,546,578 A | 8/1996 | Takada et al. | |
| 5,651,125 A | 7/1997 | Witt et al. | |
| 5,687,297 A | 11/1997 | Coonan et al. | |
| 5,701,464 A | 12/1997 | Aucsmith | |
| 5,704,060 A | 12/1997 | Del Monte | |
| 5,712,942 A | 1/1998 | Jennings et al. | |
| 5,721,898 A | 2/1998 | Beardsley et al. | |
| 5,740,466 A | 4/1998 | Geldman et al. | |
| 5,774,835 A | 6/1998 | Ozawa et al. | |
| 5,774,839 A | 6/1998 | Shlomot | |
| 5,781,772 A | 7/1998 | Wilkinson et al. | |
| 5,781,921 A | 7/1998 | Nichols | |
| 5,805,832 A | 9/1998 | Brown et al. | |
| 5,813,000 A | 9/1998 | Furlani | |
| 5,819,273 A | 10/1998 | Vora et al. | |
| 5,819,290 A | 10/1998 | Fujita et al. | |
| 5,826,075 A | 10/1998 | Bealkowski et al. | |
| 5,864,738 A | 1/1999 | Kessler et al. | |
| 5,870,730 A | 2/1999 | Furuya et al. | |
| 5,886,701 A | 3/1999 | Chauvin et al. | |
| 5,913,211 A | 6/1999 | Nitta | |
| 5,930,753 A | 7/1999 | Potamianos et al. | |
| 5,943,421 A | 8/1999 | Grabon | |
| 5,943,429 A | 8/1999 | Händel | |
| 5,978,801 A | 11/1999 | Yuasa | |
| 5,987,432 A | 11/1999 | Zusman et al. | |
| 5,991,881 A | 11/1999 | Conklin et al. | |
| 5,995,963 A | 11/1999 | Nanba et al. | |
| 6,006,264 A | 12/1999 | Colby et al. | |
| 6,023,760 A | 2/2000 | Karttunen | |
| 6,028,939 A | 2/2000 | Yin | |
| 6,044,407 A | 3/2000 | Jones et al. | |
| 6,058,391 A | 5/2000 | Gardner | |
| 6,064,739 A | 5/2000 | Davis | |
| 6,067,569 A | 5/2000 | Khaki et al. | |
| 6,070,172 A | 5/2000 | Lowe | |
| 6,073,160 A | 6/2000 | Grantham et al. | |
| 6,105,067 A | 8/2000 | Batra | |
| 6,134,551 A | 10/2000 | Aucsmith | |
| 6,138,176 A | 10/2000 | McDonald et al. | |
| RE36,946 E | 11/2000 | Diffie et al. | |
| 6,147,976 A | 11/2000 | Shand et al. | |
| 6,169,969 B1 | 1/2001 | Cohen | |
| 6,175,874 B1 | 1/2001 | Imai et al. | |
| 6,226,676 B1 | 5/2001 | Crump et al. | |
| 6,236,980 B1 | 5/2001 | Reese | |
| 6,279,113 B1 | 8/2001 | Vaidya | |
| 6,317,795 B1 | 11/2001 | Malkin et al. | |
| 6,336,150 B1 | 1/2002 | Ellis et al. | |
| 6,339,819 B1 | 1/2002 | Huppenthal et al. | |
| 6,370,645 B1 | 4/2002 | Lee et al. | |
| 6,377,942 B1 | 4/2002 | Hinsley et al. | |
| 6,381,242 B1 | 4/2002 | Maher, III et al. | |
| 6,389,532 B1 | 5/2002 | Gupta et al. | |
| 6,397,259 B1 | 5/2002 | Lincke et al. | |
| 6,397,335 B1 | 5/2002 | Franczek et al. | |
| 6,412,000 B1 | 6/2002 | Riddle et al. | |
| 6,430,272 B1 | 8/2002 | Maruyama et al. | |
| 6,456,632 B1 | 9/2002 | Baum et al. | |
| 6,463,474 B1 | 10/2002 | Fuh et al. | |
| 6,499,107 B1 | 12/2002 | Gleichauf et al. | |
| 6,535,868 B1 | 3/2003 | Galeazzi et al. | |
| 6,564,263 B1 | 5/2003 | Bergman et al. | |
| 6,578,147 B1 | 6/2003 | Shanklin et al. | |
| 6,625,150 B1 | 9/2003 | Yu | |
| 6,704,816 B1 | 3/2004 | Burke | |
| 6,711,558 B1 | 3/2004 | Indeck et al. | |
| 6,765,918 B1 | 7/2004 | Dixon et al. | |
| 6,772,345 B1 | 8/2004 | Shetty | |
| 6,785,677 B1 | 8/2004 | Fritchman | |
| 6,804,667 B1 | 10/2004 | Martin | |
| 6,807,156 B1 | 10/2004 | Veres et al. | |
| 6,839,686 B1 | 1/2005 | Galant | |
| 6,850,906 B1 | 2/2005 | Chadha et al. | |
| 6,870,837 B2 | 3/2005 | Ho et al. | |
| 6,877,044 B2 | 4/2005 | La et al. | |
| 6,886,103 B1 | 4/2005 | Brustoloni et al. | |
| 6,901,461 B2 | 5/2005 | Bennett | |
| 6,931,408 B2 | 8/2005 | Adams et al. | |
| 6,931,545 B1 | 8/2005 | Ta et al. | |
| 6,944,168 B2 | 9/2005 | Paatela et al. | |
| 6,978,223 B2 | 12/2005 | Milliken | |
| 6,980,976 B2 | 12/2005 | Alpha et al. | |
| 6,981,054 B1 | 12/2005 | Krishna | |
| 7,007,208 B1 | 2/2006 | Hibbert et al. | |
| 7,019,674 B2 | 3/2006 | Cadambi et al. | |
| 7,046,848 B1 | 5/2006 | Olcott | |
| 7,093,023 B2 | 8/2006 | Lockwood et al. | |
| 7,127,424 B2 | 10/2006 | Kemp, II et al. | |
| 7,139,743 B2 | 11/2006 | Indeck et al. | |
| 7,149,715 B2 | 12/2006 | Browne et al. | |
| 7,167,980 B2 | 1/2007 | Chiu | |
| 7,177,833 B1 | 2/2007 | Marynowski et al. | |
| 7,181,437 B2 | 2/2007 | Indeck et al. | |
| 7,181,608 B2 | 2/2007 | Fallon et al. | |
| 7,222,114 B1 | 5/2007 | Chan et al. | |

(56) References Cited

U.S. PATENT DOCUMENTS

| | | |
|---|---|---|
| 7,224,185 B2 | 5/2007 | Campbell et al. |
| 7,225,188 B1 | 5/2007 | Gai et al. |
| 7,251,629 B1 | 7/2007 | Marynowski et al. |
| 7,287,037 B2 | 10/2007 | An et al. |
| 7,305,383 B1 | 12/2007 | Kubesh et al. |
| 7,305,391 B2 | 12/2007 | Wyschogrod et al. |
| 7,363,277 B1 | 4/2008 | Dutta et al. |
| 7,386,564 B2 | 6/2008 | Abdo et al. |
| 7,408,932 B2 | 8/2008 | Kounavis et al. |
| 7,411,957 B2 | 8/2008 | Stacy et al. |
| 7,420,931 B2 | 9/2008 | Nanda et al. |
| 7,444,515 B2 | 10/2008 | Dharmapurikar et al. |
| 7,454,418 B1 | 11/2008 | Wang |
| 7,457,834 B2 | 11/2008 | Jung et al. |
| 7,461,064 B2 | 12/2008 | Fontoura et al. |
| 7,467,155 B2 | 12/2008 | McCool et al. |
| 7,478,431 B1 | 1/2009 | Nachenberg |
| 7,480,253 B1 | 1/2009 | Allan |
| 7,487,327 B1 | 2/2009 | Chang et al. |
| 7,496,108 B2 | 2/2009 | Biran et al. |
| 7,552,107 B2 | 6/2009 | Indeck et al. |
| 7,558,925 B2 | 7/2009 | Bouchard et al. |
| 7,565,525 B2 | 7/2009 | Vorbach et al. |
| 7,636,703 B2 | 12/2009 | Taylor |
| 7,660,793 B2 | 2/2010 | Indeck et al. |
| 7,680,790 B2 | 3/2010 | Indeck et al. |
| 7,685,121 B2 | 3/2010 | Brown et al. |
| 7,685,254 B2 | 3/2010 | Pandya |
| 7,701,945 B2 | 4/2010 | Roesch et al. |
| 7,702,629 B2 | 4/2010 | Cytron et al. |
| 7,783,862 B2 | 8/2010 | Cameron |
| 7,805,392 B1 | 9/2010 | Steele et al. |
| 7,840,482 B2 | 11/2010 | Singla et al. |
| 7,917,299 B2 | 3/2011 | Buhler et al. |
| 7,921,046 B2 | 4/2011 | Parsons et al. |
| 7,945,528 B2 | 5/2011 | Cytron et al. |
| 7,949,650 B2 | 5/2011 | Indeck et al. |
| 8,095,508 B2 | 1/2012 | Chamberlain et al. |
| 8,374,986 B2 | 2/2013 | Indeck et al. |
| 8,407,588 B1 | 3/2013 | Hu et al. |
| 8,620,881 B2 | 12/2013 | Chamberlain et al. |
| 8,751,452 B2 | 6/2014 | Chamberlain et al. |
| 8,768,888 B2 | 7/2014 | Chamberlain et al. |
| 9,176,775 B2 | 11/2015 | Chamberlain et al. |
| 9,547,824 B2 | 1/2017 | Indeck et al. |
| 9,633,093 B2 | 4/2017 | Henrichs et al. |
| 9,633,097 B2 | 4/2017 | Tidwell et al. |
| 2001/0013048 A1 | 8/2001 | Imbert de Tremiolles et al. |
| 2001/0014093 A1 | 8/2001 | Yoda et al. |
| 2001/0052038 A1 | 12/2001 | Fallon et al. |
| 2001/0056547 A1 | 12/2001 | Dixon |
| 2002/0031125 A1 | 3/2002 | Sato |
| 2002/0069370 A1 | 6/2002 | Mack |
| 2002/0091691 A1 | 7/2002 | Sharp |
| 2002/0095512 A1 | 7/2002 | Rana et al. |
| 2002/0103663 A1 | 8/2002 | Bankier et al. |
| 2002/0105911 A1 | 8/2002 | Pruthi et al. |
| 2002/0129140 A1 | 9/2002 | Peled et al. |
| 2002/0150248 A1 | 10/2002 | Kovacevic |
| 2002/0162025 A1 | 10/2002 | Sutton et al. |
| 2002/0166063 A1 | 11/2002 | Lachman et al. |
| 2003/0009693 A1 | 1/2003 | Brock et al. |
| 2003/0014521 A1 | 1/2003 | Elson et al. |
| 2003/0014662 A1 | 1/2003 | Gupta et al. |
| 2003/0018630 A1 | 1/2003 | Indeck et al. |
| 2003/0023876 A1 | 1/2003 | Bardsley et al. |
| 2003/0037037 A1 | 2/2003 | Adams et al. |
| 2003/0043805 A1 | 3/2003 | Graham et al. |
| 2003/0051043 A1 | 3/2003 | Wyschogrod et al. |
| 2003/0065943 A1 | 4/2003 | Geis et al. |
| 2003/0074582 A1 | 4/2003 | Patel et al. |
| 2003/0110229 A1 | 6/2003 | Kulig et al. |
| 2003/0115485 A1 | 6/2003 | Milliken |
| 2003/0163715 A1 | 8/2003 | Wong |
| 2003/0169877 A1 | 9/2003 | Liu et al. |
| 2003/0177253 A1 | 9/2003 | Schuehler et al. |
| 2003/0221013 A1 | 11/2003 | Lockwood et al. |
| 2004/0019703 A1 | 1/2004 | Burton |
| 2004/0028047 A1 | 2/2004 | Hou et al. |
| 2004/0049596 A1 | 3/2004 | Schuehler et al. |
| 2004/0054924 A1 | 3/2004 | Chuah et al. |
| 2004/0064737 A1 | 4/2004 | Milliken et al. |
| 2004/0100977 A1 | 5/2004 | Suzuki et al. |
| 2004/0111632 A1 | 6/2004 | Halperin |
| 2004/0117645 A1 | 6/2004 | Okuda et al. |
| 2004/0162826 A1 | 8/2004 | Wyschogrod et al. |
| 2004/0177340 A1 | 9/2004 | Hsu et al. |
| 2004/0186804 A1 | 9/2004 | Chakraborty et al. |
| 2004/0186814 A1 | 9/2004 | Chalermkraivuth et al. |
| 2004/0196905 A1 | 10/2004 | Yamane et al. |
| 2004/0199448 A1 | 10/2004 | Chalermkraivuth et al. |
| 2004/0205149 A1 | 10/2004 | Dillon et al. |
| 2005/0005145 A1 | 1/2005 | Teixeira |
| 2005/0086520 A1 | 4/2005 | Dharmapurikar et al. |
| 2005/0131790 A1 | 6/2005 | Benzschawel et al. |
| 2005/0175010 A1 | 8/2005 | Wilson et al. |
| 2005/0187844 A1 | 8/2005 | Chalermkraivuth et al. |
| 2005/0187845 A1 | 8/2005 | Eklund et al. |
| 2005/0187846 A1 | 8/2005 | Subbu et al. |
| 2005/0187847 A1 | 8/2005 | Bonissone et al. |
| 2005/0187848 A1 | 8/2005 | Bonissone et al. |
| 2005/0187849 A1 | 8/2005 | Bollapragada et al. |
| 2005/0187974 A1 | 8/2005 | Gong |
| 2005/0195832 A1 | 9/2005 | Dharmapurikar et al. |
| 2005/0229254 A1 | 10/2005 | Singh et al. |
| 2006/0020715 A1 | 1/2006 | Jungck |
| 2006/0031154 A1 | 2/2006 | Noviello et al. |
| 2006/0031156 A1 | 2/2006 | Noviello et al. |
| 2006/0031263 A1 | 2/2006 | Arrouye et al. |
| 2006/0031737 A1 | 2/2006 | Chugg et al. |
| 2006/0036693 A1 | 2/2006 | Hulten et al. |
| 2006/0047636 A1 | 3/2006 | Mohania et al. |
| 2006/0053295 A1 | 3/2006 | Madhusudan et al. |
| 2006/0059213 A1 | 3/2006 | Evoy |
| 2006/0129745 A1 | 6/2006 | Thiel et al. |
| 2006/0198375 A1 | 9/2006 | Baik et al. |
| 2006/0242123 A1 | 10/2006 | Williams, Jr. |
| 2006/0259417 A1 | 11/2006 | Marynowski et al. |
| 2006/0269148 A1 | 11/2006 | Farber et al. |
| 2006/0294059 A1 | 12/2006 | Chamberlain et al. |
| 2007/0011175 A1 | 1/2007 | Langseth et al. |
| 2007/0011183 A1 | 1/2007 | Langseth et al. |
| 2007/0011317 A1 | 1/2007 | Brandyburg et al. |
| 2007/0011687 A1 | 1/2007 | Ilik et al. |
| 2007/0061594 A1 | 3/2007 | Ginter et al. |
| 2007/0067108 A1 | 3/2007 | Buhler et al. |
| 2007/0067481 A1 | 3/2007 | Sharma et al. |
| 2007/0078837 A1 | 4/2007 | Indeck et al. |
| 2007/0094199 A1 | 4/2007 | Deshpande et al. |
| 2007/0112748 A1 | 5/2007 | Angell et al. |
| 2007/0112837 A1 | 5/2007 | Houh et al. |
| 2007/0118500 A1 | 5/2007 | Indeck et al. |
| 2007/0130140 A1 | 6/2007 | Cytron et al. |
| 2007/0156574 A1 | 7/2007 | Marynowski et al. |
| 2007/0156669 A1 | 7/2007 | Marchisio et al. |
| 2007/0174841 A1 | 7/2007 | Chamberlain et al. |
| 2007/0179935 A1 | 8/2007 | Lee et al. |
| 2007/0209068 A1 | 9/2007 | Ansari et al. |
| 2007/0237327 A1 | 10/2007 | Taylor et al. |
| 2007/0244859 A1 | 10/2007 | Trippe et al. |
| 2007/0260602 A1 | 11/2007 | Taylor |
| 2007/0277036 A1 | 11/2007 | Chamberlain et al. |
| 2007/0294157 A1 | 12/2007 | Singla et al. |
| 2008/0005062 A1 | 1/2008 | Gupta et al. |
| 2008/0021874 A1 | 1/2008 | Dahl et al. |
| 2008/0030383 A1 | 2/2008 | Cameron |
| 2008/0077582 A1 | 3/2008 | Reed |
| 2008/0084573 A1 | 4/2008 | Horowitz et al. |
| 2008/0086274 A1 | 4/2008 | Chamberlain et al. |
| 2008/0104542 A1 | 5/2008 | Cohen et al. |
| 2008/0109413 A1 | 5/2008 | Indeck et al. |
| 2008/0114724 A1 | 5/2008 | Indeck et al. |
| 2008/0114725 A1 | 5/2008 | Indeck et al. |
| 2008/0114760 A1 | 5/2008 | Indeck et al. |

(56) References Cited

U.S. PATENT DOCUMENTS

| | | |
|---|---|---|
| 2008/0126320 A1 | 5/2008 | Indeck et al. |
| 2008/0133453 A1 | 6/2008 | Indeck et al. |
| 2008/0133519 A1 | 6/2008 | Indeck et al. |
| 2008/0243675 A1 | 10/2008 | Parsons et al. |
| 2008/0307435 A1 | 12/2008 | Rehman |
| 2009/0007197 A1 | 1/2009 | Turner |
| 2009/0182683 A1 | 7/2009 | Taylor et al. |
| 2009/0262741 A1 | 10/2009 | Jungck et al. |
| 2009/0287628 A1 | 11/2009 | Indeck et al. |
| 2009/0300054 A1 | 12/2009 | Fisher et al. |
| 2010/0094858 A1 | 4/2010 | Indeck et al. |
| 2010/0145902 A1 | 6/2010 | Boyan et al. |
| 2010/0198850 A1 | 8/2010 | Cytron et al. |
| 2010/0284532 A1 | 11/2010 | Burnett et al. |
| 2011/0040701 A1 | 2/2011 | Singla et al. |
| 2011/0078109 A1 | 3/2011 | Griggs et al. |
| 2011/0123021 A1 | 5/2011 | Tepper |
| 2012/0311411 A1 | 12/2012 | Kirkpatrick |
| 2013/0151458 A1 | 6/2013 | Indeck et al. |
| 2014/0114908 A1 | 4/2014 | Henrichs et al. |
| 2014/0114929 A1 | 4/2014 | Henrichs et al. |
| 2014/0279864 A1 | 9/2014 | Lopyrev et al. |
| 2015/0310077 A1 | 10/2015 | Lancaster et al. |
| 2015/0310078 A1 | 10/2015 | Lancaster et al. |
| 2015/0310087 A1 | 10/2015 | Tidwell et al. |

FOREIGN PATENT DOCUMENTS

| | | |
|---|---|---|
| EP | 0911738 A | 4/1999 |
| JP | 02136900 A | 5/1990 |
| JP | 03014075 A | 1/1991 |
| JP | 09145544 A | 6/1997 |
| JP | 2000286715 A | 10/2000 |
| JP | 2001357048 A | 12/2001 |
| JP | 2002101089 A | 4/2002 |
| WO | 199010910 | 9/1990 |
| WO | 1994/09443 A1 | 4/1994 |
| WO | 199737735 | 10/1997 |
| WO | 199905814 | 2/1999 |
| WO | 2000041136 A1 | 7/2000 |
| WO | 2001022425 A | 3/2001 |
| WO | 2001039577 | 6/2001 |
| WO | 2001061913 | 8/2001 |
| WO | 2001080082 A2 | 10/2001 |
| WO | 2001080558 | 10/2001 |
| WO | 2002061525 | 8/2002 |
| WO | 2002082271 | 10/2002 |
| WO | 2003100650 | 4/2003 |
| WO | 2003036845 | 5/2003 |
| WO | 2004017604 | 2/2004 |
| WO | 2004042560 A | 5/2004 |
| WO | 2004042561 A | 5/2004 |
| WO | 2004042562 | 5/2004 |
| WO | 2004042574 A | 5/2004 |
| WO | 2005017708 A | 2/2005 |
| WO | 2005026925 | 3/2005 |
| WO | 2005048134 A | 5/2005 |
| WO | 2006023948 | 3/2006 |
| WO | 2006096324 | 9/2006 |
| WO | 2007064685 | 6/2007 |
| WO | 2007087507 | 8/2007 |
| WO | 2008063973 | 5/2008 |
| WO | 2008063974 | 5/2008 |
| WO | 2009029842 | 3/2009 |
| WO | 2009089467 A2 | 7/2009 |
| WO | 2009140363 A1 | 11/2009 |
| WO | 2014/066416 A2 | 5/2014 |
| WO | 2015/164639 | 10/2015 |

OTHER PUBLICATIONS

"ACTIV Financial Announces Hardware Based Market Data Feed Processing Strategy", for Release on Apr. 2, 2007, 2 pages.

"ACTIV Financial Delivers Accelerated Market Data Feed", Apr. 6, 2007, byline of Apr. 2, 2007, downloaded from http://hpcwire.com/hpc.1346816.html on Jun. 19, 2007, 3 pages.

"DRC, Exegy Announce Joint Development Agreement", Jun. 8, 2007, byline of Jun. 4, 2007; downloaded from http://www.hpcwire.com/hpc/1595644.html on Jun. 19, 2007, 3 pages.

"Lucent Technologies Delivers "PayloadPlus" Network Processors for Programmable, MultiProtocol, OC-48c Processing", Lucent Technologies Press Release, downloaded from http://www.lucent.com/press/1000/0010320.meb.html on Mar. 21, 2002.

"Overview, Field Programmable Port Extender", Jan. 2002 Gigabit Workshop Tutorial, Washington University, St. Louis, MO, Jan. 3-4, 2002, pp. 1-4.

"Payload Plus™ Agere System Interface", Agere Systems Product Brief, Jun. 2001, downloaded from Internet, Jan. 2002, pp. 1-6.

"RFC793: Transmission Control Protocol, Darpa Internet Program, Protocol Specification", Sep. 1981.

"Technology Overview", Data Search Systems Incorporated, downloaded from the http://www.datasearchsystems.com/tech.htm on Apr. 19, 2004.

"The Field-Programmable Port Extender (FPX)", downloaded from http://www.arl.wustl.edu/arl/ in Mar. 2002.

Aldwairi et al., "Configurable String Matching Hardware for Speeding up Intrusion Detection", SIRARCH Comput. Archit. News, vol. 33, No. 1, pp. 99-107, Mar. 2005.

Amanuma et al., "A FPGA Architecture for High Speed Computation", Proceedings of 60th Convention Architecture, Software Science, Engineering, Mar. 14, 2000, pp. 1-163-1-164, Information Processing Society, Japan.

Amer-Yahia et al., "XQuery 1.0 and XPath 2.0 Full-Text 1.0", W3C Working Draft, http://www.w3.org/TR/query-full-text/, May 18, 2007—parts 1-4.

Anerousis et al., "Using the AT&T Labs PacketScope for Internet Measurement, Design, and Performance Analysis", Network and Distributed Systems Research Laboratory, AT&T Labs-Research, Florham, Park, NJ, Oct. 1997.

Anonymous, "Method for Allocating Computer Disk Space to a File of Known Size", IBM Technical Disclosure Bulletin, vol. 27, No. 10B, Mar. 1, 1985, New York.

Arnold et al., "The Splash 2 Processor and Applications", Proceedings 1993 IEEE International Conference on Computer Design: VLSI in Computers and Processors (ICCD '93), Oct. 3, 1993, pp. 482-485, IEEE Computer Society, Cambridge, MA USA.

Artan et al., "Multi-packet Signature Detection using Prefix Bloom Filters", 2005, IEEE, pp. 1811-1816.

Asami et al., "Improvement of DES Key Search on FPGA-Based Parallel Machine "RASH"", Proceedings of Information Processing Society, Aug. 15, 2000, pp. 50-57, vol. 41, No. SIG5 (HPS1), Japan.

Baboescu et al., "Scalable Packet Classification," SIGCOMM'01, Aug. 27-31, 2001, pp. 199-210, San Diego, California, USA; http://www.ecse.rpi.edu/homepages/shivkuma/teaching/sp2001/readings/baboescu-pkt-classification.pdf.

Baer, "Computer Systems Architecture", 1980, pp. 262-265; Computer Science Press, Potomac, Maryland.

Baeza-Yates et al., "New and Faster Filters for Multiple Approximate String Matching", Random Structures and Algorithms (RSA), Jan. 2002, pp. 23-49, vol. 20, No. 1.

Baker et al., "High-throughput Linked-Pattern Matching for Intrusion Detection Systems", ANCS 2005: Proceedings of the 2005 Symposium on Architecture for Networking and Communications Systems, pp. 193-202, ACM Press, 2005.

Barone-Adesi et al., "Efficient Analytic Approximation of American Option Values", Journal of Finance, vol. 42, No. 2 (Jun. 1987), pp. 301-320.

Behrens et al., "BLASTN Redundancy Filter in Reprogrammable Hardware," Final Project Submission, Fall 2003, Department of Computer Science and Engineering, Washington University.

Berk, "JLex: A lexical analyzer generator for Java™", downloaded from http://www.cs.princeton.edu/~appel/modern/java/Jlex/ in Jan. 2002, pp. 1-18.

Bloom, "Space/Time Trade-offs in Hash Coding With Allowable Errors", Communications of the ACM, Jul. 1970, pp. 422-426, vol.

(56) References Cited

OTHER PUBLICATIONS

13, No. 7, Computer Usage Company, Newton Upper Falls, Massachusetts, USA.
Braun et al., "Layered Protocol Wrappers for Internet Packet Processing in Reconfigurable Hardware", Proceedings of Hot Interconnects 9 (Hotl-9) Stanford, CA, Aug. 22-24, 2001, pp. 93-98.
Braun et al., "Protocol Wrappers for Layered Network Packet Processing in Reconfigurable Hardware", IEEE Micro, Jan.-Feb. 2002, pp. 66-74.
Brodie et al., "Dynamic Reconfigurable Computing", in Proc. of 9th Military and Aerospace Programmable Logic Devices International Conference, Sep. 2006.
Canvar et al., "N-Gram-Based Text Categorization", Proceedings of SDAIR-94, 3rd Annual Symposium on Document Analysis and Information Retrieval, Las Vegas, pp. 161-175, 1994.
Chamberlain et al., "Achieving Real Data Throughput for an FPGA Co-Processor on Commodity Server Platforms", Proc. of 1st Workshop on Building Block Engine Architectures for Computers and Networks, Oct. 2004, Boston, MA.
Chamberlain et al., "The Mercury System: Embedding Computation Into Disk Drives", 7th High Performance Embedded Computing Workshop, Sep. 2003, Boston, MA.
Chaney et al., "Design of a Gigabit ATM Switch", Washington University, St. Louis.
Cho et al., "Deep Packet Filter with Dedicated Logic and Read Only Memories", 12th Annual IEEE Symposium on Field-Programmable Custom Computing Machines, Apr. 2004.
Cho, "A Fast Regular Expression Indexing Engine", Proc. of 18th Int'l Conv. on Data Engineering, 2001, pp. 1-12.
Choi et al., "Design of a Flexible Open Platform for High Performance Active Networks", Allerton Conference, 1999, Champaign, IL.
Clark et al., "Scalable Pattern Matching for High Speed Networks", Proceedings of the 12th Annual IEEE Symposium on Field-Programmable Custom Computing Machines, 2004; FCCM 2004, Apr. 20-23, 2004; pp. 249-257; IEEE Computer Society; Cambridge, MA USA.
Cloutier et al., "VIP: An FPGA-Based Processor for Image Processing and Neural Networks", Proceedings of Fifth International Conference on Microelectronics for Neural Networks, Feb. 12, 1996, pp. 330-336, Los Alamitos, California.
Compton et al., "Configurable Computing: A Survey of Systems and Software", Technical Report, Northwestern University, Dept. of ECE, 1999.
Compton et al., "Reconfigurable Computing: A Survey of Systems and Software", Technical Report, Northwestern University, Dept. of ECE, 1999, presented by Yi-Gang Tai.
Cong et al., "An Optional Technology Mapping Algorithm for Delay Optimization in Lookup-Table Based FPGA Designs", IEEE, 1992, pp. 48-53.
Crosman, "Who Will Cure Your Data Latency?", Storage & Servers, Jun. 20, 2007, URL: http://www.networkcomputing.com/article/printFullArticleSrc.jhtml?article ID=199905630.
Cuppu and Jacob, "Organizational Design Trade-Offs at the DRAM, Memory Bus and Memory Controller Level: Initial Results," Technical Report UMB-SCA-1999-2, Univ. of Maryland Systems & Computer Architecture Group, Nov. 1999, pp. 1-10.
Denoyer et al., "HMM-based Passage Models for Document Classification and Ranking", Proceedings of ECIR-01, 23rd European Colloquim Information Retrieval Research, Darmstatd, DE, pp. 126-135, 2001.
Department of Computer Science & Engineering; "Technical Reports"; Publication (http://cse.seas.wustl.edu/Research/Publications.asp); Dec. 17, 2007; pp. 1-26; Washington University in St. Louis.
Dharmapurikar et al., "Deep Packet Inspection Using Parallel Bloom Filters," IEEE Micro, Jan.-Feb. 2004, vol. 24, Issue: 1, pp. 52-61.
Dharmapurikar et al., "Deep Packet Inspection Using Parallel Bloom Filters," Symposium on High Performance Interconnects (Hotl), Stanford, California, 2003, pp. 44-51.
Dharmapurikar et al., "Design and Implementation of a String Matching System for Network Intrusion Detection using FPGA-based Bloom Filters", Proc. of 12th Annual IEEE Symposium on Field Programmable Custom Computing Machines, 2004, pp. 1-10.
Dharmapurikar et al., "Longest Prefix Matching Using Bloom Filters," SIGCOMM, 2003, pp. 201-212.
Dharmapurikar et al., "Robust TCP Stream Reassembly in the Presence of Adversaries", Proc. of the 14th Conference on USENIX Security Symposium—vol. 14, 16 pages, Baltimore, MD, 2005; http://www.icir.org/vern/papers/TcpReassembly/TCPReassembly.pdf.
Kulig et al., "System and Method for Controlling Transmission of Data Packets Over an Information Network", pending U.S. Patent Application.
Lancaster et al., "Acceleration of Ungapped Extension in Mercury BLAST", Seventh (7th) Workshop on Media and Streaming Processors, Nov. 12, 2005, Thirty-Eighth (38th) International Symposium on Microarchitecture (MICRO-38), Barcelona, Spain.
Li et al., "Large-Scale IP Traceback in High-Speed Internet: Practical Techniques and Theoretical Foundation", Proceedings of the 2004 IEEE Symposium on Security and Privacy, 2004, pp. 1-15.
Lin et al., "Real-Time Image Template Matching Based on Systolic Array Processor", International Journal of Electronics; Dec. 1, 1992; pp. 1165-1176; vol. 73, No. 6; London, Great Britain.
Lockwood et al., "Field Programmable Port Extender (FPX) for Distributed Routing and Queuing", ACM International Symposium on Field Programmable Gate Arrays (FPGA 2000), Monterey, CA, Feb. 2000, pp. 137-144.
Lockwood et al., "Hello, World: A Simple Application for the Field Programmable Port Extender (FPX)", Washington University, Department of Computer Science, Technical Report WUCS-00-12, Jul. 11, 2000.
Lockwood et al., "Parallel FPGA Programming over Backplane Chassis", Washington University, Department of Computer Science, Technical Report WUCS-00-11, Jun. 12, 2000.
Lockwood et al., "Reprogrammable Network Packet Processing on the Field Programmable Port Extender (FPX)", ACM International Symposium on Field Programmable Gate Arrays (FPGA 2001), Monterey, CA, Feb. 2001, pp. 87-93.
Lockwood, "An Open Platform for Development of Network Processing Modules in Reprogrammable Hardware", IEC DesignCon 2001, Santa Clara, CA, Jan. 2001, Paper WB-19.
Lockwood, "Building Networks with Reprogrammable Hardware", Field Programmable Port Extender: Jan. 2002 Gigabit Workshop Tutorial, Washington University, St. Louis, MO, Jan. 3-4, 2002.
Lockwood, "Evolvable Internet Hardware Platforms", NASA/DoD Workshop on Evolvable Hardware (EHW'01), Long Beach, CA, Jul. 12-14, 2001, pp. 271-279.
Lockwood, "Hardware Laboratory Configuration", Field Programmable Port Extender: Jan. 2002 Gigabit Workshop Tutorial, Washington University, St. Louis, MO, Jan. 3-4, 2002.
Lockwood, "Introduction", Field Programmable Port Extender: Jan. 2002 Gigabit Workshop Tutorial, Washington University, St. Louis, MO, Jan. 3-4, 2002.
Lockwood, "Platform and Methodology for Teaching Design of Hardware Modules in Internet Routers and Firewalls", IEEE Computer Society International Conference on Microelectronic Systems Education (MSE'2001), Las Vegas, NV, Jun. 17-18, 2001, pp. 56-57.
Lockwood, "Protocol Processing on the FPX", Field Programmable Port Extender: Jan. 2002 Gigabit Workshop Tutorial, Washington University, St. Louis, MO, Jan. 3-4, 2002.
Lockwood, "Simulation and Synthesis", Field Programmable Port Extender: Jan. 2002 Gigabit Workshop Tutorial, Washington University, St. Louis, MO, Jan. 3-4, 2002.
Lockwood, "Simulation of the Hello World Application for the Field-Programmable Port Extender (FPX)", Washington University, Applied Research Lab, Spring 2001 Gigabits Kits Workshop.
Madhusudan, "Design of a System for Real-Time Worm Detection", Hot Interconnects, pp. 77-83, Stanford, CA, Aug. 2004, found at http://www.hoti.org/hoti12/program/papers/2004/paper4.2.pdf.

(56) References Cited

OTHER PUBLICATIONS

Madhusudan, "Design of a System for Real-Time Worm Detection", Power Point Presentation in Support of Master's Thesis, Washington Univ., Dept. of Computer Science and Engineering, St. Louis, MO, Aug. 2004.

Mao et al., "Cluster-based Online Monitoring System of Web Traffic", Dept. of Computer Science and Technology, Tsinghua Univ., Bejing, 100084 P.R. China.

Mosanya et al., "A FPGA-Based Hardware Implementation of Generalized Profile Search Using Online Arithmetic", ACM/Sigda International Symposium on Field Programmable Gate Arrays (FPGA '99), Feb. 21-23, 1999, pp. 101-111, Monterey, CA, USA.

Moscola et al., "FPGrep and FPSed: Regular Expression Search and Substitution for Packet Streaming in Field Programmable Hardware", Dept. of Computer Science, Applied Research Lab, Washington University, Jan. 8, 2002, unpublished, pp. 1-19, St. Louis, MO.

Moscola et al., "FPSed: A Streaming Content Search-and-Replace Module for an Internet Firewall", Proc. of Hot Interconnects, 11th Symposium on High Performance Interconnects, pp. 122-129, Aug. 20, 2003.

Moscola, "FPGrep and FPSed: Packet Payload Processors for Managing the Flow of Digital Content on Local Area Networks and the Internet", Master's Thesis, Sever Institute of Technology, Washington University, St. Louis, MO, Aug. 2003.

Navarro, "A Guided Tour to Approximate String Matching", ACM Computing Surveys, vol. 33, No. 1, Mar. 2001, pp. 31-88.

Necker et al., "TCP-Stream Reassembly and State Tracking in Hardware", School of Electrical and Computer Engineering, Georgia Institute of Technology, Atlanta, GA.

Niewczas et al., "A Pattern Matching Algorithm for Verification and Analysis of Very Large IC Layouts", ACM, Apr. 1998, pp. 129-134.

Notice of Allowance for U.S. Appl. No. 11/938,709 dated Aug. 27, 2009.

Nunez et al., "The X-MatchLITE FPGA-Based Data Compressor", Euromicro Conference 1999, Proceedings, Italy, Sep. 8-10, 1999, pp. 126-132, Los Alamitos, CA.

Nwodoh et al., "A Processing System for Real-Time Holographic Video Computation", Reconfigurable Technology: FPGAs for Computing and Application, Proceedings for the SPIE, Sep. 1999, Boston, pp. 129-140, vol. 3844.

Office Action for GB Application 1019313.4 dated Jan. 3, 2012.
Office Action for GB Application 1019313.4 dated Oct. 2, 2012.
Office Action for U.S. Appl. No. 10/550,323 dated Jan. 3, 2011.
Office Action for U.S. Appl. No. 11/938,709 dated Jan. 13, 2009.
Office Action for U.S. Appl. No. 11/938,709 dated Jul. 14, 2008.
Office Action for U.S. Appl. No. 14/694,622 dated Jun. 24, 2016.
Partial International Search Report for PCT/US03/15638 dated Feb. 3, 2004.

Prakash et al., "OC-3072 Packet Classification Using BDDs and Pipelined SRAMs", Department of Electrical and computer Engineering, The University of Texas at Austin.

Pramanik et al., "A Hardware Pattern Matching Algorithm on a Dataflow"; Computer Journal; Jul. 1, 1985; pp. 264-269; vol. 28, No. 3; Oxford University Press, Surrey, Great Britain.

Prosecution History for U.S. Appl. No. 14/060,339, filed Oct. 22, 2013 (Henrichs et al.).

Prosecution History for U.S. Appl. No. 14/060,313, filed Oct. 22, 2013 (Henrichs et al.).

Ramakrishna et al., "A Performance Study of Hashing Functions for Hardware Applications", Int. Conf. on Computing and Information, May 1994, pp. 1621-1636, vol. 1, No. 1.

Ramakrishna et al., "Efficient Hardware Hashing Functions for High Performance Computers", IEEE Transactions on Computers, Dec. 1997, vol. 46, No. 12.

Ramesh et al., "Automatic Selection of Tuning Parameters for Feature Extraction Sequences", IEEE, Jun. 21-23, 1994, pp. 672-677.

Ratha et al., "Convolution on Splash 2", Proceedings of IEEE Symposium on FPGAS for Custom Computing Machines, Apr. 19, 1995, pp. 204-213, Los Alamitos, California.

Ratha et al., "FPGA-based coprocessor for text string extraction", IEEE, Sep. 11-13, 2000, pp. 217-221.

Roberts, "Internet Still Growing Dramatically Says Internet Founder", Press Release, Caspian Networks, Inc.—Virtual Pressroom.

Roesch, "Snort—Lightweight Intrusion Detection for Networks", Proceedings of LISA '99: 13th Systems Administration Conference; Nov. 7-12, 1999; pp. 229-238; USENIX Association, Seattle, WA USA.

Roy, "A bounded search algorithm for segmented channel routing for FPGA's and associated channel architecture Issues", IEEE, Nov. 11, 1993, pp. 1695-1705, vol. 12.

Sachin Tandon, "A Programmable Architecture for Real-Time Derivative Trading", Master's Thesis, University of Edinburgh, 2003.

Schmerken, "With Hyperfeed Litigation Pending, Exegy Launches Low-Latency Ticker Plant", in Wall Street & Technology Blog, Mar. 20, 2007, pp. 1-2.

Schmit, "Incremental Reconfiguration for Pipelined Applications", FPGAs for Custom Computing Machines, Proceedings, The 5th Annual IEEE Symposium, Dept. of ECE, Carnegie Mellon University, Apr. 16-18, 1997, pp. 47-55, Pittsburgh, PA.

Schuehler et al., "Architecture for a Hardware Based, TCP/IP Content Scanning System", IEEE Micro, 24(1):62-69, Jan.-Feb. 2004, USA.

Schuehler et al., "TCP-Splitter: A TCP/IP Flow Monitor in Reconfigurable Hardware", Hot Interconnects 10 (Hotl-10), Stanford, CA, Aug. 21-23, 2002, pp. 127-131.

Seki et al., "High Speed Computation of Shogi With FPGA", Proceedings of 58th Convention Architecture, Software Science, Engineering, Mar. 9, 1999, pp. 1-133-1-134.

Shah, "Understanding Network Processors", Version 1.0, University of California-Berkeley, Sep. 4, 2001.

Shalunov et al., "Bulk TCP Use and Performance on Internet 2", ACM SIGCOMM Internet Measurement Workshop, 2001.

Shirazi et al., "Quantitative Analysis of FPGA-based Database Searching", Journal of VLSI Signal Processing Systems for Signal, Image, and Video Technology, May 2001, pp. 85-96, vol. 28, No. 1/2, Kluwer Academic Publishers, Dordrecht, NL.

Sidhu et al., "Fast Regular Expression Matching Using FPGAs", IEEE Symposium on Field Programmable Custom computing Machines (FCCM 2001), Apr. 2001.

Sidhu et al., "String Matching on Multicontext FPGAs Using Self-Reconfiguration", FPGA '99: Proceedings of the 1999 ACM/SIGDA 7th International Symposium on Field Programmable Gate Arrays, Feb. 1999, pp. 217-226.

Singh et al., "The EarlyBird System for Real-Time Detection on Unknown Worms", Technical report CS2003-0761, Aug. 2003.

Sourdis and Pnevmatikatos, "Fast, Large-Scale String Match for a 10Gbps FPGA-based Network Intrusion Detection System", 13th International Conference on Field Programmable Logic and Applications, 2003.

Steinbach et al., "A Comparison of Document Clustering Techniques", KDD Workshop on Text Mining, 2000.

Tan et al., "A High Throughput String Matching Architecture for Intrusion Detection and Prevention", ISCA 2005: 32nd Annual International Symposium on Computer Architecture, pp. 112-122, 2005.

Tang et al., "A Novel Data Format Conversion Method Based on FPGA", Cross Strait Quad-Regional Radio Science and Wireless Technology Conference, Jul. 26, 2011, pp. 1204-1207.

Tau et al., "Transit Note #114: A First Generation DPGA Implementation", Jan. 1995, 9 pages.

Taylor et al., "Dynamic Hardware Plugins (DHP): Exploiting Reconfigurable Hardware for High-Performance Programmable Routers", Computer Networks, 38(3): 295-310 (16), Feb. 21, 2002, and online at http://www.cc.gatech.edu/classes/AY2007/cs8803hpc_fall/papers/phplugins.pdf.

Taylor et al., "Generalized RAD Module Interface Specification of the Field Programmable Port Extender (FPX) Version 2", Washington University, Department of Computer Science, Technical Report, Jul. 5, 2001, pp. 1-10.

(56) References Cited

OTHER PUBLICATIONS

Taylor et al., "Modular Design Techniques for the FPX", Field Programmable Port Extender: Jan. 2002 Gigabit Workshop Tutorial, Washington University, St. Louis, MO, Jan. 3-4, 2002.
Taylor et al., "Scalable Packet Classification using Distributed Crossproducting of Field Labels", Proceedings of IEEE Infocom, Mar. 2005, pp. 1-12, vol. 20, No. 1.
Taylor, "Models, Algorithms, and Architectures for Scalable Packet Classification", doctoral thesis, Department of Computer Science and Engineering, Washington University, St. Louis, MO, Aug. 2004, pp. 1-201.
Thomson Reuters, "Mellanox InfiniBand Accelerates the Exegy Ticker Plant at Major Exchanges", Jul. 22, 2008, URL: http://www.reuters.com/article/pressRelease/idUS125385+22-Jul-2008+BW20080722.
Uluski et al., "Characterizing Antivirus Workload Execution", SIGARCH Comput. Archit. News, vol. 33, No. 1, pp. 30-98, Mar. 2005.
Villasenor et al., "Configurable Computing Solutions for Automatic Target Recognition", FPGAS for Custom Computing Machines, 1996, Proceedings, IEEE Symposium on Napa Valley, CA, Apr. 17-19, 1996, pp. 70-79, 1996 IEEE, Napa Valley, CA, Los Alamitos, CA, USA.
Waldvogel et al., "Scalable High-Speed Prefix Matching", ACM Transactions on Computer Systems, Nov. 2001, pp. 440-482, vol. 19, No. 4.
Ward et al., "Dynamically Reconfigurable Computing: A Novel Computation Technology with Potential to Improve National Security Capabilities", May 15, 2003, A White Paper Prepared by Star Bridge Systems, Inc. [retrieved Dec. 12, 2006]. Retrieved from the Internet: <URL: http://www.starbridgesystems.com/resources/whitepapers/Dynamically%20Reconfigurable%20Computing.pdf.
Weaver et al., "Very Fast Containment of Scanning Worms", Proc. USENIX Security Symposium 2004, San Diego, CA, Aug. 2004, located at http://www.icsi.berkely.edu/~nweaver/containment/containment.pdf.
Web-Pop (Professional Options Package) (www.pmpublishing.com).
West et al., "An FPGA-Based Search Engine for Unstructured Database", Proc. of 2nd Workshop on Application Specific Processors, Dec. 2003, San Diego, CA.
Wooster et al., "HTTPDUMP Network HTTP Packet Snooper", Apr. 25, 1996.
Yamaguchi et al., "An Approach for Homology Search with Reconfigurable Hardware", Google, 2001, pp. 374-375.
Yamaguchi et al., "High Speed Homology Search with FPGAs", Proceedings Pacific Symposium on Biocomputing, Jan. 3-7, 2002, pp. 271-282, vol. 7, Online, Lihue, Hawaii, USA.
Yan et al., "Enhancing Collaborative Spam Detection with Bloom Filters", 2006, IEEE, pp. 414-425.
Yoshitani et al., "Performance Evaluation of Parallel Volume Rendering Machine Re Volver/C40", Study Report of Information Processing Society, Mar. 5, 1999, pp. 79-84, vol. 99, No. 21.
Dharmapurikar, "Fast and Scalable Pattern Matching for Content Filtering", ACM, ANCS 05, 2005, pp. 183-192.
Ebeling et al., "RaPiD—Reconfigurable Pipelined Datapath", University of Washington, Dept. of Computer Science and Engineering, Sep. 23, 1996, Seattle, WA.
Exegy Inc., "Exegy and HyperFeed to Unveil Exelerate TP at SIA Conference", Release Date: Jun. 20, 2006, downloaded from http://news.thomasnet.com/companystory/488004 on Jun. 19, 2007, 4 pages.
Exegy Inc., "First Exegy Ticker Plant Deployed", Release Date: Oct. 17, 2006, downloaded from http://news.thomasnet.com/companystory/496530 on Jun. 19, 2007, 5 pages.
Extended European Search Report for EP Application 13849798.7 dated Jul. 14, 2016.
Feldman, "High Frequency Traders Get Boost From FPGA Acceleration", Jun. 8, 2007, downloaded from http://www.hpcwire.com/hpc.1600113.html on Jun. 19, 2007, 4 pages.
Feldmann, "BLT: Bi-Layer Tracing of HTTP and TCP/IP", AT&T Labs-Research, Florham Park, NJ, USA.
Fernandez, "Template Matching of Binary Targets in Grey-Scale Images: A Nonparametric Approach", Pattern Recognition, 1997, pp. 1175-1182, vol. 30, No. 7.
Forgy, "RETE: A Fast Algorithm for the Many Pattern/Many Object Pattern Matching Problem", Artificial Intelligence, 1982, pp. 17-37, vol. 19.
Franklin et al., "An Architecture for Fast Processing of Large Unstructured Data Sets." Proc. of 22nd Int'l Conf. on Computer Design, Oct. 2004, pp. 280-287.
Franklin et al., "Assisting Network Intrusion Detection with Reconfigurable Hardware", Symposium on Field-Programmable Custom Computing Machines (FCCM 2002), Apr. 2002, Napa, California.
Fu et al., "The FPX KCPSM Module: An Embedded, Reconfigurable Active Processing Module for the Field Programmable Port Extender (FPX)", Washington University, Department of Computer Science, Technical Report WUCS-01-14, Jul. 2001.
Gavrila et al., "Multi-feature Hierarchical Template Matching Using Distance Transforms", IEEE, Aug. 16-20, 1998, vol. 1, pp. 439-444.
Google Search Results Page for "field programmable gate array financial calculation stock market" over dates of Jan. 1, 1990-May 21, 2002, 1 page.
Guerdoux-Jamet et al., "Systolic Filter for Fast DNA Similarity Search", IEEE, 1995, pp. 145-156.
Gunther et al., "Assessing Document Relevance with Run-Time Reconfigurable Machines", FPGAs for Custom Computing Machines, 1996, Proceedings, IEEE Symposium on, 10-17, Napa Valley, CA, Apr. 17, 1996.
Gupta et al., "High-Speed Implementations of Rule-Based Systems," ACM Transactions on Computer Systems, May 1989, pp. 119-146, vol. 7, Issue 2.
Gupta et al., "Packet Classification on Multiple Fields", Computer Systems Laboratory, Stanford University, Stanford, CA.
Gupta et al., "PMM: A Parallel Architecture for Production Systems," Proceedings of the IEEE, Apr. 1992, pp. 693-696, vol. 2.
Gurtov, "Effect of Delays on TCP Performance", Cellular Systems Development, Sonera Corporation, online at http://cs.helsinki.fi/u/gurtov/papers/pwc01.pdf.
Gyang, "NCBI BLASTN Stage 1 in Reconfigurable Hardware," Technical Report WUCSE-2005-30, Aug. 2004, Department of Computer Science and Engineering, Washington University, St. Louis, MO.
Halaas et al., "A Recursive MISD Architecture for Pattern Matching", IEEE Transactions on Very Large Scale Integration, vol. 12, No. 7, pp. 727-734, Jul. 2004.
Harris, "Pete's Blog: Can FPGAs Overcome the FUD?", Low-Latency.com, May 14, 2007, URL: http://www.a-teamgroup.com/article/pete-blog-can-fpgas-overcome-the-fud/.
Hauck et al., "Software Technologies for Reconfigurable Systems", Northwestern University, Dept. of ECE, Technical Report, 1996.
Hayes, "Computer Architecture and Organization", Second Edition, 1988, pp. 448-459, McGraw-Hill, Inc.
Herbordt et al., "Single Pass, BLAST-Like, Approximate String Matching on FPGAs", 14th Annual IEEE Symposium on Field-Programmable Custom Computing Machines (FCCM'06), Apr. 2006, pp. 1-10, IEEE.
Hezel et al., "FPGA-Based Template Matching Using Distance Transforms", Proceedings of the 10th Annual IEEE Symposium on Field-Programmable Custom Computing Machines, Apr. 22, 2002, pp. 89-97, IEEE Computer Society, USA.
Hirsch, "Tech Predictions for 2008", Reconfigurable Computing, Jan. 16, 2008, URL: http://fpgacomputing.blogspot.com/2008_01_01_archive.html.
Hollaar, "Hardware Systems for Text Information Retrieval", Proceedings of the Sixth Annual International ACM Sigir Conference on Research and Development in Information Retrieval, Jun. 6-8, 1983, pp. 3-9, Baltimore, Maryland, USA.
Hutchings et al., "Assisting Network Intrusion Detection with Reconfigurable Hardware", FCCM 2002: 10th Annual IEEE Symposium on Field-Programmable Custom Computing Machines, 2002.

(56) References Cited

OTHER PUBLICATIONS

International Preliminary Report on Patentability (Chapter I) for PCT/US2009/043759 dated Nov. 25, 2010.
International Search Report and Written Opinion for PCT/US2009/043759 dated Jul. 1, 2009.
International Search Report for PCT/US2001/011255 dated Jul. 10, 2003.
International Search Report for PCT/US2002/033286 dated Jan. 22, 2003.
International Search Report for PCT/US2003/015638 dated May 6, 2004.
International Search Report for PCT/US2004/016021 dated Aug. 18, 2005.
International Search Report for PCT/US2004/016398 dated Apr. 12, 2005.
International Search Report for PCT/US2005/030046; dated Sep. 25, 2006.
International Search Report for PCT/US2006/006105 dated Oct. 31, 2006.
International Search Report for PCT/US2006/045653 dated Jul. 8, 2008.
International Search Report for PCT/US2007/060835 dated Jul. 9, 2007.
International Search Report for PCT/US2007/084464 dated Oct. 2, 2008.
International Search Report for PCT/US2007/084466 dated Jul. 23, 2008.
Jacobson et al., "RFC 1072: TCP Extensions for Long-Delay Paths", Oct. 1988.
Jacobson et al., "tcpdump-dump traffic on a network", Jun. 30, 1997, online at www.cse.cuhk.edu.hk/~cslui/CEG4430/tcpdump.ps.gz.
Johnson et al., "Pattern Matching in Reconfigurable Logic for Packet Classification", College of Computing, Georgia Institute of Technology, Atlanta, GA.
Jones et al., "A Probabilistic Model of Information Retrieval: Development and Status", Information Processing and Management, Aug. 1998, 76 pages.
Kutzer et al., "A Survey of Programmable Platforms—Network Proc", University of California-Berkeley, pp. 1-29.
Koloniari et al., "Content-Based Routing of Path Queries in Peer-to-Peer Systems", pp. 1-19, E. Bertino et al. (Eds.): EDBT 2004, LNCS 2992, pp. 29-47, 2004, copyright by Springer-Verlag, Germany.
Krishnamurthy et al., "Biosequence Similarity Search on the Mercury System", Proceedings of the 15th IEEE International Conference on Application-Specific Systems, Architectures, and Processors (ASAP04), Sep. 2004, pp. 365-375.

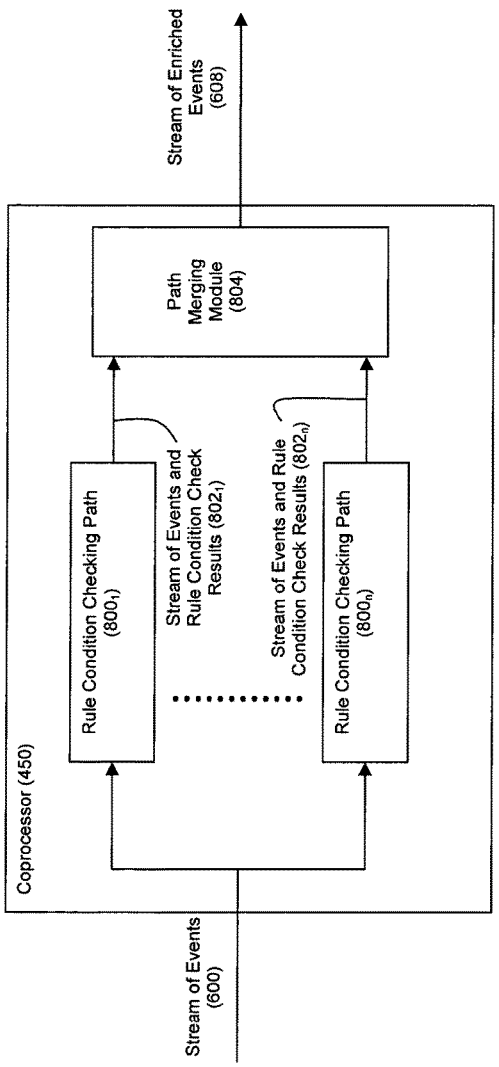
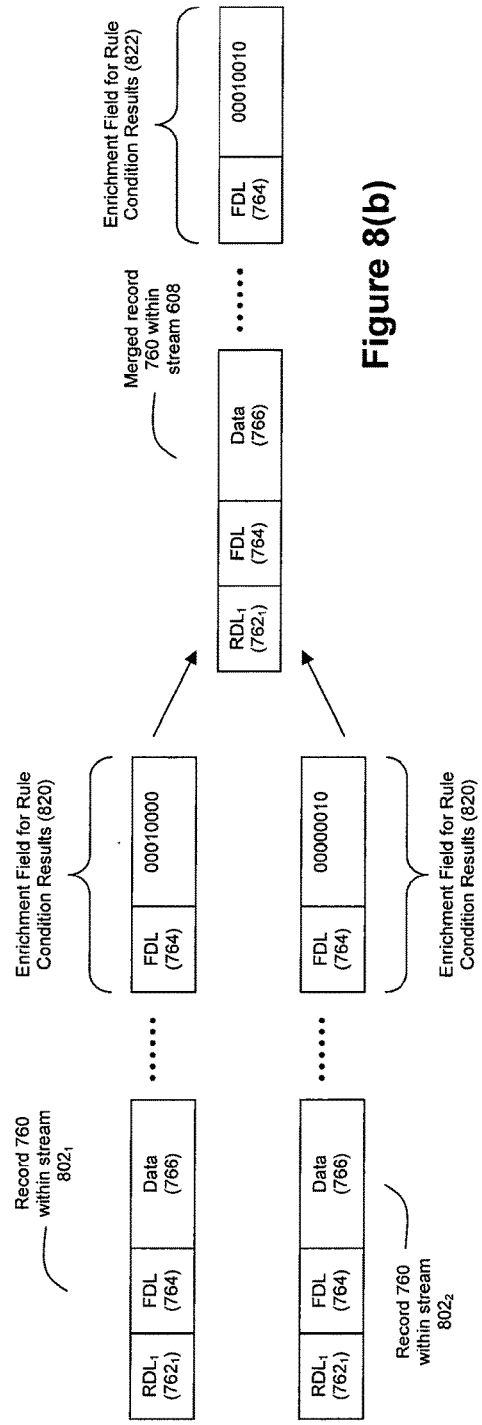
Figure 8(a)
Figure 8(b)

METHOD AND SYSTEM FOR ACCELERATED STREAM PROCESSING

CROSS-REFERENCE AND PRIORITY CLAIM TO RELATED APPLICATION

This patent application is a divisional of pending U.S. patent application Ser. No 13/759,430, filed Feb. 5, 2013, now U.S. Pat. No. 9,547,824, which is a divisional of U.S. patent application Ser. No. 12/121,473, filed May 15, 2008, now U.S. Pat. No. 8,374,986, the entire disclosures of each of which are incorporated by reference herein.

FIELD OF THE INVENTION

The present invention is generally directed toward the field of stream processing, particularly the use of stream processing in a system such as a business rules engine, an event stream processor, and a complex event stream processor.

TERMINOLOGY

The following paragraphs provide several definitions for various terms used herein. These paragraphs also provide background information relating to these terms.

GPP: As used herein, the term "general-purpose processor" (or GPP) refers to a hardware device having a fixed form and whose functionality is variable, wherein this variable functionality is defined by fetching instructions and executing those instructions (for example, an Intel Xeon processor or an AMD Opteron processor), of which a conventional central processing unit (CPU) is a common example.

Reconfigurable Logic: As used herein, the term "reconfigurable logic" refers to any logic technology whose form and function can be significantly altered (i.e., reconfigured) in the field post-manufacture. This is to be contrasted with a GPP, whose function can change post-manufacture, but whose form is fixed at manufacture.

Software: As used herein, the term "software" refers to data processing functionality that is deployed on a GPP or other processing devices, wherein software cannot be used to change or define the form of the device on which it is loaded.

Firmware: As used herein, the term "firmware" refers to data processing functionality that is deployed on reconfigurable logic or other processing devices, wherein firmware may be used to change or define the form of the device on which it is loaded.

Coprocessor: As used herein, the term "coprocessor" refers to a computational engine designed to operate in conjunction with other components in a computational system having a main processor (wherein the main processor itself may comprise multiple processors such as in a multi-core processor architecture). Typically, a coprocessor is optimized to perform a specific set of tasks and is used to offload tasks from a main processor (which is typically a GPP) in order to optimize system performance. The scope of tasks performed by a coprocessor may be fixed or variable, depending on the architecture of the coprocessor. Examples of fixed coprocessor architectures include Graphics Processor Units which perform a broad spectrum of tasks and floating point numeric coprocessors which perform a relatively narrow set of tasks. Examples of reconfigurable coprocessor architectures include reconfigurable logic devices such as Field Programmable Gate Arrays (FPGAs) which may be reconfigured to implement a wide variety of fixed or programmable computational engines. The functionality of a coprocessor may be defined via software and/or firmware.

Hardware Acceleration: As used herein, the term "hardware acceleration" refers to the use of software and/or firmware implemented on a coprocessor for offloading one or more processing tasks from a main processor to decrease processing latency for those tasks relative to the main processor.

Enterprise: As used herein, the term "enterprise" refers to any business organization or governmental entity that stores and/or processes data (referred to as "enterprise data") as part of its ongoing operations.

Database: As used herein, the term "database" refers to a persistent data store with indexing capabilities to expedite query processing. Various database management system (DBMS) implementations might be categorized as relational (RDBMS), object-oriented (OODBMS), hierarchical, etc.; however, the dominant architecture in today's industry is a relational, row-column, structured query language (SQL)-capable database. An ANSI-standard SQL database engine is a mature software architecture that can retrieve structured data in response to a query, usually in an efficient manner.

Structured Data: As used herein, the term "structured data" refers to data that has been normalized and persisted to a relational database. Normalization is the data design process of putting data into a tabular, row-column format and abstracting duplicate data into separate tables. Structured data in relational columns is capable of being indexed with B-tree indexes, significantly speeding access to the data in these columns. In SQL terms, structured columns have size limits. These columns may have constraints and referential integrity applied to them in order to ensure consistent data quality. Examples of common structured SQL datatypes are: INT(eger), NUMBER, CHAR(acter), VARCHAR, DATE, TIMESTAMP.

Unstructured Data: As used herein, the term "unstructured data" refers to data that falls outside the scope of the definition above for structured data. Thus, the term unstructured data encompasses files, documents or objects with free form text or embedded values included therein. This data includes the complete set of bytes, often including binary-format data, that was used by the application that generated it. Examples of unstructured data include word processing documents (e.g., Microsoft Word documents in their native format), Adobe Acrobat documents, emails, image files, video files, audio files, and other files in their native formats relative to the software application that created them. In SQL terms, unstructured columns have very large, if not unlimited size. Common examples of unstructured SQL datatypes are: BLOB, TEXT, XML, RAW, and IMAGE. Unstructured objects may also be stored outside the database, for example in operating system files. Access to these external objects from within the database engine uses links in the metadata in the database table to the storage location.

There are a number of reasons why XML will not normally be categorized as "structured" as that term is used herein:
XML may have large or unlimited sized values
XML often does not have strongly enforced datatyping
XML has a flexible schema
XML values in elements and attributes is often not as rigidly conformed and carefully cleansed as traditional "structured" database columns Although the concept of "semi-structured" data with flexible schemas is emerging, particularly for XML, for present purposes everything that has not been normalized and persisted to a relational database will be considered unstructured data. As such, a column that is of the XML datatype would thus fall under this present definition of "unstructured data".

Bus: As used herein, the term "bus" refers to a logical bus which encompasses any physical interconnect for which devices and locations are accessed by an address. Examples of buses that could be used in the practice of the present invention include, but are not limited to the PCI family of buses (e.g., PCI-X and PCI-Express) and Hyper-Transport buses.

Pipelining: As used herein, the terms "pipeline", "pipelined sequence", or "chain" refer to an arrangement of application modules wherein the output of one application module is connected to the input of the next application module in the sequence. This pipelining arrangement allows each application module to independently operate on any data it receives during a given clock cycle and then pass its output to the next downstream application module in the sequence during another clock cycle.

BACKGROUND OF THE INVENTION

Enterprises such as corporations, institutions, agencies, and other entities have massive amounts of data for which analysis is needed to enable decision making processes, and computerized systems based on business rules have arisen to aid enterprises' decision-making capabilities in this regard. FIG. 1 illustrates a basic exemplary process flow for such a rule-based system. The flow of FIG. 1 relies on two elements—a fact 100 and a rule 112. Facts 100 are typically characterized as tuples, with each tuple comprising an identifier 106, at least one attribute 108 and at least one value 110 corresponding to the attribute. The identifier 106 is a unique string that identifies the fact 100. An attribute 108 is a string that identifies a particular feature of the fact 100, and the value 108 is a value for that particular feature. It should be understood that a fact 100 can have multiple attributes 108 and corresponding values 110. A rule 112 generally comprises one or more conditions 114 and one or more actions 116 to be taken if the conditions are satisfied. As such, rules 112 can be characterized with the form: if CONDITION(s) then ACTION(s). It should be understood that rules 112 may include multiple conditions 114 with potentially complicated inter-relationships among the conditions. At step 102, a check is performed to see if fact 100 satisfies a rule 112. In the event the fact satisfies the rule, one or more action(s) 116 are triggered. To perform such a check, step 102 tests for valid (identifier, attribute, value) tuples that satisfy a condition 114. It should be noted that for facts the three fields can only take on specific values (based on the values of the bit string which represents the fact), whereas for rules, the constituent fields can be represented by a variable.

A variety of systems have been developed to provide rule-based decision-making capabilities to enterprises. Examples of these systems include event processors, complex event processors (CEPs), and business rules engines. An event processor and a complex event processor can be distinguished from a business rules engine in that an event processor and a complex event processor are "feed forward" systems in that they do not feed result information from the business rule condition checking process back into the event processor or complex event processor to determine further actions that need to be taken. In contrast, a business rules engine employs some form of inferencing intelligence at the output of the business rule condition checking process to feed all or a select subset of the results back into the business rules engine to determine further actions that need to be taken. A complex event processor can be distinguished from an event processor in that a complex event processor can take into consideration multiple events when deciding whether a particular business rule condition has been satisfied.

An algorithm that has arisen to implement a rule-based system exemplified by FIG. 1 (typically for business rules engines) is known as the Rete algorithm. See Forgy, Charles, "RETE: A fast algorithm for the many pattern/many object pattern matching problem", Artificial Intelligence, Vol. 19, p. 17-37, 1982, the entire disclosure of which is incorporated herein by reference. The Rete algorithm derives its efficiency by exploiting the modular nature of rules; rule-checking is performed as a series of steps which represent the rules to determine if one or more corresponding actions are to be initiated.

The inventors believe that conventional implementations of computerized rule-based systems do not perform exceptionally well, particularly in instances where the size of the rule set is large and growing, where the size of the data volume is large and growing, and/or where there is a need for low latency with respect to making a business rule-based decision after first receiving the pertinent data. For example, the inventors believe that conventional business rule processing systems which rely on analyzing data stored using database technology such as a conventional RDBMS (which are optimized for large-scale permanent storage and carefully-tuned query performance) have difficulty keeping up with the demands of very high speed data streams and thus serve as a potential bottleneck in a rule-based decision-making system. Thus, as enterprises' rule sets and data volumes continue to grow in size and complexity and as data transfer speeds continue to increase, the inventors further believe that time will exacerbate this problem unless a better solution for business rule processing is devised.

SUMMARY OF THE INVENTION

In an effort to address this need in the art, the inventors herein disclose a technique for hardware-accelerating the process of determining whether data within a data stream satisfies at least one rule condition of a rule. The data streams, as represented by a stream of bits, may include structured and/or unstructured data. Based on such a hardware-acceleration rule condition check operation, a rule condition check result is generated to indicate whether a data stream portion (such as a record or field) satisfies any rule conditions. Preferably, the rule condition check result is generated only when a data stream portion satisfies a rule condition. However, this need not be the case. It should also be understood that the rule condition check result can be expressed in any of a number of ways. For example, a rule condition check result can be expressed as a bit value (or bit values) in a register within a system. A rule condition check result can also be expressed as one or more bits that are added to an existing record (such as by adding a field to a record to express the rule condition check result or by adding a bit to an existing field of a record to express the rule condition check result). As yet another example, a rule condition check result can be expressed as a new record that is inserted into the data stream.

Based on the rule condition check results, enterprises can take desired actions with an extremely low degree of latency, particularly relative to a conventional rule-based decision-making system which relies on software executed by a main GPP for the system to determine whether various data records satisfy pre-defined rule conditions. With embodiments described herein, data is streamed into a coprocessor, and rule condition check results based on a plurality of different rule conditions can be generated at bus bandwidth rates, thereby leading to dramatic improvements in rule-based decision-making latency.

In doing so, the present invention preferably harnesses the underlying hardware-accelerated technology disclosed in the following patents and patent applications: U.S. Pat. No. 6,711,558 entitled "Associated Database Scanning and Information Retrieval", U.S. Pat. No. 7,139,743 entitled "Associative Database Scanning and Information Retrieval using FPGA Devices", U.S. Patent Application Publication 2006/0294059 entitled "Intelligent Data Storage and Processing Using FPGA Devices", U.S. Patent Application Publication 2007/0067108 entitled "Method and Apparatus for Performing Biosequence Similarity Searching", U.S. Patent Application Publication 2008/0086274 entitled "Method and Apparatus for Protein Sequence Alignment Using FPGA Devices", U.S. Patent Application Publication 2007/0130140 entitled "Method and Device for High Performance Regular Expression Pattern Matching", U.S. Patent Application Publication 2007/0260602 entitled "Method and Apparatus for Approximate Pattern Matching", U.S. Patent Application Publication 2007/0174841 entitled "Firmware Socket Module for FPGA-Based Pipeline Processing", U.S. Patent Application Publication 2007/0237327 entitled "Method and System for High Throughput Blockwise Independent Encryption/Decryption"), U.S. Patent Application Publication 2007/0294157 entitled "Method and System for High Speed Options Pricing", U.S. patent application Ser. No. 11/765,306, filed Jun. 19, 2007, entitled "High Speed Processing of Financial Information Using FPGA Devices" (and published as U.S. Patent Application Publication 2008/0243675), U.S. patent application Ser. No. 11/938,732, filed Nov. 12, 2007, entitled "Method and System for High Performance Data Metatagging and Data Indexing Using Coprocessors" (published as U.S. Patent Application Publication 2008/0114725), U.S. patent application Ser. No. 11/938,709, filed Nov. 12, 2007, entitled "Method and System for High Performance Integration, Processing and Searching of Structured and Unstructured Data Using Coprocessors" (published as U.S. Patent Application Publication 2008/0114724), and U.S. patent application Ser. No. 12/013,302, filed Jan. 11, 2008, entitled "Method and System for Low Latency Basket Calculation" (published as U.S. Patent Application Publication 2009/0182683), the entire disclosures of each of which are incorporated herein by reference.

It should be understood that the range of actions which can triggered by the accelerated rule condition check operations described herein are virtually limitless and can be tailored to meet the particular needs of a practitioner of embodiments for the invention. Exemplary actions may include sending an alert to a designated person or group of persons, invoking a particular process within an enterprise computing system, deleting a record, placing a record into a holding queue, routing a record to a particular destination, etc. Furthermore, with respect to the conceptual "event/condition/action" (ECA) framework discussed in connection with FIG. 1, it should also be understood that an action corresponding to a rule can also include the act of generating the rule condition check result. The presence of the rule condition check result could then trigger additional secondary actions (such as an application which monitors the value of a particular register that stores rule condition check results to decided whether a certain functional action should be triggered). It should also be understood that the action that is triggered by satisfaction of a rule can be performed using a coprocessor or other processing device within an enterprise computing system.

The data streams being operated upon by the embodiments of the present invention preferably comprise a plurality of records or events as represented by bit strings. It should be noted that the terms records and events are used interchangeably herein. A data record or event signifies a fact 100 such as that described in connection with FIG. 1.

Many enterprises have one or more data feeds where extremely high volumes of data events are constantly streaming into the enterprise's computing system. To provide an enterprise with actionable intelligence capabilities with respect to such data streams, the inventors disclose various embodiments which accelerate the operations needed to determine which incoming events satisfy which pre-defined rules. Examples of operations which can be hardware-accelerated in accordance with various embodiments of the present invention include rule condition check operations (such as matching operations, range check operations, and threshold check operations), aggregate value computation operations, derived value computation operations, filtering operations, path merging operations, and formatting operations. It should be noted that the rule condition check operations can be performed directly on data values within the events themselves or on data values derived and/or aggregated from data values within the events themselves.

Preferably a pipeline is arranged in a coprocessor to check the incoming data streams against the rule conditions of the enterprise's business rules. Even more preferably, such a pipeline includes a plurality of different parallel paths for performing different ones of these checks simultaneously with one another.

Further still, the accelerated operations described herein are preferably deployed by an enterprise in systems such as event stream processors, complex event stream processors, and business rules engines.

Examples of the myriad of beneficial business rule-based applications for embodiments of the invention include data quality checking (particularly in data integration systems such as Extract, Transfer, Load (ETL) systems), security monitoring for transactions such as credit card transactions, financial market monitoring, data routing within an enterprise based on data content, Rete network acceleration, and others, as explained in greater detail below.

These and other features and advantages of the present invention will be apparent to those having ordinary skill in the art upon review of the following description and drawings.

BRIEF DESCRIPTION OF THE DRAWINGS

FIG. 8(a) depicts an exemplary rule condition checking pipeline with multiple rule condition checking paths;

FIG. 8(b) depicts an example of how streams within the multiple paths of FIG. 8(a) can be merged together;

DETAILED DESCRIPTION OF THE PREFERRED EMBODIMENTS

Figure 2A:
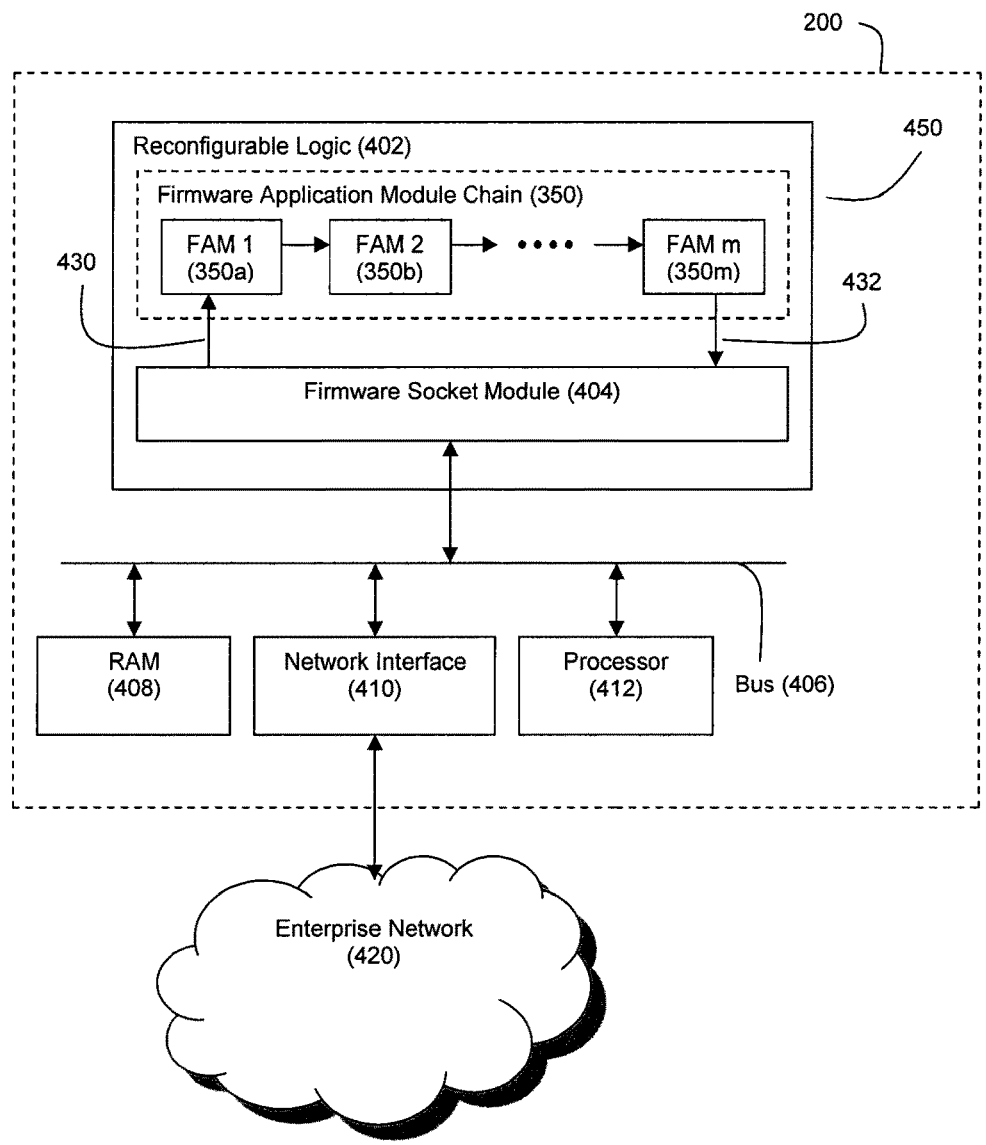
FIG. 2(a) illustrates an exemplary event stream processing appliance in accordance with an embodiment of the present invention.

FIG. 2(a) depicts an exemplary embodiment for an event stream processing appliance 200 which can be used to accelerate business rules processing. While an embodiment of appliance 200 can be referred to as a business rules engine, it should be noted that functionalities in addition to business rules processing can be supported by appliance 200; for example, appliance 200 could also be used to generate metadata (including indexes) for streaming data as explained in the above-referenced and incorporated U.S. patent application Ser. No. 11/938,732, and appliance 200 could also be used to integrate, process, and search both structured and unstructured data as explained in the above-referenced and incorporated U.S. patent application Ser. No. 11/938,709.

Preferably, appliance 200 employs a hardware-accelerated data processing capability through coprocessor 450 to analyze an incoming data stream against a set of business rules. Within appliance 200, a coprocessor 450 is positioned to receive data that streams into the appliance 200 from a network 420 (via network interface 410). Network 420 preferably comprises an enterprise network (whether LAN or WAN), in which various disparate data sources are located. It should be understood that the data streaming into the appliance 200 through enterprise network 420 can be data that is received by network 420 from external sources such as the Internet or other communication networks. Such incoming data may comprise both structured and unstructured data as appliance 200 can provide beneficial business rules analysis for both.

The computer system defined by processor 412 and RAM 408 can be any commodity computer system as would be understood by those having ordinary skill in the art. For example, the computer system may be an Intel Xeon system or an AMD Opteron system. Thus, processor 412, which serves as the central or main processor for appliance 200, preferably comprises a GPP.

In a preferred embodiment, the coprocessor 450 comprises a reconfigurable logic device 402. Preferably, data streams into the reconfigurable logic device 402 by way of system bus 406, although other design architectures are possible (see FIG. 3(b)). Preferably, the reconfigurable logic device 402 is a field programmable gate array (FPGA), although this need not be the case. System bus 406 can also interconnect the reconfigurable logic device 402 with the appliance's processor 412 as well as the appliance's RAM 408. In a preferred embodiment, system bus 406 may be a PCI-X bus or a PCI-Express bus, although this need not be the case.

The reconfigurable logic device 402 has firmware modules deployed thereon that define its functionality. The firmware socket module 404 handles the data movement requirements (both command data and target data) into and out of the reconfigurable logic device, thereby providing a consistent application interface to the firmware application module (FAM) chain 350 that is also deployed on the reconfigurable logic device. The FAMs 350i of the FAM chain 350 are configured to perform specified data processing operations on any data that streams through the chain 350 from the firmware socket module 404. Preferred examples of FAMs that can be deployed on reconfigurable logic in accordance with a preferred embodiment of the present invention are described below.

The specific data processing operation that is performed by a FAM is controlled/parameterized by the command data that FAM receives from the firmware socket module 404. This command data can be FAM-specific, and upon receipt of the command, the FAM will arrange itself to carry out the data processing operation controlled by the received command. For example, within a FAM that is configured to perform an exact match operation, the FAM's exact match operation can be parameterized to define the key(s) that the exact match operation will be run against. In this way, a FAM that is configured to perform an exact match operation can be readily re-arranged to perform a different exact match operation by simply loading new parameters for one or more different keys in that FAM.

Once a FAM has been arranged to perform the data processing operation specified by a received command, that FAM is ready to carry out its specified data processing operation on the data stream that it receives from the firmware socket module. Thus, a FAM can be arranged through an appropriate command to process a specified stream of data in a specified manner. Once the FAM has completed its data processing operation, another command can be sent to that FAM that will cause the FAM to re-arrange itself to alter the nature of the data processing operation performed thereby. Not only will the FAM operate at hardware speeds (thereby providing a high throughput of data through the FAM), but the FAMs can also be flexibly reprogrammed to change the parameters of their data processing operations.

The FAM chain 350 preferably comprises a plurality of firmware application modules (FAMs) 350a, 350b, ... that are arranged in a pipelined sequence. However, it should be noted that within the firmware pipeline, one or more parallel paths of FAMs 350i can be employed. For example, the firmware chain may comprise three FAMs arranged in a first pipelined path (e.g., FAMs 350a, 350b, 350c) and four FAMs arranged in a second pipelined path (e.g., FAMs 350d, 350e, 350f, and 350g), wherein the first and second pipelined paths are parallel with each other. Furthermore, the firmware pipeline can have one or more paths branch off from an existing pipeline path. A practitioner of the present invention can design an appropriate arrangement of FAMs for FAM chain 350 based on the processing needs of a given application.

A communication path 430 connects the firmware socket module 404 with the input of the first one of the pipelined FAMs 350a. The input of the first FAM 350a serves as the entry point into the FAM chain 350. A communication path 432 connects the output of the final one of the pipelined FAMs 350m with the firmware socket module 404. The output of the final FAM 350m serves as the exit point from the FAM chain 350. Both communication path 430 and communication path 432 are preferably multi-bit paths.

The nature of the software and hardware/software interfaces used by appliance 200, particularly in connection with data flow into and out of the firmware socket module are described in greater detail in the above-referenced and incorporated U.S. Patent Application Publication 2007/0174841.

Figure 2B:
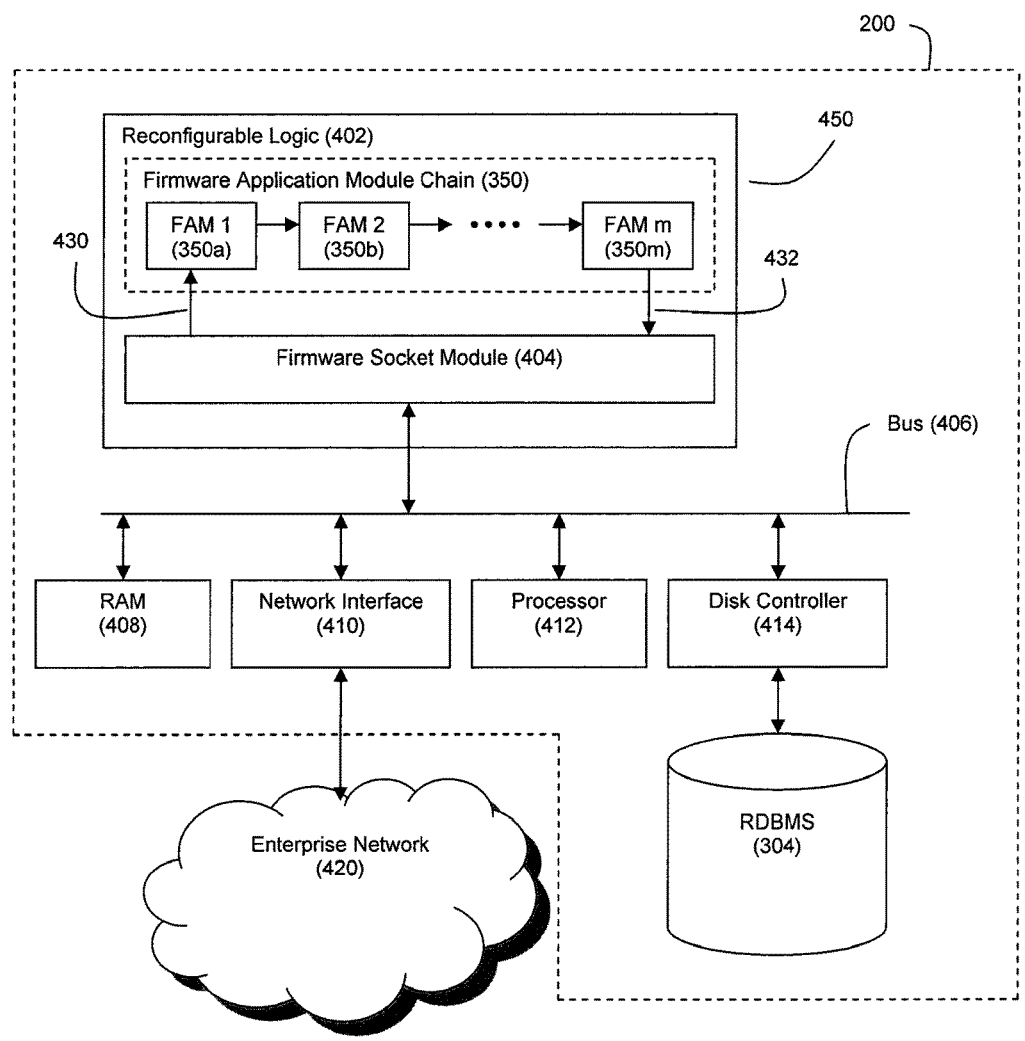
FIG. 2(b) illustrates an exemplary event stream processing appliance in accordance with another embodiment of the present invention.

FIG. 2(b) depicts another exemplary embodiment for appliance 200. In the example of FIG. 2(b), appliance 200 includes a relational database management system 304 that is in communication with bus 406 via disk controller 414. Thus, the data that is streamed through the coprocessor 450 may also emanate from RDBMS 304.

Figure 2C:
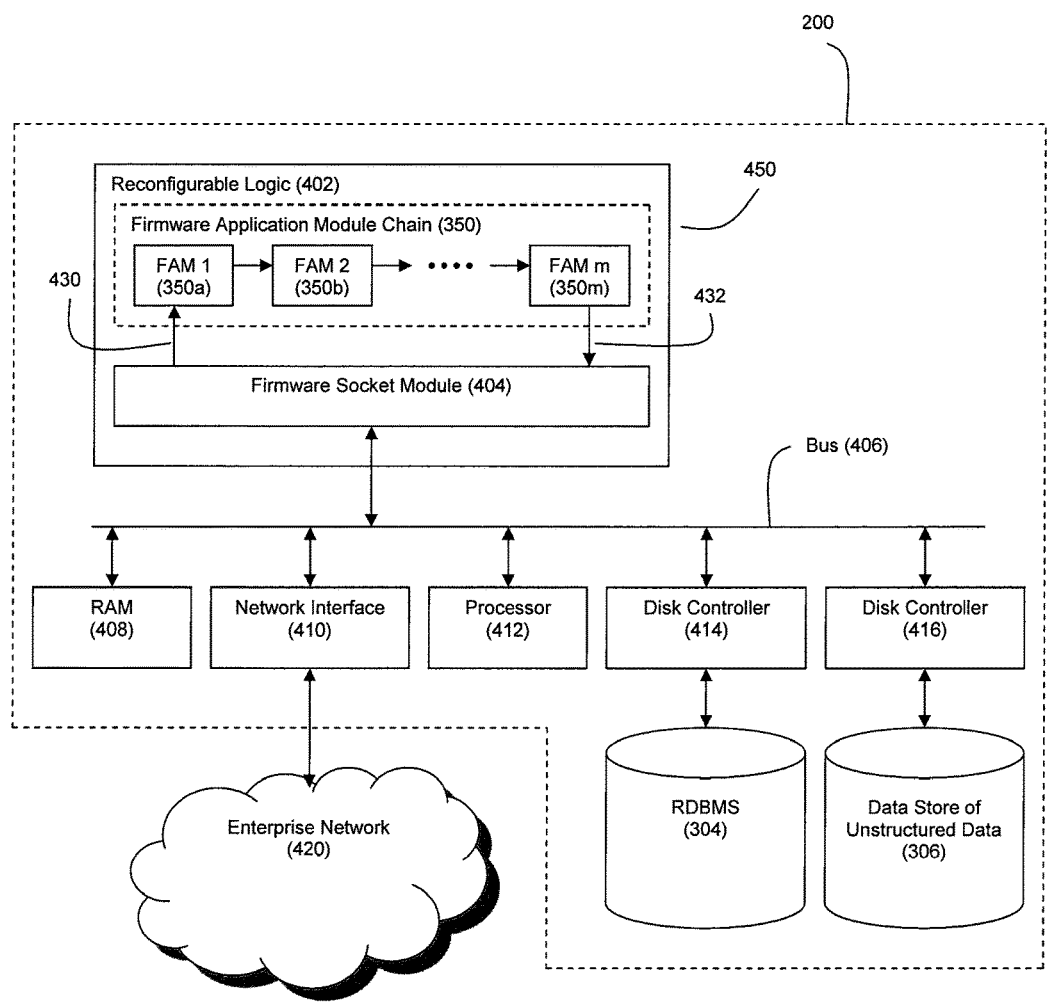
FIG. 2(c) illustrates an exemplary event stream processing appliance in accordance with yet another embodiment of the present invention.

FIG. 2(c) depicts another exemplary embodiment for appliance 200. In the example of FIG. 2(c), appliance 200 also includes a data store 306 of unstructured data that is in communication with bus 406 via disk controller 416. Thus, the data that is streamed through the coprocessor 450 may also emanate from data store 306. Furthermore, any unstructured data that is streamed through coprocessor 450 for business rules processing can optionally be stored within data store 306.

Figure 3A:
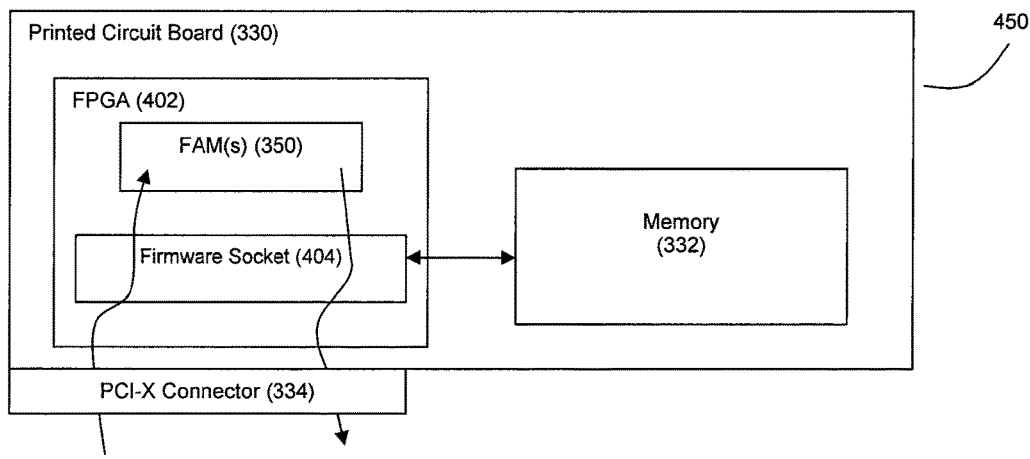
FIGS. 3(a) and (b) illustrate exemplary printed circuit boards for use in the appliances of FIGS. 2(a)-(c)

FIG. 3(a) depicts a printed circuit board or card 330 that can be connected to the PCI-X or PCI-e bus 406 of a commodity computer system for use as a coprocessor 450 in appliance 200 for any of the embodiments of FIGS. 2(a)-(c). In the example of FIG. 3(a), the printed circuit board includes an FPGA 402 (such as a Xilinx Virtex II FPGA) that is in communication with a memory device 332 and a PCI-X bus connector 334. A preferred memory device 332 comprises SRAM and DRAM memory. A preferred PCI-X or PCI-e bus connector 334 is a standard card edge connector.

Figure 3B:
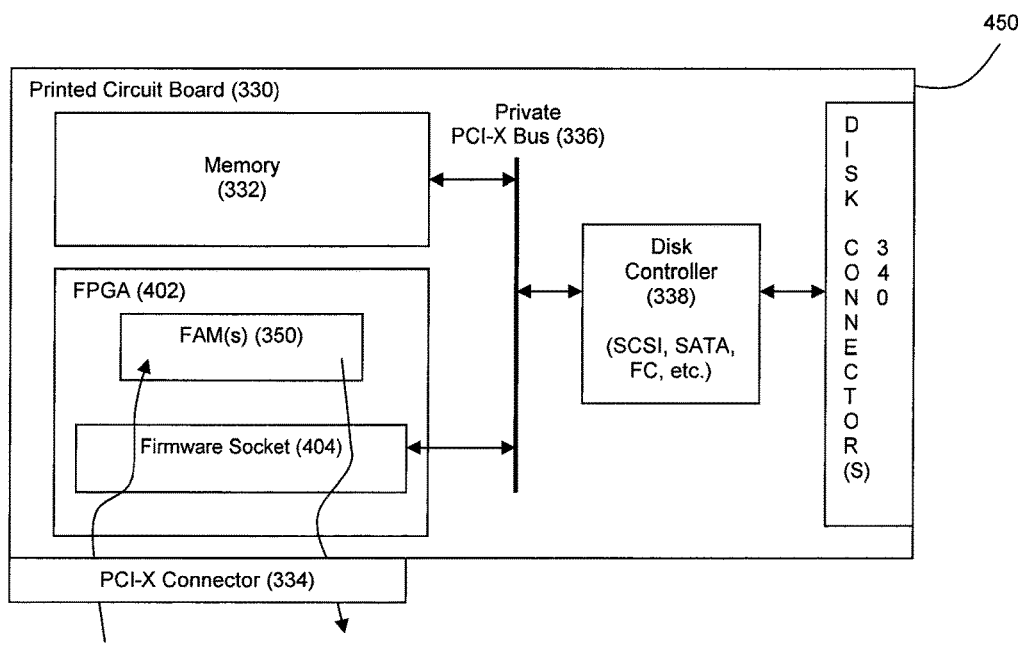

FIG. 3(b) depicts an alternate configuration for a printed circuit board/card 330. In the example of FIG. 3(b), a bus 336 (such as a PCI-X or PCI-e bus), one or more disk controllers 338, and a disk connector 340 are also installed on the printed circuit board 330. Any commodity disk interface technology can be supported, as is understood in the art. In this configuration, the firmware socket 404 also serves as a PCI-X to PCI-X bridge to provide the processor 412 with normal access to any disk(s) connected via the private PCI-X bus 336. It should be noted that a network interface can be used in addition to or in place of the disk controller and disk connector shown in FIG. 3(b).

Figure 4:
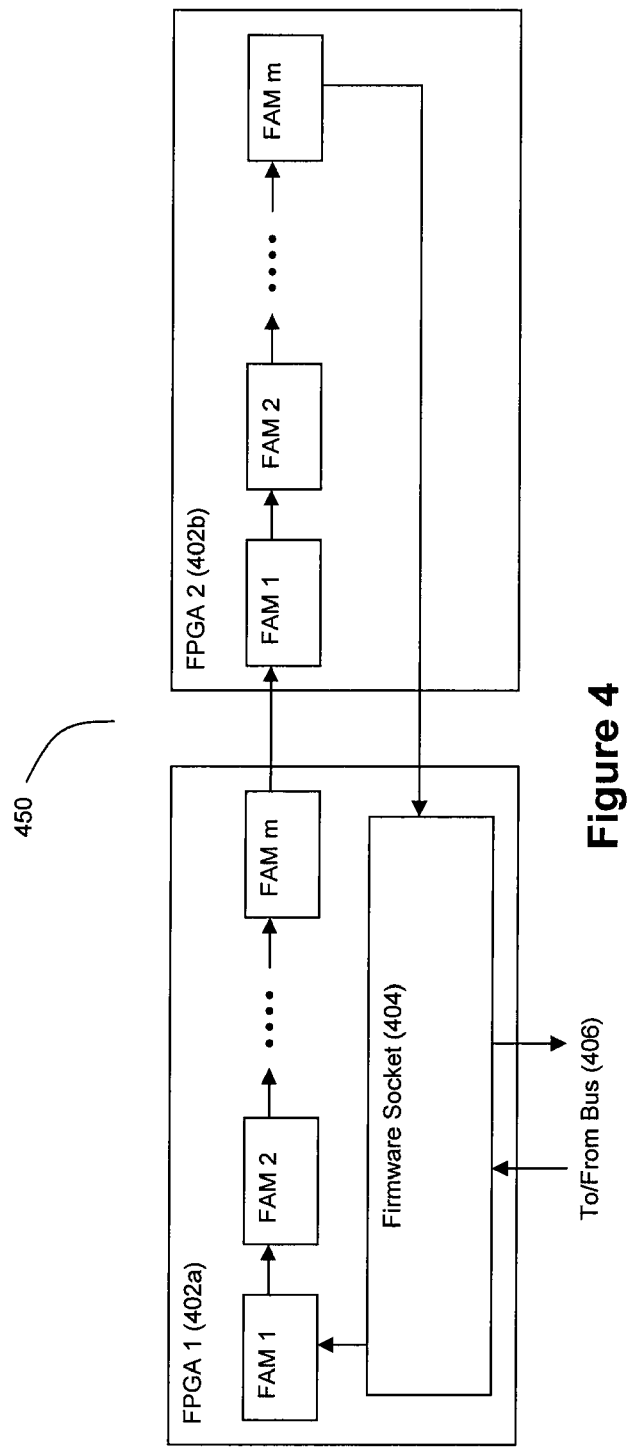
FIG. 4 illustrates an example of how a firmware pipeline can be deployed across multiple reconfigurable logic devices.

It is worth noting that in either the configuration of FIG. 3(a) or 3(b), the firmware socket 404 can make memory 332 accessible to the bus 406, which thereby makes memory 332 available for use by an OS kernel as the buffers for transfers to the FAMs from a data source with access to bus. It is also worth noting that while a single FPGA 402 is shown on the printed circuit boards of FIGS. 3(a) and (b), it should be understood that multiple FPGAs can be supported by either including more than one FPGA on the printed circuit board 330 or by installing more than one printed circuit board 330 in the appliance 200. FIG. 4 depicts an example where numerous FAMs in a single pipeline are deployed across multiple FPGAs.

Figure 5:
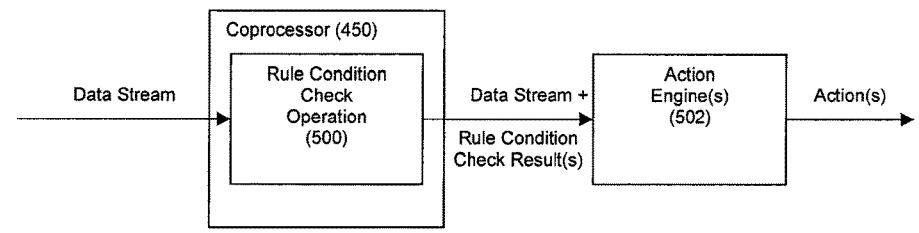
FIG. 5 is a high level block diagram view of how a coprocessor can be used perform a rule condition check operation on data that streams therethrough.

FIG. 5 depicts at a high level a coprocessor 450 that receives an incoming data stream and performs a rule condition check operation 500 on data within the received data stream against at least one rule condition (and preferably plurality of rule conditions) to generate rule condition check results for the data stream. An action engine 502 then takes one or more actions based on rule condition results produced as a result of the rule condition check operation 500. Examples of different hardware-accelerated rule condition check operations 500 will be described in greater detail hereinafter. In an exemplary embodiment, these operations are carried out in firmware deployed on reconfigurable logic. It should also be understood that the action engine 502, need not, but may also be implemented on coprocessor 450. For example, coprocessor 450 can be configured to communicate with an action engine that is implemented as software executing on a processor within an enterprise's computing system other than a coprocessor 450. Any of a number of components within an enterprise computing system may serve as an action engine. For example, a database system can be configured to serve as an action engine (e.g., by handling and storing data within a record in a particular manner based on a rule condition result associated with that data).

Figure 1:
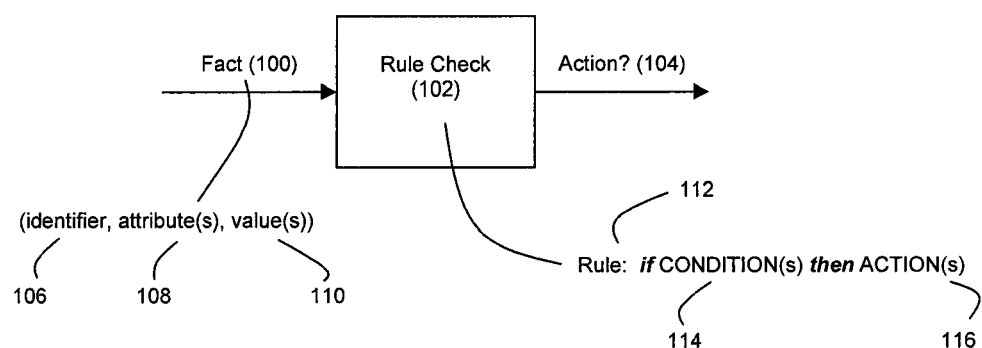
FIG. 1 depicts an exemplary process flow for a rule-based system.
Figure 6:
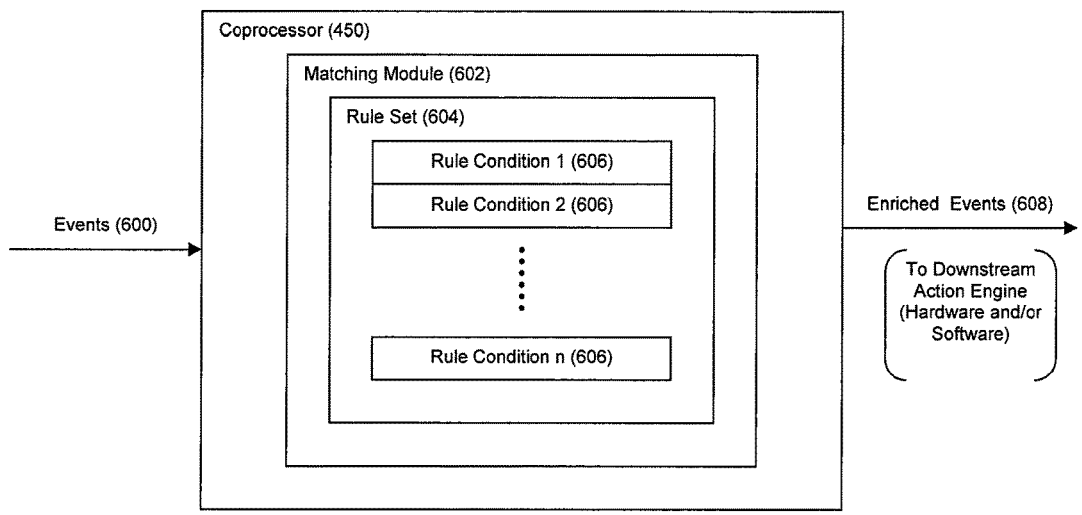
FIG. 6 depicts an exemplary matching module that can be deployed on a coprocessor to check incoming events against a plurality of standing rule conditions.
Figure 7A:
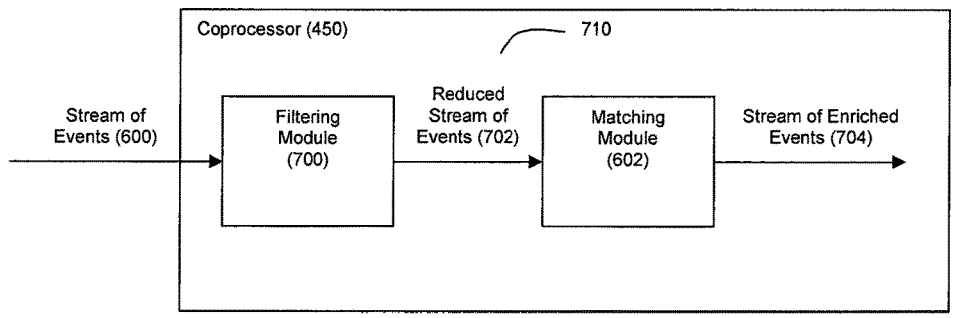
FIGS. 7(a)-(g) depict exemplary firmware pipelines and firmware modules within those pipelines that can be used to perform rule condition check operations on an incoming stream.
Figure 7B:
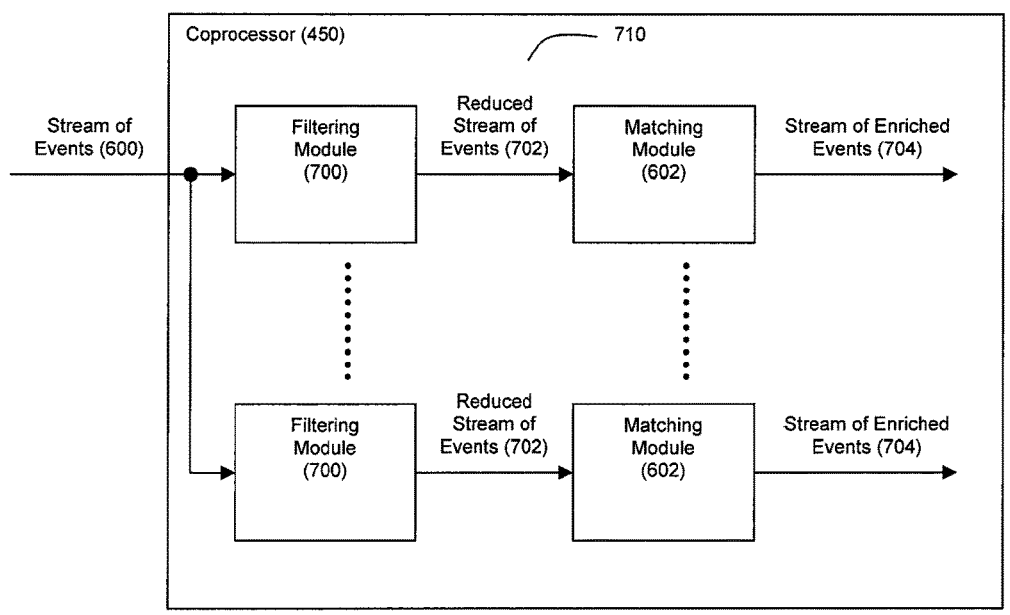
Figure 7C:
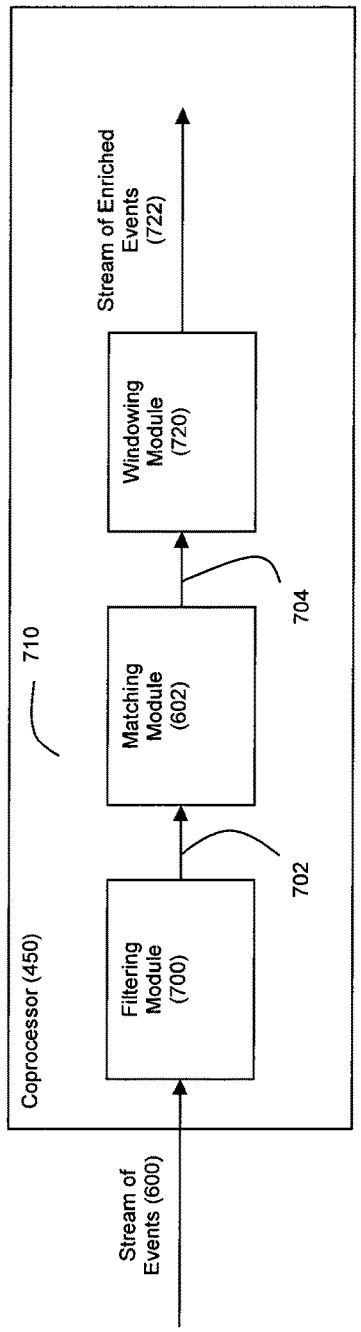
Figure 7D:
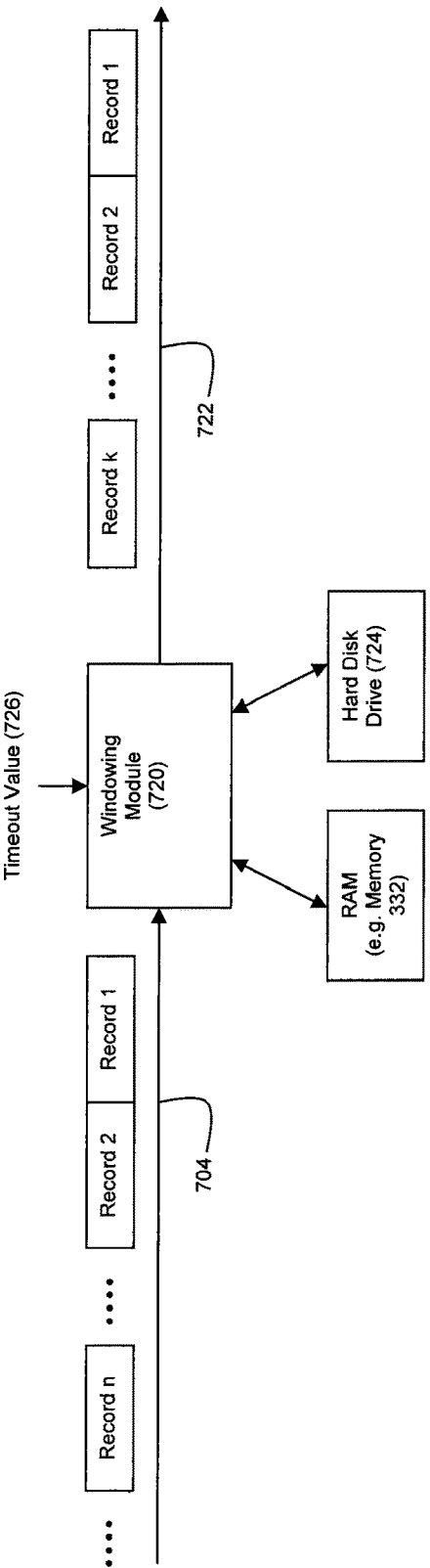
Figure 7E:
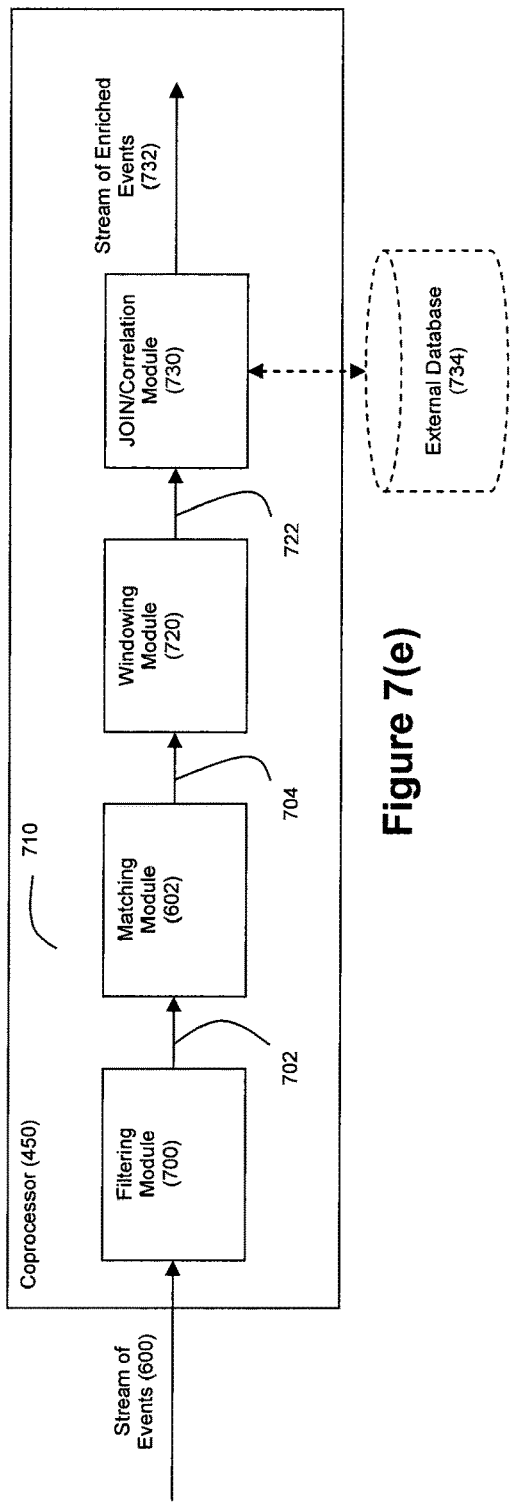
Figure 7F:
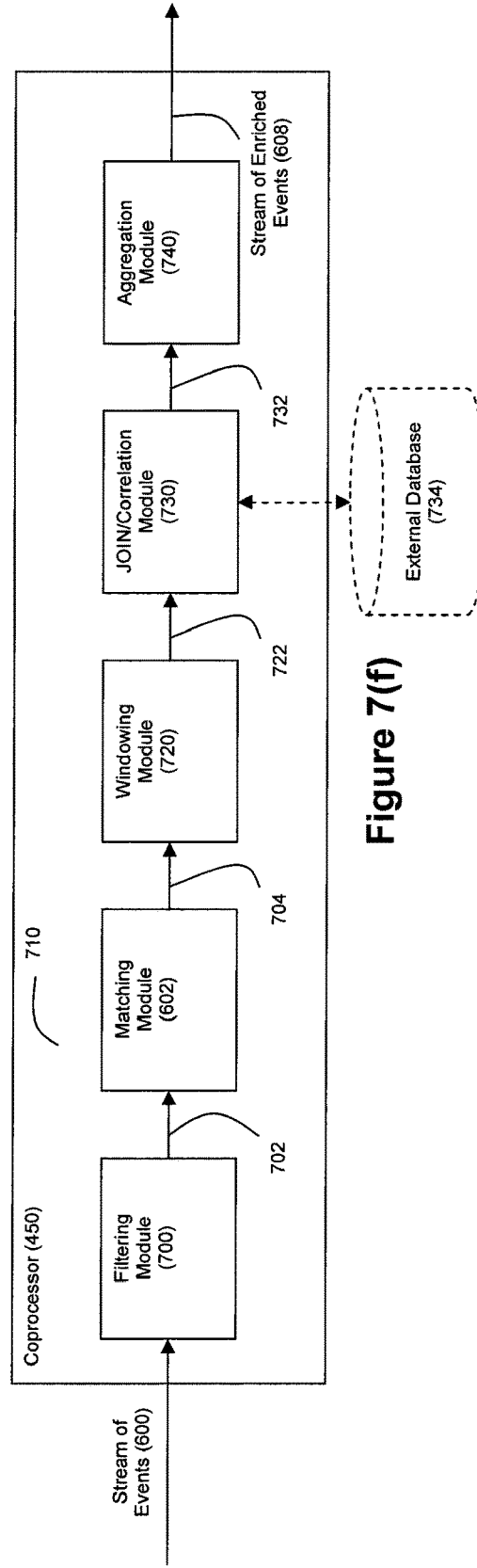
Figures 7G, 7H:
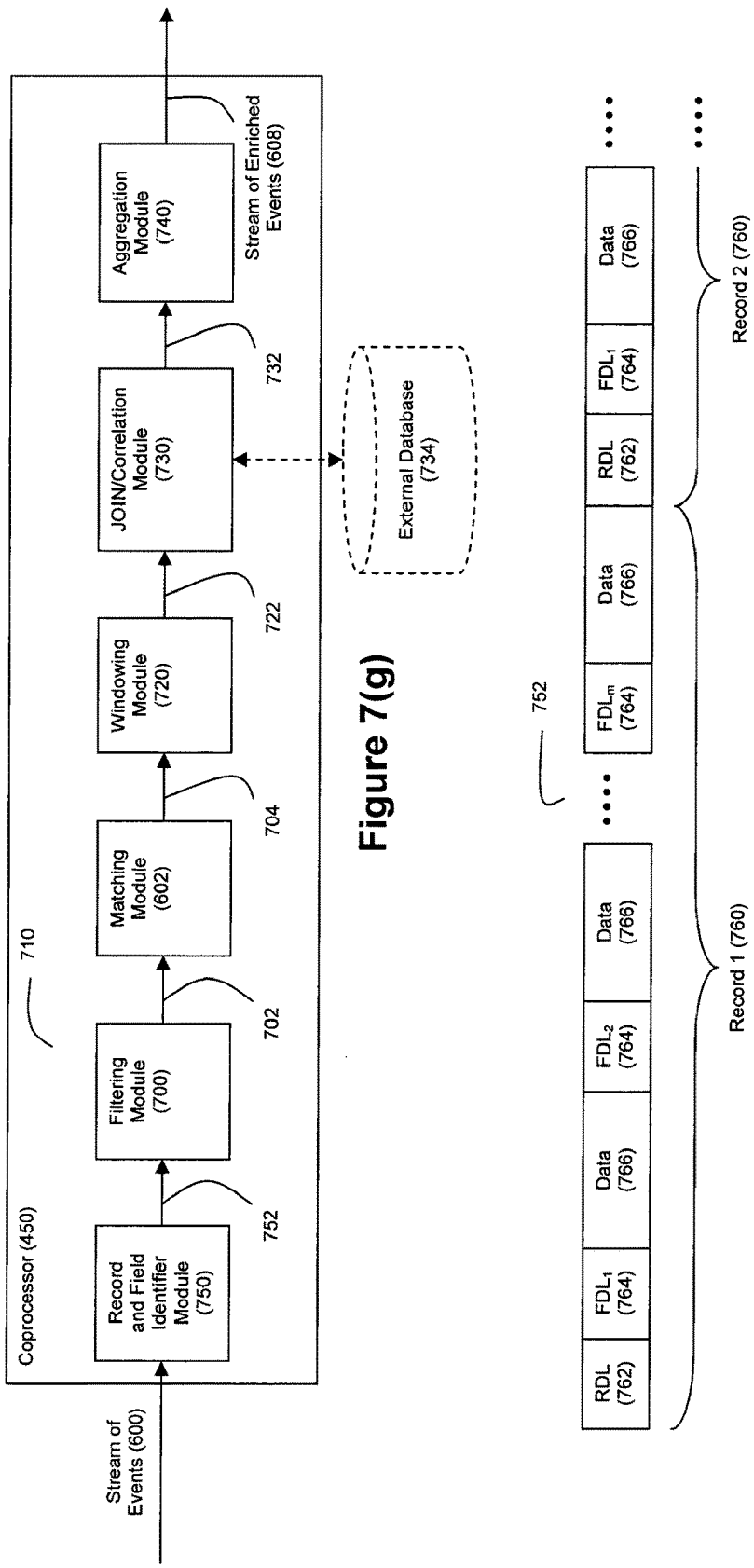
FIG. 7(h) depicts an exemplary data stream that has been partitioned into records and fields.

FIG. 6 depicts an exemplary embodiment wherein rule condition check operation(s) performed by coprocessor 450 includes a matching operation. Such a matching operation can be extremely useful for rule conditions which require a determination to be made as to whether a particular string or string pattern is present in a record. It is believed by the inventors that in conventional business rules engines, where software executed by a main GPP is used to match fact data with rule conditions for an assessment of whether any facts satisfy any rule conditions, this matching process accounts for the vast majority of processing time. FIG. 6 thus presents a solution for rules-based system to greatly accelerate this matching process by performing the matching process at hardware speeds. In this example, the data stream takes the form of a stream of data events 600. Each event 600 can be considered a data record as represented by a bit string. It should be well understood that the coprocessor 450 can be configured to receive the bits of the bit string as multiple bytes every clock cycle. Furthermore, each record preferably takes the form of (identifier, attribute, value) as explained above in connection with FIG. 1. However, other forms of data within a data stream 600 can be processed by coprocessor 450. For example, the "attribute" for a record can be presumed from the nature of the record itself, which may be the case for instances where records within the data stream include documents such as word processing files. Thus, it should be understood that the data within data stream 600 need not be rigidly formatted into identifiers/attributes/values.

In the example of FIG. 6, coprocessor 450 includes a matching module 602. This matching module 602 may be implemented in firmware on reconfigurable logic. Matching module 602 maintains a rule set 604, wherein rule set 604 comprises a plurality of rule conditions 606. Each rule condition effectively serves as a key against which the events are queried to determine if there are any events which match any rule conditions. Upon detection of a match between an event and a rule condition, the matching module 602 generates a rule condition check result for that event such that the coprocessor 450. In an exemplary embodiment, this rule condition check result can take the form of one or more bits that are representative of the existence of a match between an event and a rule condition. As previously explained, the coprocessor can use any of a number of techniques for expressing such rule condition check results. One technique can be used where the event stream itself is enriched. For example, one or more bits can be appended to an existing event which matches one or more rule conditions to identify which rule condition(s) were satisfied. Also, a new event can be generated in response to a detected match, wherein the new event identifies the event and the rule condition(s) for which a match was found. An event stream output from the coprocessor 450 which has been enhanced with rule condition check results can be referred to as enriched event stream 608. Also, various techniques can be used to encode an identification of matching rule conditions in a bit string. For example, each position in a bit string can be associated with a different rule condition, and the matching module 602 can be configured to set a particular bit position high in response to finding a matching between an event and the rule condition corresponding to that bit position. As another example, hashing can be used to encode an identification of matching rule conditions in a bit string.

Any of a number of matching techniques can be used to perform the matching operation of matching module 602. For example, hardware-accelerated matching techniques can be used such as those described in the above-referenced and incorporated U.S. Pat. Nos. 6,711,558 and 7,139,743 and U.S. Patent Application Publications 2006/0294059, 2007/0130140, and 2007/0260602. The 2007/0130140 publication describes a technique whereby a data stream can be inspected at hardware speeds to assess whether any data serves as a match to any of a number of regular expression patterns. As such, the technology disclosed in the 2007/0130140 publication can preferably be used by matching module 602 to detect any matches to rule conditions 606 which are expressed as regular expression patterns. Also, the 2007/0260602 publication discloses a technique whereby a data stream can be inspected at hardware speeds to query a given window of the data stream against a large number of standing keys (of various lengths) to determine whether the data stream window is an approximate match (within a definable degree of tolerance) to any of the keys. It should be understood that the technology of the 2007/0260602 publication can also be used to support exact match operations by simply setting the tolerance degree to a value of zero. As such, the technology disclosed in the 2007/0260602 publication can be used by matching module 602 to detect any exact or approximate matches with respect to rule conditions 606 which are expressed as words. Additional examples of hardware-accelerated matching techniques which can be used by matching module 602 include the exact matching technique known as the Rabin-Karp Search (RKS) (see Brodie, Benjamin C., Roger D. Chamberlain, Berkley Shands, and Jason White, "Dynamic reconfigurable computing," in Proc. Of 9$^{th}$ Military and Aerospace Programmable Logic Devices International Conference, September 2006, the entire disclosure of which is incorporated herein by reference) and the approximate matching technique known as the k-sub matching algorithm (see the above-referenced and incorporated article Brodie, Benjamin C., Roger D. Chamberlain, Berkley Shands, and Jason White, "Dynamic reconfigurable computing," in Proc. Of 9$^{th}$ Military and Aerospace Programmable Logic Devices International Conference, September 2006).

The enriched event stream 608 produced by coprocessor 450 can optionally then be passed along to downstream processing entities which are configured to take additional actions in response to the detected rule condition matches. As noted above, such an action engine 502 can be implemented in either hardware and/or software deployed on the coprocessor 450, a main processor for the system, and/or other processing device. However, it should be understood that the coprocessor 450 of FIG. 6 can itself be considered an ECA rule-based system in that the classic "If CONDITION(s) then ACTION(s)" conceptual framework of a rule 112 is met in that the actions specified by rule conditions 606 are exemplified by the generation of the rule condition check results. Thus, if "Rule Condition 1" is satisfied, then the action to be taken can be the exemplary action of "generating a rule condition check result that is indicative of Rule Condition 1 being satisfied".

The hardware-accelerated rules-based decision-making system of FIG. 6 can be used for a myriad of applications, with particular benefits for applications which require latency-sensitive rules-based decision-making, examples of which are explained in greater detail below.

It should also be understood that the coprocessor 450 in a rules-based decision-making system may optionally employ modules in addition to or different than matching module 602. FIG. 7(*a*) depicts an embodiment of coprocessor 450 wherein a pipeline 710 (preferably a firmware pipeline deployed in reconfigurable logic) employs a filtering module 700 upstream from the matching module 602. The filtering module 700 is configured select/deselect data within an incoming event stream 600 to generate a reduced event stream 702. For example, an enterprise may only wish for the matching module 602 to process certain records, certain fields, and/or certain fields of certain records. Thus, filtering module 700 can be configured such that only the appropriate data will be processed by matching module 602. The selection of which data will be passed by the filtering module 700 is preferably based on the value(s) in one or more specified fields of event stream 600. In doing so, the filtering module 700 may also employ its own matching module to find matches between fields that are selected for further processing and fields within an event stream. Furthermore, it should be noted that the output 704 of the matching module 602 can optionally be passed to one or more downstream modules, as explained in greater detail hereinafter.

It should also be noted that pipeline 710 may optionally employ a plurality of parallel paths, as shown in FIG. 7(*b*). Each path preferably employs a filtering module 700 and a rule condition checking module such as matching module 602. Preferably, the matching module 602 within a particular path is configured with a different rule condition set relative to the matching modules within other paths. For example, one path may employ a matching module configured to perform checks on rule conditions which require exact/approximate string matching while another path may employ a matching module configured to perform checks on rule conditions which require regular expression pattern matching. Thus, each filtering module 700 can operate to reduce the event stream 600 within its path to a reduced event stream 702 that is appropriate for the rule set used by that path's matching module.

In many instances, it will be desirable for the pipeline 710 to possess the capability to perform complex event stream processing. With complex event stream processing, the question of whether a rule is satisfied may require rule conditions which depend upon multiple events or events within different streams. As such, it is beneficial for coprocessor 450 to possess the ability to cache a desired window of received events and rule condition check results. In this manner, determinations can be made as to whether a rule condition whose satisfaction requires consideration of multiple events. To provide such caching capabilities, pipeline 710 employs a windowing module 720, as shown in FIG. 7(*c*). Windowing module 720 preferably implements the ability to declare that certain events within stream 704 are to be cached/persisted in memory for future reference. Such cached events can be stored in available memory such as RAM that is accessible to the pipeline (see, e.g., memory device 332) or other storage such as a hard disk drive 724, as shown in FIG. 7(*d*). Preferably, the windowing module 720 employs some form of a timeout value 726 that is used to decide when events are to be flushed from the cache. The windowing module 720 can be configured to maintain and track different timeout values for each cached event. Optionally, the window (or windows) of events which are maintained as history by the windowing module can be configured to slide over the course of the event stream such that it maintains a history of the most recent k events at any given time using one or more shift registers or the like rather than timeout values.

It may also be desirable for pipeline 710 to include a join/correlation module 730, as shown in FIG. 7(*e*). The role of module 730 would be to merge two or more windows of events from the windowing module 720 into a single stream 732, wherein stream 732 comprises events with values that are joined from the multiple windows. It should be understood that the streams being joined can be joined on any of a number of system-defined join keys. For example, it may be the case that incoming stream 722 may include multiple streams whose records are interleaved with each other. For example, stream 722 may include a first conceptual stream which comprises financial market events (e.g., stock trades) and second conceptual stream which comprises news reports from a news feed. The events from these two conceptual streams may be interleaved within stream 722. The join/correlation module 730 can then merge these two conceptual streams into a single stream using a join key. For example, perhaps a practitioner of pipeline 710 desires to merge records which are news articles about Acme Corp. with records that are stock transaction events for Acme Corp. Thus, Acme Corp. can be used as a join key such that a stock transaction record within an event window available to module 730 having the ticker symbol for Acme Corp. will be merged with a news record within an event window available to module 730 that contains the word "Acme". If necessary, the join/correlation module 730 can maintain its own caching capabilities (such as one like that shown for windowing module 720) to retain a desired history of the event windows. It should also be understood that rather than receiving a single physical stream with multiple interleaved conceptual streams, the join/correlation module can be configured receive multiple physical streams (with each of these physical streams comprising a single conceptual stream or multiple conceptual streams).

Optionally, the join/correlation module 730 may employ additional features such as a join to static data from a database. With a join to static data, the data to be joined would be read from a static database such as external database 734. In this way, a join operation can operate to add data which is stored in the database to the streaming records. An example of a join to static data that can be performed by pipeline 710 involves joining a stream of transaction records with data from a customer master table that is stored in a database 734. Using a join key such a name field in the stream of transaction records and a name field in the customer master table, joins can be performed on transaction records and customer data from the table that share the same value in a name field.

Another feature that can be performed by a join/correlation module is an approximate join. Continuing with the example above, an approximate join between a stream of transaction records and data from a customer master table, wherein the approximate join is based on a join key that is a name field, will support joins where there is only an approximate match and not an exact match between the values in the name fields of the transaction records and the customer table. Thus, a transaction record with a name field value of "John A. Smith" can be joined with customer data associated with a name field value of "John Smith" even through the two field values do not exactly match. As such, the join/correlation module 730 would employ approximate matching functionality that performs an approximate match operation between the values in the fields defined by the join key that are under consideration for a possible join. If the approximate match operation results in a determination that the two values are sufficiently similar, then the join is performed. Approximate matching technology such as the kinds previously discussed can be used for this functionality. It should also be understood that approximate joins need not be limited to joins on data stored in a database 734. Approximate joins can also be performed on multiple streams available to module 730. Furthermore, the approximate nature of the approximate join need not only be defined by approximate word matching operations. For example, with approximate joins on multiple data streams, it should be noted that because the time dimension of the multiple streams may not exactly align with each other, the value matching of the approximate join may be based on time intervals rather than exact times. Thus, if a time stamp field of records within two streams is used as a join key, then an approximate join operation can be configured such that any time stamp value within a range of time stamp values for the two streams will be deemed a match. To implement this functionality, a range check operation such as the ones described herein can be performed.

Pipeline 710 may also be configured to include an aggregation module 740, as shown in FIG. 7(*f*). Aggregation module 740 is preferably configured to perform aggregations based on pre-defined mathematical expressions. As such, aggregation module preferably maintains or have access to data storage capabilities such as on-chip memory or memory 332. Optionally, these aggregations may operate on the windows of events produced by the windowing module (and present in the output of the join/correlation module 630). An example of an aggregation module is depicted in FIG. 19(*b*), discussed hereinafter. Additional examples of aggregation operations that may be performed include moving average computations, volume weighted average pricing (VWAP) operations, risk analysis operations, etc.

In instances where the event stream 600 does not possess a record/field format for its data (or possesses a record/field format that is not recognized by pipeline 710), pipeline 710 may also employ a record and field identifier module 750 at its head, as shown in FIG. 7(*g*). The record and field identifier module 750 is configured to partition the event stream 600 into a record-delimited and field-delimited event stream 752 that is understood within pipeline 710. Preferably, a priori knowledge exists about the format of the incoming events so that appropriate tables can be maintained and accessed by module 750 when partitioning the event stream. For example, it may be known a priori that a certain bit string (or certain bit strings) will serve as a record delimiter. Furthermore, it may be known a priori that certain fields will begin at certain offsets within a record (e.g., a byte 10, field x begins, at byte 13, field y begins, etc.). Alternatively, it may be known a priori that certain field delimiters can be present in records, and module 750 can be configured to recognize these delimiters and possibly replace them with a field delimiter format that is internal to pipeline 710. However, it should further be noted that module 750 can also be configured to "learn" the formats of incoming records and use this learned knowledge to perform the partitioning.

FIG. 7(*h*) depicts an exemplary record and field delimited stream 752. The record and field identifier module 750 inserts appropriate record delimiters (RDLs) 762 into the stream to separate the different data events from each other. Preferably, each RDL 762 also serves as a record identifier 106 as discussed above for facts 100. Moreover, the data within each event may be categorized into one or more fields, with each field being identified by a field delimiter (FDL) 764. Following each FDL 764 is the data 766 corresponding to the value for that field. It should be readily understood that FDLs 764 correspond to the attribute identifiers 108 discussed above for facts 100 and that data 766 corresponds to the values 110 discussed above for facts 100. Thus, stream 752 comprises a plurality of events/records 760 partitioned by RDLs 762, with each record being partitioned into field-delimited data 766 (via FDLs 764). Thus, filtering module can rely on the partitions within data stream 752 when making decisions as to which records and fields will be passed to downstream modules. It should also be noted that the terms "record delimiter" and "field delimiter" can be alternatively referred to as "record identifier" and "field identifier" respectively.

It should also be understood that the arrangements for pipeline 710 shown in FIGS. 7(*a*)-(*h*) are exemplary only and different pipeline arrangements can be implemented with different module orders within the pipeline, different module interconnections within the pipeline, and/or different modules altogether within the pipeline. For example, the windowing module 720 can be configured to pass its event windows back to the matching module 602 so that rule conditions across an entire event window can be checked. Also, an additional rule condition checking module (or modules) can be located downstream from the windowing module 730 to provide rule condition checking for complex events. Further still, various modules could be added/deleted to/from the pipeline 710 depending upon the needs of a given rule set or stream conditions.

Figure 8C:
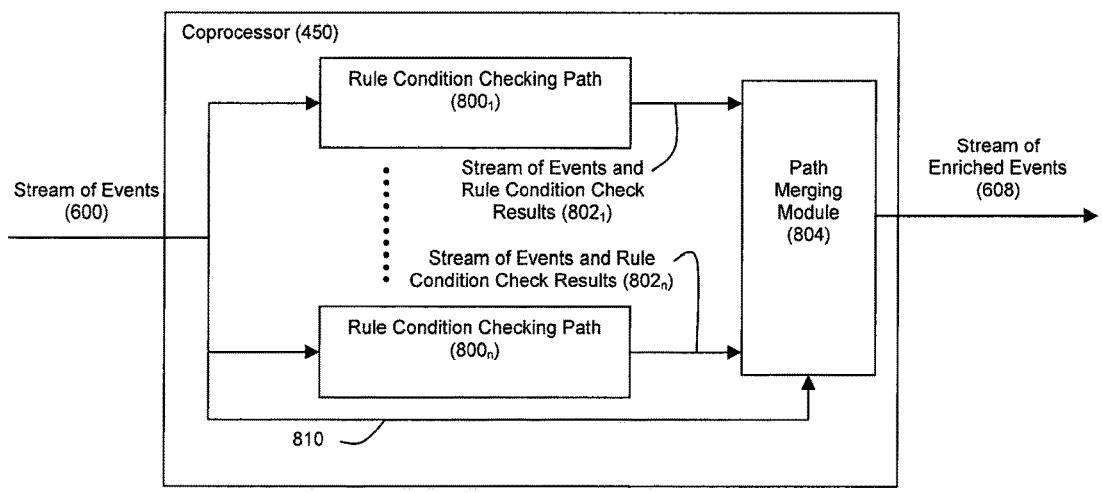
FIGS. 8(c)-(e) depict additional exemplary rule condition checking pipelines with multiple rule condition checking paths.
Figure 8D:
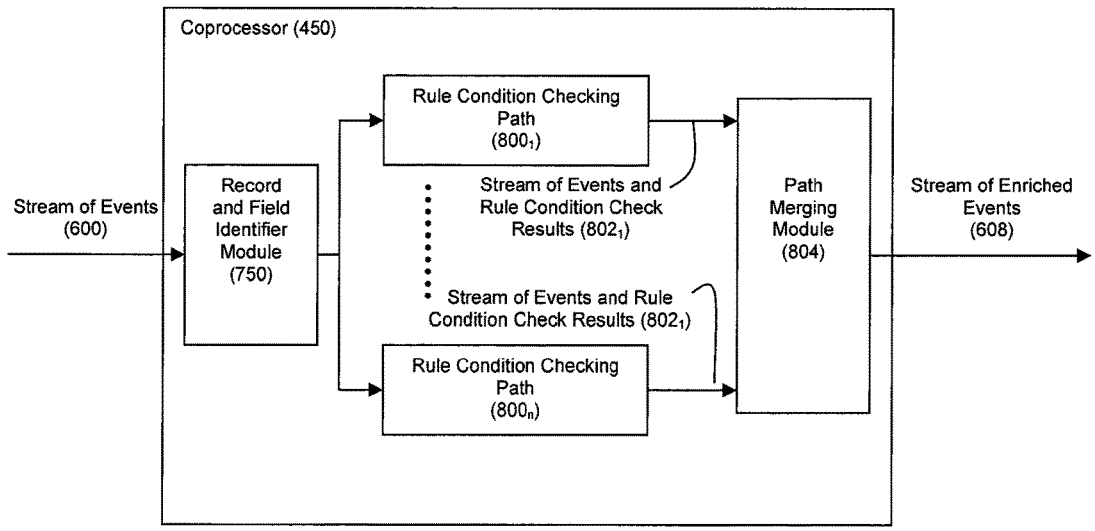
Figure 8E:
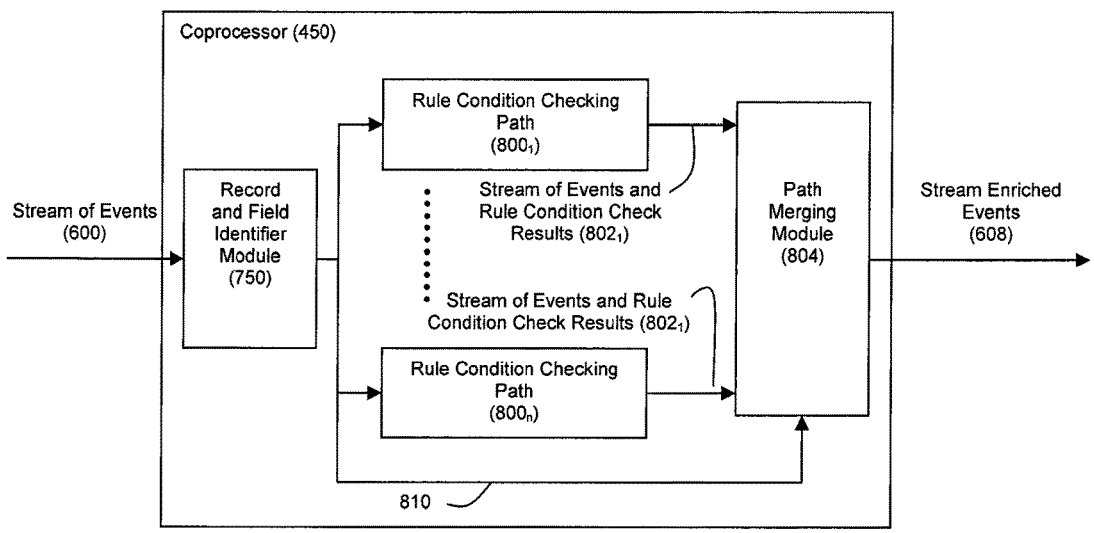

FIG. 8(*a*) illustrates an embodiment wherein coprocessor 450 employs a plurality of parallel paths 800 for checking rule conditions. Each path may comprise a pipeline 710 such as any of those shown in FIGS. 7(*a*), 7(*c*), 7(*e*), 7(*f*), and 7(*g*), and will operate to produce a path-specific stream 802 of events and rule condition check results. A path merging module 804 is positioned to receive the streams 802 and merge them into the output stream 608. In this manner, path merging module 804 provides similar functionality as the join/correlation module 730 discussed above. FIG. 8(*b*) depicts an exemplary path merging operation. In this example, the rule condition checking paths 800 operate to append, onto records which have fields that satisfy a rule condition, a field 820 corresponding to the rule condition check result. This enrichment field 820 includes a bit string whose values are indicative of which rule conditions that the record's fields satisfied (either directly or indirectly). Thus, continuing with an example where the enrichment field is directly indicative of which rule conditions are satisfied, the enrichment field 820 for record 760 within stream 802$_1$ (from path 800$_1$) indicates that rule condition #5 was satisfied. The enrichment field 820 for record 760 within stream 802$_2$ (from path 800$_2$) indicates that rule condition #2 was satisfied. Thus, to merge the enrichment fields from the two paths together, the path merging module 804 operates to essentially combine the enrichment fields 820 for the record within streams 802$_1$ and 802$_2$ to create a combined enrichment field 822 for that record in output stream 608 which indicates that record 760 satisfied both rule condition #2 and #5. In this example, the path merging module 804 produces the combined enrichment field 822 in the output stream 608 by ORing together the fields 820 in the path output streams 802. However, it should be understood that any of a number of techniques can be used to represent rule condition check results within each stream 802 and to combine the rule condition check results within streams 802. For example, rather than ORing together the different fields 820 for a record in streams 802, the path merging module 804 can be configured to concatenate the different fields 820. In such a case, the enrichment field 820 for a record in a particular stream 802 would only identify the rule conditions which are pertinent for the path 800 of that stream 802. Another way to merge fields 820 would be for instances where both paths result in the same rule being satisfied, then this could be indicated in field 822 by summing the bit strings of the individual streams.

FIG. 8(*c*) depicts an alternate embodiment wherein the coprocessor 450 also includes a bypass path 810 that feeds into the path merging module 804. In instances where a filtering module 700 is used within any of paths 800, with use of the bypass path 810, the path merging module 804 will be able to take into consideration any records and fields which may have been filtered out of the path streams when it assembles the enriched output stream 608. Thus, the path merging module 804 will have an unmolested event stream into which to insert the rule condition check results generated by paths 802.

FIG. 8(*d*) depicts an embodiment for coprocessor 450 corresponding to that of FIG. 8(*a*) wherein a record and field identifier module 750 is positioned to receive the incoming stream 600 and partition the event stream into appropriate records and fields. FIG. 8(*e*) depicts an embodiment for coprocessor 450 corresponding to that of FIG. 8(*c*) wherein a record and field identifier module 750 is positioned to receive the incoming stream 600 and partition the event stream into appropriate records and fields. In this embodiment, bypass path 810 is preferably configured to communicate the partitioned event stream to the path merging module 804.

Figure 9:
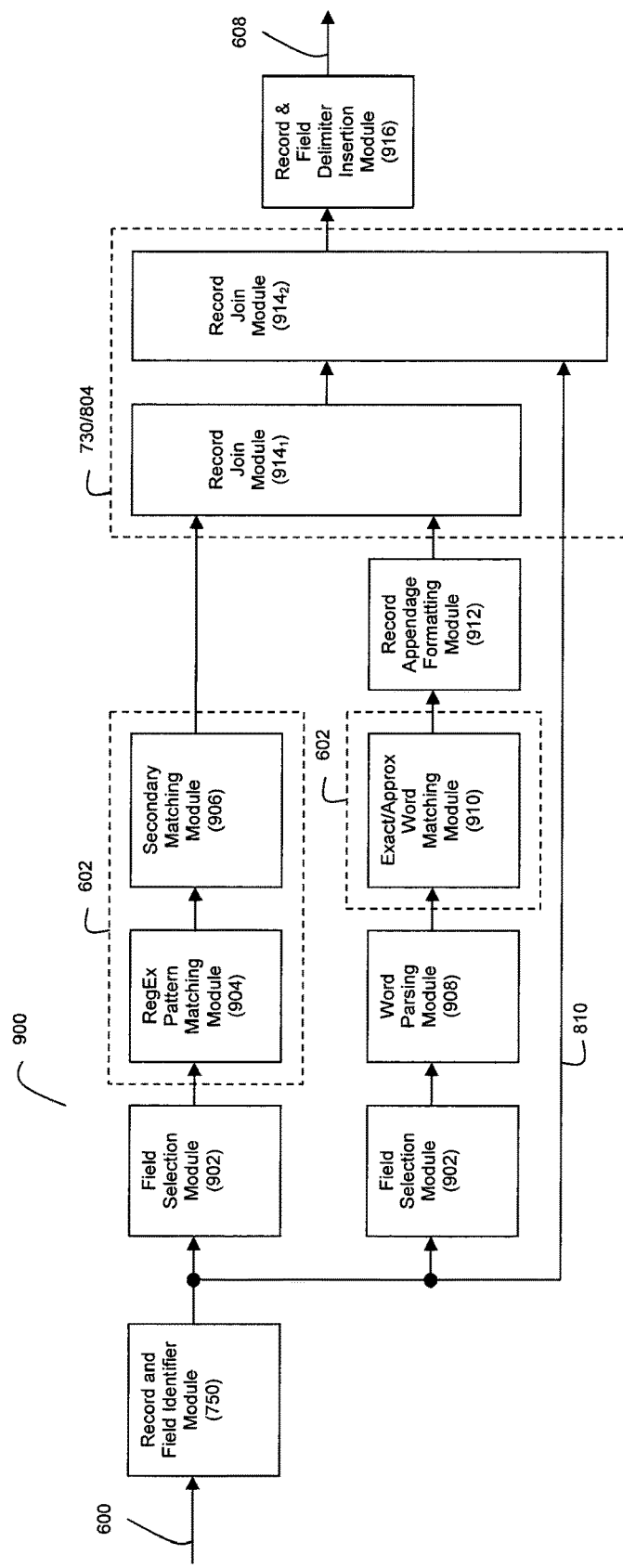
FIG. 9 depicts another exemplary embodiment for a multi-path rule condition checking pipeline.

FIG. 9 depicts an exemplary pipeline 900 (preferably deployed in firmware on a coprocessor 450) that is configured as a rules-based decision-making system. This exemplary pipeline 900 comprises three parallel paths—a first path wherein rule conditions are checked using a regular expression pattern matching module 904, a second path wherein rule conditions are checked using an exact/approximate word matching module 910, and a third path which serves as a bypass path 810. At the head of pipeline 900 is a record and field identifier module 750 which creates the partitioned data stream received by the three paths. A first record join module 914 operates to join the streams emanating from the first two paths, while a second record join module 914 operates to join the merged stream of the first two paths and the original stream of the bypass path 810. Downstream from the second record join module 914 is a record and field delimiter insertion module 916. The first path preferably comprises a field selection module 902, a regular expression pattern matching module 904, and a secondary matching module 906 as shown in FIG. 9. The second path preferably comprises a field selection module 902, a word parsing module 908, an exact/approximate word matching module 910, and a record appendage formatting module 912.

Figure 10:
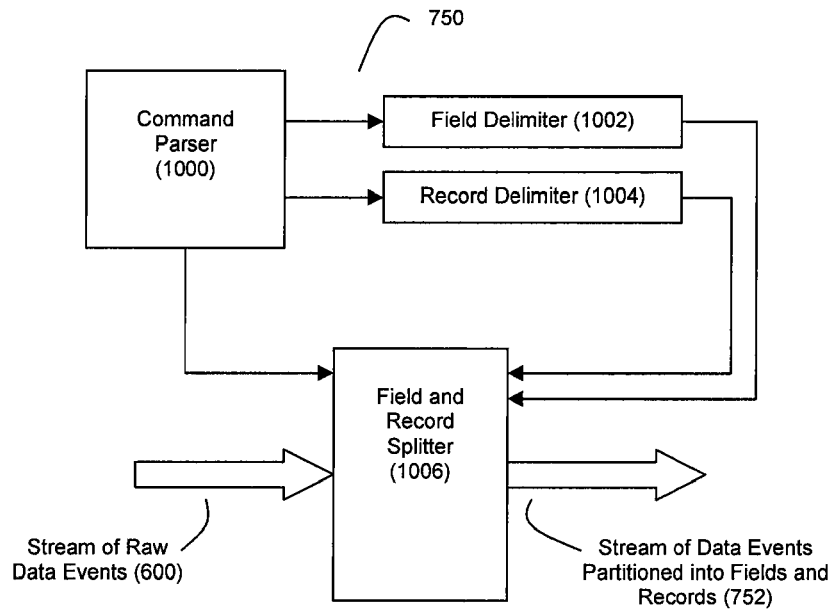
FIG. 10 depicts an exemplary record and field identifier module for the pipeline of FIG. 9.

FIG. 10 depicts an exemplary embodiment for a record and field identifier module 750. A command parser 1000 is configured to receive command data for the module 750 (preferably by way of firmware socket module 404) and configure module 750 such that it operates as desired (e.g., instructions that identify the bit strings to be used as a record delimiter and the bit strings to be used as field delimiters). Data table 1002 stores one or more field delimiters eligible for insertion into the event stream to delineate field boundaries within data. Each field delimiter may be configured to impart meaning to the data values corresponding to a particular field. Also, each field delimiter can be configured to indicate an ordered location for a particular field within a record (e.g., field 1 should be before field 2 within a record, and so on). It should also be noted that each field delimiter may also optionally be simply a delimiter that does not itself contain any metainformation about the nature of its corresponding field. Data table 1004 stores one or more record delimiters for insertion into the event stream to delineate record boundaries within data. Optionally, each record delimiter can be configured to uniquely identify each record. To do so, a counter can be employed to populate the record delimiter table with the record delimiter to be used for each incoming record. The record delimiter can also be a bit string that is unique relative to other data within the stream but is not otherwise uniquely indicative of a particular record. In such instances, a downstream module can then assign a unique identifier to each record that has been marked with such an RDL. Data tables 1002 and 1004 can be maintained in available on-chip memory or other accessible memory such as memory 332.

Field and record splitter 1006 operates to parse the raw data stream 600 to identify where record delimiters and field delimiters from tables 1002 and 1004 should be inserted. Splitter 1006 is preferably provided with (offset, length) pairs which indicate where the different fields exist relative to the start of each record. Upon encountering a location where an FDL needs to be inserted, the splitter 1006 can access table 1002 to retrieve the appropriate FDL and insert that FDL into the record at that location. In this manner, the field and record splitter 1006 is able to produce an output stream 752 of data events that are partitioned into records and fields.

Figure 11:
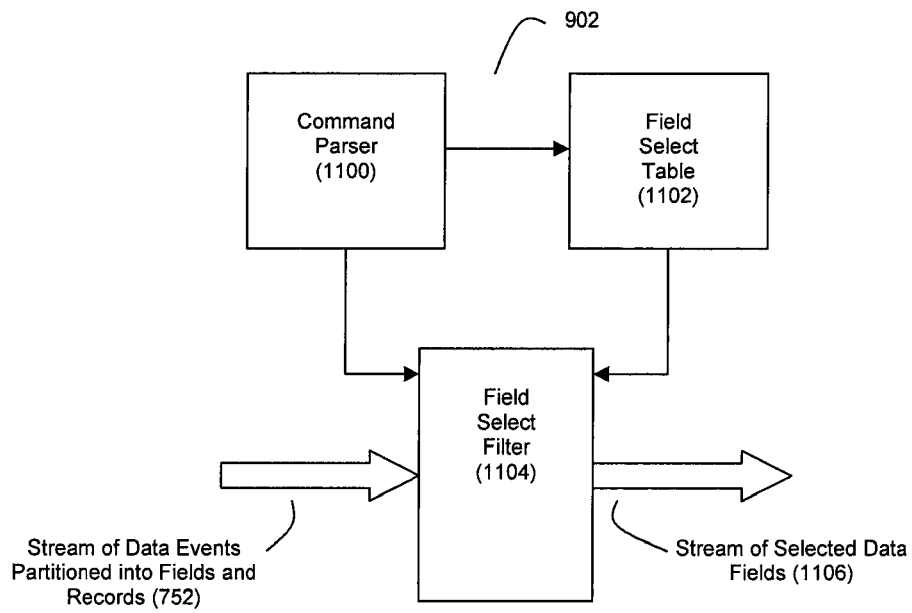
FIG. 11 depicts an exemplary field selection module for the pipeline of FIG. 9.

FIG. 11 depicts an exemplary embodiment for a field selection module 902, which serves as a filtering module 750 as previously described for the first and second paths of pipeline 900. Each field selection module 902 is configured to reduce the data stream within its path to only records and fields that are to be considered against that path's rule set. A command parser 1100 is configured to receive command data for the module 902 (preferably by way of firmware socket module 404) and configure module 902 such that it operates as desired (e.g., instructions that identify the records and fields that are to be passed to or blocked from the output stream 1106). Field select table 1102 stores identifiers for the fields which are to be passed to (or blocked from) the output stream 1106 of selected data fields. The output of a field selection module 902 will be a stream 1106 of select data fields and their corresponding values. It should be understood that field selection module 902 may optionally be configured to retain the record identifiers in the output stream of select fields, which can enhance the throughput of the pipeline 900 so that stalls during merging operations are minimized. However, optionally, the pipeline 900 can be configured to process the select fields of a single record at a time within the pipeline paths, in which case the field selection modules 902 could also strip out the record identifiers from each record.

It should be understood that the field selection module 902 in each path of pipeline 900 can be configured to pass different fields based on the rule conditions within each path's rule set. That is, if incoming event stream 752 includes records partitioned into multiple fields, where one field is relevant to a rule condition within the first path's rule set but not any rule condition in the second path's rule set, then the field selection module 902 for the first path would be configured to pass that field while the field selection module 902 for the second path would be configured to block that field. In this manner, the field selection module 902 serves to lower the processing workload of downstream modules in each path.

Figure 12:
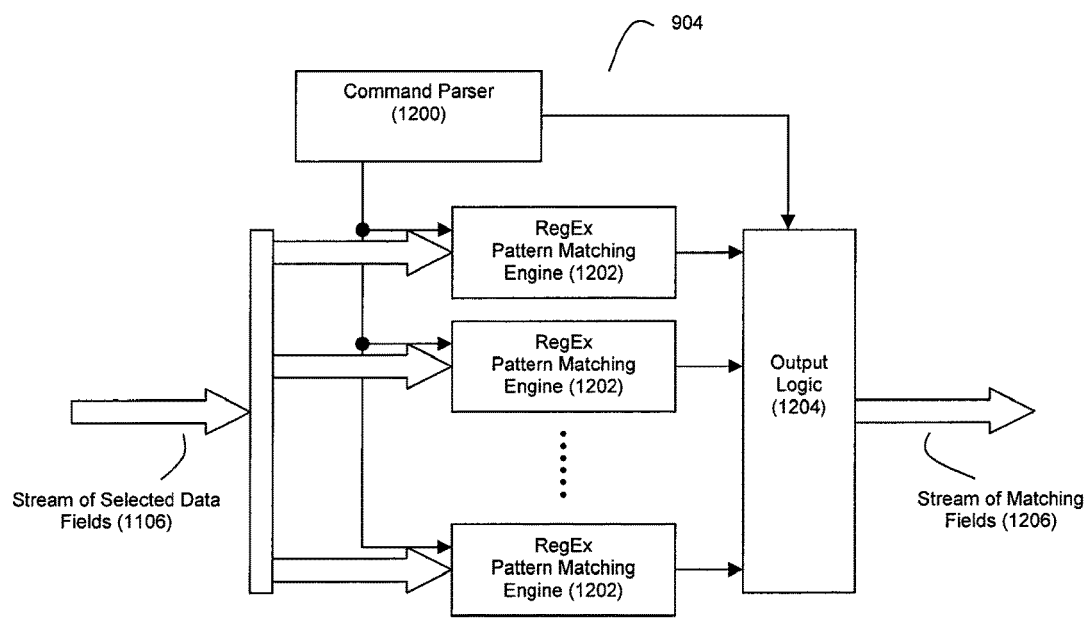
FIG. 12 depicts an exemplary regular expression pattern matching module for the pipeline of FIG. 9.

FIG. 12 depicts an exemplary regular expression pattern matching module 904. A command parser 1200 is configured to receive command data for the module 904 (preferably by way of firmware socket module 404) and configure module 904 such that it operates as desired (e.g., instructions that identify the regular expression patterns to serve as keys for the matching engines 1202). Preferably, module 904 employs a plurality of parallel regular expression pattern matching engines 1202. In an exemplary embodiment, each engine 1202 is configured to detect a different regular expression pattern. Thus, one engine 1202 can operate to detect a credit card number pattern while another engine 1202 can operate to detect a social security number pattern. The stream 1106 of select data fields are broadcast to all of the matching engines 1202 to assess whether any of the data within the fields of stream 1106 match any of the data patterns keyed into the regular expression pattern matching engines 1202. As noted above, the regular expression pattern matching engines preferably employ the technology disclosed in the above-referenced and incorporated U.S. Patent Application Publication 2007/0130140. Output logic 1204 serves to merge the matching fields output of the different engines 1202 together into an output stream 1206 of matching fields. In doing so, logic 1204 preferably enhances the output stream 1206 with an indication of which patterns were found to be present in a given input event.

It should be noted that module 904 is preferably only configured to output a match if any field within stream 1106 contains a data pattern which matches a regular expression pattern key. However, a given rule condition may require that the regular expression pattern key appear in a particular field of data. Thus, consider an example where a rule condition requires that regular expression A be present within field 3 of a record and where another rule condition requires that regular expression B be present within field 5 of a record. If a record with regular expression B within field 3 and regular expression A within field 5 is received by module 902, then module 902 will output two matches. However, to assess whether these two matches actually satisfy the rule conditions, a secondary check is needed to find if the match occurred for a valid field-regular expression combination. To accomplish this purpose, pipeline 900 employs secondary matching module 906.

Figure 13A:
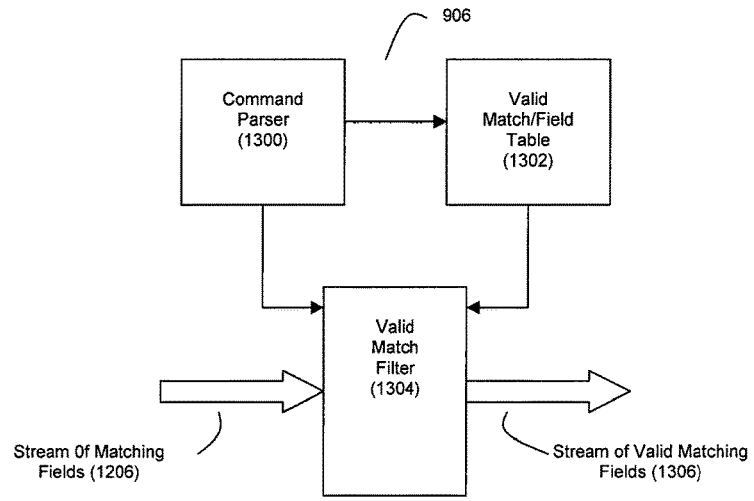
FIG. 13(a) depicts an exemplary secondary matching module for the pipeline of FIG. 9.

An exemplary embodiment for a secondary matching module 906 is shown in FIG. 13(a). A command parser 1300 is configured to receive command data for the module 906 (preferably by way of firmware socket module 404) and configure module 906 such that it operates as desired (e.g., instructions that identify valid match/field pairs). Preferably, module 906 employs a table 1302 which defines the combinations of regular expression patterns and fields which are valid rule conditions. Table 1302 can be maintained in available on-chip memory or other accessible memory such as memory 332. Thus, continuing with the example from above, regular expression A and field 3 would be a valid pair, and regular expression B and field 5 would be a valid pair. The valid match filter 1304 operates to inspect the stream 1206 of matching fields to identify those field/pattern combinations within stream 1206 which have a corresponding pair in table 1302. Those field/pattern combinations with a corresponding pair in table 1302 are then passed along in the output stream 1306 of valid matching data fields.

Figure 13B:
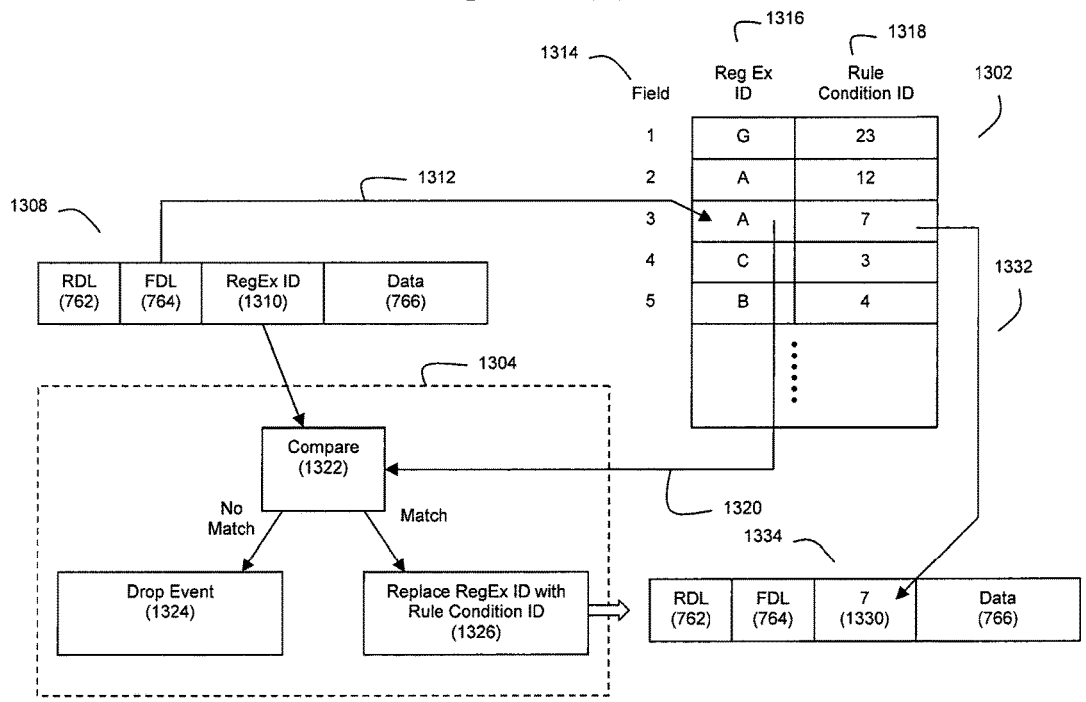
FIG. 13(b) depicts an exemplary mode of operation for the secondary matching module of FIG. 13(a)

FIG. 13(b) depicts an exemplary mode of operation for secondary matching module 904. To facilitate the operation of the valid match filter 1304, it is preferred that each regular expression pattern matching engine 1202 insert a bit string 1310 within each matching field that identifies the particular regular expression pattern which served as a match to the data field. FIG. 13(b) depicts an exemplary matching record 1308 with such a regular expression identifier 1310. Table 1302 preferably stores data that is indexed in addresses 1314 that correspond to fields of the records. The table stores a column 1316 that contains a regular expression identifier for the regular expression pattern that is a valid pair with that table address's corresponding field. The table also preferably stores a column 1318 that contains a rule condition identifier for the valid field/regular expression pattern pair. Thus, as a record 1308 is received by filter 1304, a lookup 1312 is performed in table 1302 using the field delimiter 764 of the record as an index to thereby retrieve the regular expression identifier 1320 and rule condition identifier 1332 for the table entry stored in the address defined by the index. Filter 1304 then performs a comparison 1322 between the regular expression identifier 1310 in record 1308 and the regular expression identifier 1320 retrieved from table 1302. If there is not a match between the two, then filter 1304 drops record 1308. If there is a match between the two, then filter 1304 replaces the regular expression identifier 1310 in record 1308 with the retrieved rule condition identifier 1332 for inclusion as a new field 1330 within a record 1334 to be output from the filter 1304 as part of stream 1306. Thus, because field 3 of record 1308 produced a pattern match with regular expression A (thereby satisfying rule condition #7, the output record within stream 1306 will include a bit string 1330 that identifies rule condition #7 as having been satisfied.

It should be noted that each field indexed by table 1302 may have multiple associated regular expression pattern identifiers. In such instances, it should also be noted that table 1302 can be alternatively configured such that the regular expression identifiers are used to index table entries, with the table entries being populated by field delimiters and rule condition identifiers.

Figure 14A:
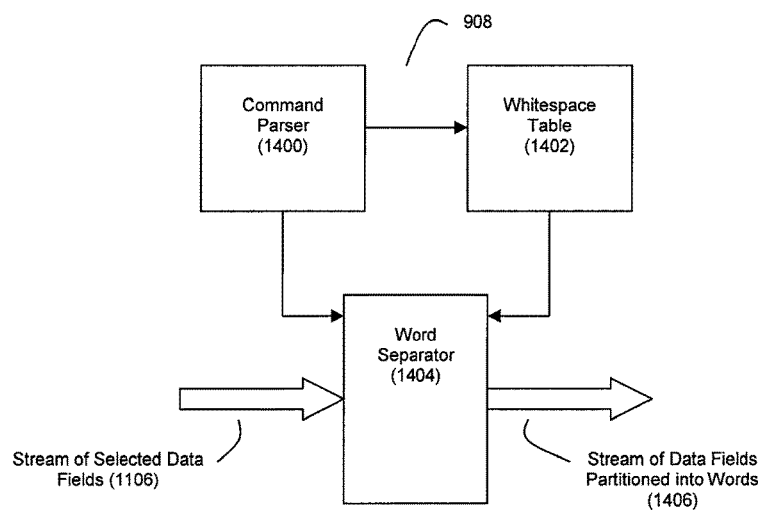
FIGS. 14(a) and (b) depict an exemplary word parsing module for the pipeline of FIG. 9.
Figure 14B:
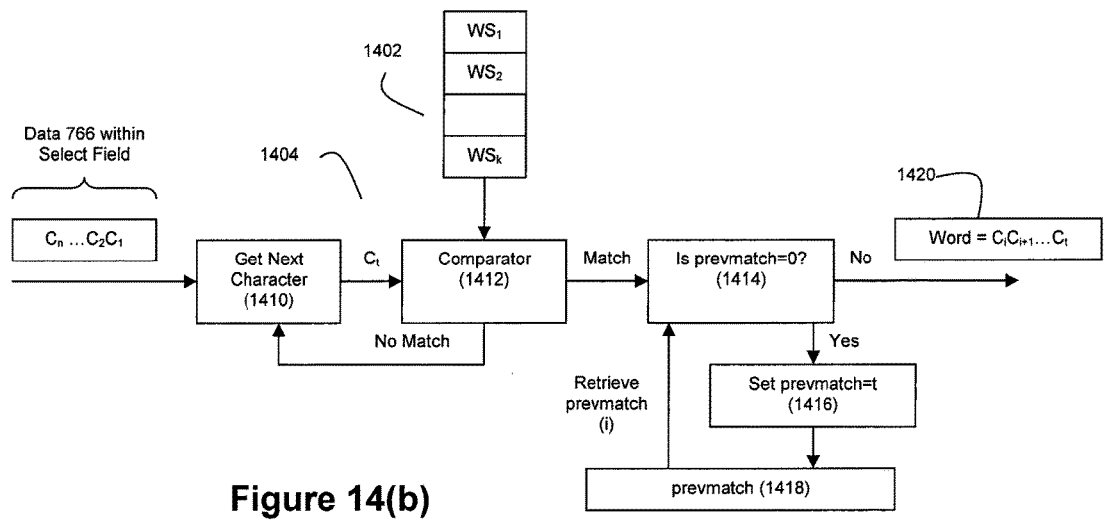

The second path of pipeline 900 preferably includes a word separator module 908 downstream from that path's field selection module 902. An example of such a word separator module 908 is depicted in FIGS. 14(a) and (b). A command parser 1400 is configured to receive command data for the module 908 (preferably by way of firmware socket module 404) and configure module 908 such that it operates as desired (e.g., instructions that identify how to recognize white space within the data stream and how to separate the words delineated by the recognized white space). Preferably, module 908 employs a table 1402 which defines the data characters (or groups of characters) to be recognized as white space that separates words within data 766 of the fields within stream 1106. Table 1402 can be maintained in available on-chip memory or other accessible memory such as memory 332. Word separator module 1404 thus operates to parse data 766 found in input stream 1106 into its constituent words for output via stream 1406. Operation 1410 operates to get the next character C within data 766. A comparator 1412 then compares this character $C_t$ with white space characters stored in table 1402. If no match is found, then $C_t$ forms part of the current word 1420 and operation 14110 gets the next character within data 766. If comparator 1412 does find a match with a white space identifier, then operation 1414 retrieves a currently stored value for prevmatch (i) from register 1418. If this value is 0, then operation 1416 sets prevmatch equal to t. If this value is not zero, then $C_t$ forms the end of word 1420 for output from the word separator 1404. The value prevmatch will thus be assigned the current value of the white space match (which is "t" in this example) so that the next time there is a white space match, then the next word can be ascertained. Also, the value for prevmatch is preferably reset to zero when a new field is input into the word parsing module. It should also be noted that the word separator 1404 can maintain a count of characters within each field so that it can also produce a position identifier for each word 1420 that identifies an offset for that word within a field or record.

Figure 15:
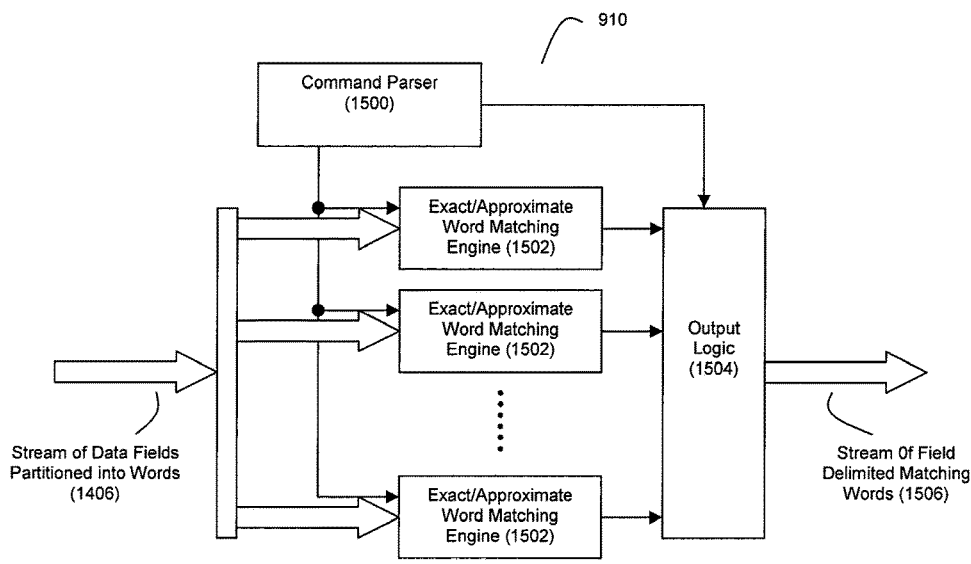
FIG. 15 depicts an exemplary exact/approximate word matching module for the pipeline of FIG. 9.

FIG. 15 depicts an exemplary exact/approximate word matching module 910. A command parser 1500 is configured to receive command data for the module 910 (preferably by way of firmware socket module 404) and configure module 910 such that it operates as desired (e.g., instructions that identify the strings to serve as keys for the matching engines 1502 and identify the exact or approximate nature of the matching operations). Preferably, module 910 employs a plurality of parallel exact/approximate word matching engines 1502. The word stream 1406 is broadcast to all of the matching engines 1502 to assess whether any of the words with stream 1406 match (either exactly or approximately depending upon how engines 1502 are configured) any of the strings keyed into the matching engines 1502. Optionally, each word matching engine 1502 can be configured to check for the presence of strings of a particular length within the word stream 1406. Thus, a first engine 1502 can be configured to check for the presence of particular strings of length 3 within stream 1406, while a second engine 1502 can be configured to check for the presence of particular strings of length 4 within stream 1406, and so on. The exact/approximate word matching engines 1502 can employ any of the word matching technology discussed above for matching module 602. Output logic 1504 serves to merge the matching words output from the different engines 1502 together into an output stream 1506 of matching words within the select fields.

Figure 16A:
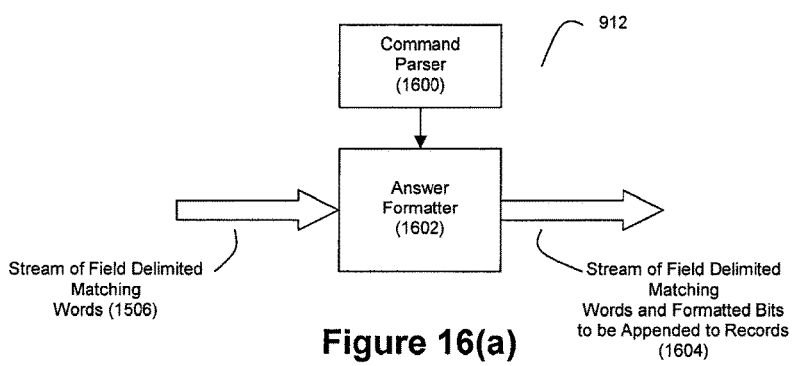
FIGS. 16(a) and (b) depict an exemplary record appendage formatting module for the pipeline of FIG. 9.
Figure 16B:
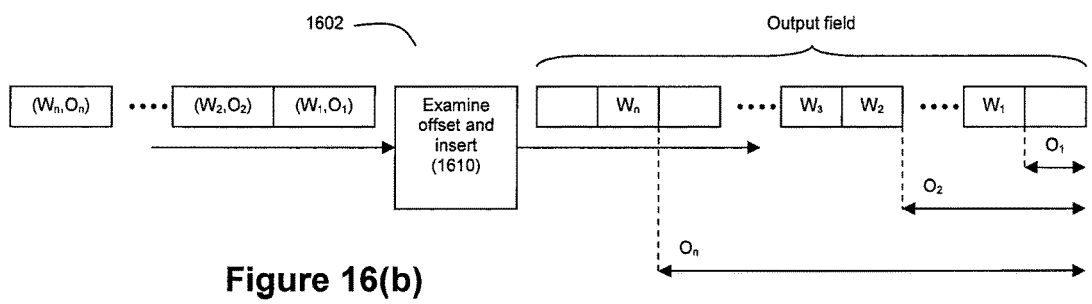

FIGS. 16(a) and (b) depict an exemplary embodiment for a record appendage formatting module 912. Module 912 is configured to receive the hit stream 1506 from module 910 and format those hits into an appropriate bit string that is to be appended to the original record. A command parser 1600 is configured to receive command data for the module 912 (preferably by way of firmware socket module 404) and configure module 912 such that it operates as desired (e.g., instructions that identify how hits within stream 1506 should be formatted into a bit string to be appended to the record). An answer formatter 1602 then creates an appropriately formatted bit string for each incoming hit within stream 1506 to output a stream 1604 of field delimited matching words for the records together with the bit strings to be appended to the records. For example, as shown in FIG. 16(b), a stream of hits in the form of pairs of matching words and their offsets within a field can be received and examined by the formatter at 1610. Formatter can then assemble an output field with each word positioned at the offset defined by the received word/offset pair.

Figure 17A:
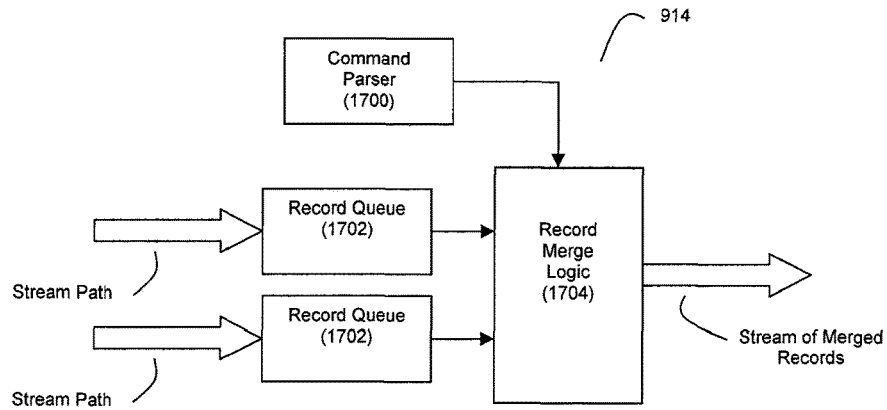
FIGS. 17(a) and (b) depict an exemplary record join module for the pipeline of FIG. 9.
Figure 17B:
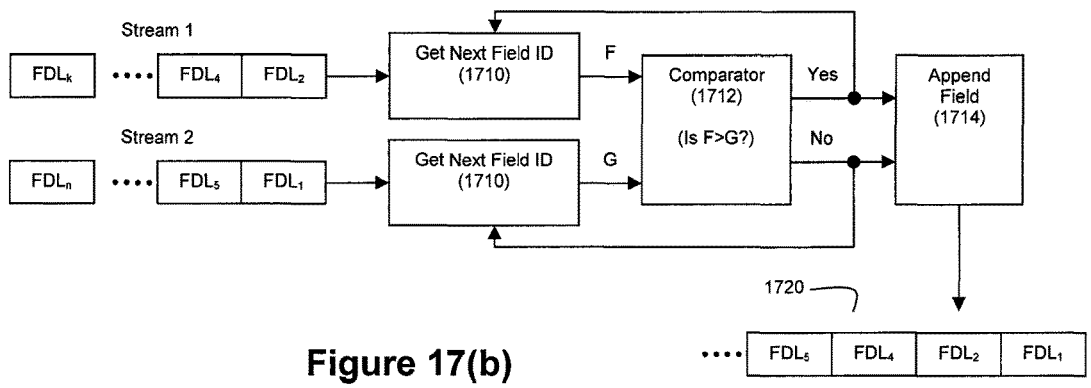

FIGS. 17(a) and (b) depict an exemplary embodiment for a record join module 914. Record join module 914 operates to merge two incoming streams into a single stream of merged events. A command parser 1700 is configured to receive command data for the module 914 (preferably by way of firmware socket module 404) and configure module 914 such that it operates as desired (e.g., instructions that identify how the streams are to be merged (e.g., what join keys are to be used). Each incoming stream is buffered in a record queue 1702, and the queued records are processed by record merge logic 1704 to produce an output stream of merged records. Preferably, a record identifier is used as the join key, and there is preferably a one-to-one mapping of records coming into the record merge logic 1704 and records coming out of the record merge logic 1704. For example, it may be the case that different fields of a particular record was processed in both of the rule condition checking paths of pipeline 900 such that each path made enhancements to that record. The record merge logic 1704 for module $914_1$ shown in FIG. 9 will then operate to merge the enhancements from the two instances of the record in the two record queues 1702 to output a single instance of the record in the output stream (wherein the output record contains the enhancements from both paths). FIG. 17(b) illustrates an exemplary operation in this regard, where two streams with different fields of the same record are present in queues 1702. Each field identifier FDL will impart meaning as to how the fields are to be ordered within the merged output record 1720. A field identifier will be retrieved from the queues 1702 at 1710. A comparator 1712 will then look at these field identifiers to identifier an order for them. The field identifier with the highest order will be appended at 1714 to record 1720 while the field identifier with the lowest order will be retained for comparison with the next field identifier from the other stream. In this manner, record merge logic 1704 will ensure that the fields in the output record possess the appropriate order.

While record join module $914_1$ receives input streams from the two rule condition checking paths of pipeline 900, record join module $914_2$ will receive as input streams the merged stream output by module $914_1$ and the original partitioned event stream 752 produced by module 750 (by way of bypass path 810). Thus, the record merge logic 1704 of module $914_2$ will operate to merge the enhanced records into the original partitioned event stream 752.

Figure 18:
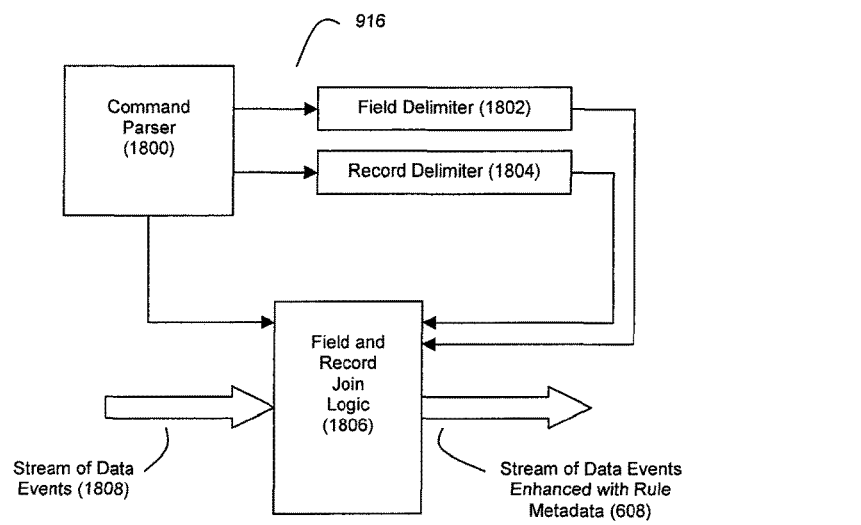
FIG. 18 depicts an exemplary record and field delimiter insertion module for the pipeline of FIG. 9.

FIG. 18 depicts an exemplary embodiment for a record and field delimiter insertion module 916. Module 916 operates to receive the stream 1808 of enhanced records produced by the second record join module $914_2$ and reformat the RDLs and FDLs as needed for the records to be processed by any downstream applications. This reformatting may take the form of returning the records to their format upon entry into pipeline 900 as stream 600, formatting the RDLs and FDLs to a new format expected by downstream applications, or some combination of the two to thereby produce the output stream 608 of enhanced data events. It should also be noted that the enhancement fields 820 within stream 1808 may need to be partitioned into records and/or fields in a manner that will be understood by downstream applications. As can be seen from FIG. 18, the exemplary embodiment for module 916 preferably shares the same architecture (a command parser 1800, field and record delimiter tables 1802 and 804) and logic 1806) as the previously described record and field identifier module 750.

The enhanced records within 608 can then be streamed out of coprocessor 450 and returned to software running on the host system (e.g., software running on processor 412) or elsewhere within an enterprise computing system where post-processing in an action engine based on the enhancements can occur (if necessary) and the records can be inserted into an appropriately selected location in a relational database, saved to file, etc. within the enterprise computing system. It should also be noted that the stream 608 can be passed to additional modules within coprocessor 450 for post processing if desired.

It should be noted that pipeline 900 is also only exemplary in nature as different arrangements of paths and modules can be configured to meet a particular rule set. For example, it may be desirable to also employ a secondary matching module 906 in the exact/approximate word matching path.

Figure 19A:
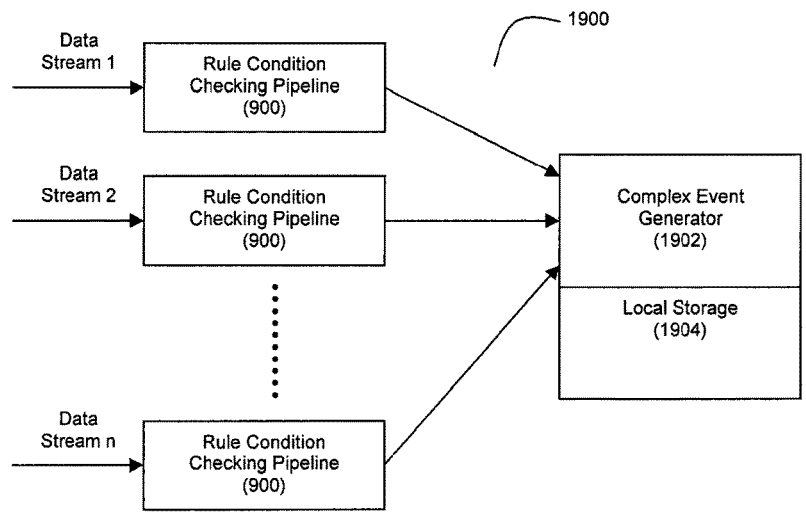
FIG. 19(a) depicts an exemplary embodiment for a complex event stream processor appliance.

It may also be desirable to process event streams against rule conditions that require consideration of multiple events, a process known as complex event processing (CEP). FIG. 19(a) depicts an exemplary complex event processing system 1900. Multiple streams of data are handled by individual rule condition checking pipelines 900 which serve as event stream processors for individual events. The output of each individual pipeline 900 is then passed to a complex event generator 1902. Complex event generator 1902, which is also preferably implemented in firmware on coprocessor 450, is preferably configured to aggregate the multiple enhanced streams that it receives and check for satisfaction of rule conditions across multiple events. Local storage 1904 is provided within system 1900 so that the complex event generator 1902 can examine a history of received events when checking for satisfaction of rule conditions which span multiple events. Preferably, upon detecting a pattern across multiple events that satisfies a particular rule condition, complex event generator 1902 is configured to insert a new event into the stream, wherein this new event indicates the existence of the detected pattern.

Figure 19B:
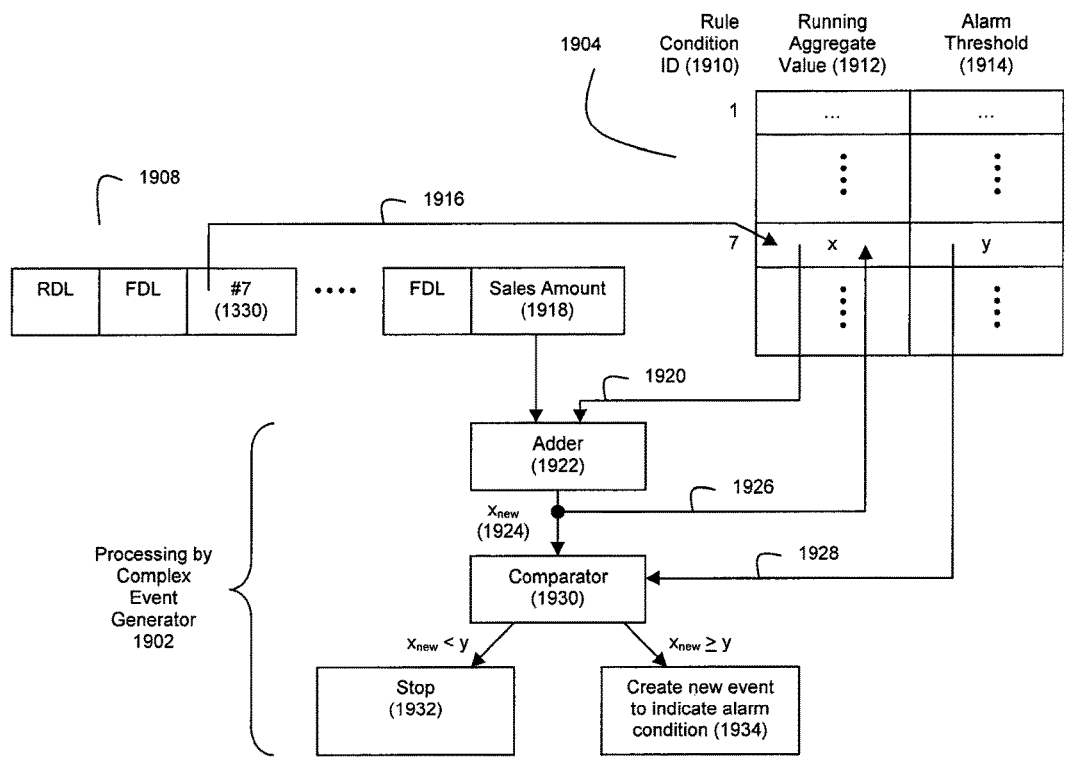
FIG. 19(b) depicts an exemplary mode of operation for a complex event generator such as that of FIG. 19(a)

FIG. 19(b) depicts an example of a task which could be performed by a complex event generator 1902. In this example a threshold check operation is performed, namely, an enterprise would like to know when an aggregate sales amount for a particular item corresponding to rule condition #7 (as determined by the processing performed by pipelines 900) exceeds a threshold amount. Such a task requires an aggregation of multiple events (i.e., sales transaction records for that item). Local storage 1904 preferably includes a table which tracks an aggregate value 1912 and corresponding alarm threshold 1914 for a plurality of items, with each item being determinable from a corresponding rule condition identifier 1910. Thus, pipelines 900 can be thought of as scanning the event streams for sales transactions with an item number field equal to a particular serial number to determine which rule condition will be applicable (e.g., If "Item Number=ABCD123", then "Flag the Record as Satisfying Rule Condition #1", If "Item Number=EFGH456", then "Flag the Record as Satisfying Rule Condition #2", and so on). The table in storage 1904 preferably indexes the running aggregate value 1912 and alarm threshold 1914 pair by rule condition identifier 1910, as shown in FIG. 19(b).

Thus, as an enhanced record 1908 is received by the complex event generator 1902, a lookup 1916 can be performed in the table using the rule condition identifier 1330 in record 1908 to retrieve the running aggregate value x and alarm threshold y for that rule condition identifier (see retrievals 1920 and 1928 in FIG. 19(b)). Then an adder 1922 can sum the sales amount 1918 found in record 1908 with the current running aggregate value x to thereby compute new running aggregate value $x_{new}$ 1924. At step 1926, this $x_{new}$ can be written back to the table to reflect the latest sales transaction. Also, a comparator 1930 can make a comparison between the computed $x_{new}$ value and the retrieved alarm threshold y. If $x_{new} < y$, then no action needs to be taken (see stop step 1932 of FIG. 19(b)). If $x_{new} \geq y$, then step 1934 operates to create a new event for insertion into the stream which indicates the existence of the alarm condition.

It should be understood that such aggregation processing could also be performed within a pipeline such as pipeline 900 if an appropriate aggregation module is located downstream from a matching module. It should also be understood that the aggregation processing shown by FIG. 19(b) is exemplary only and any of a number of types of aggregation processing could be performed by complex event generator 1902.

Figure 20:
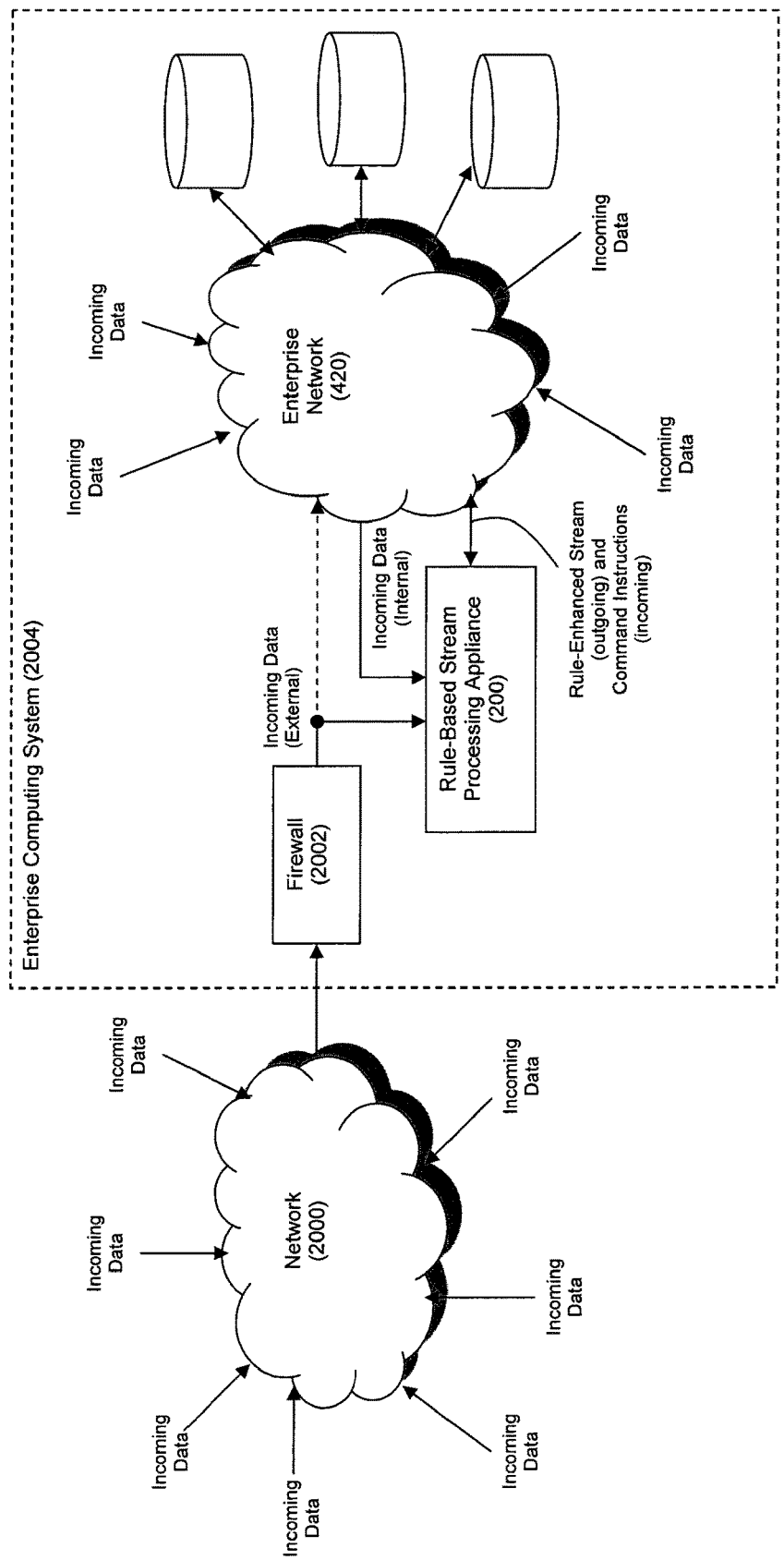
FIG. 20 depicts an exemplary environment in which an event stream processing appliance can be employed to provide business rule processing for an enterprise.

FIG. 20 depicts an exemplary environment in which a rule-based stream processing appliance 200 can be effectively employed. Appliance 200 can be configured as a business rules engine, an event stream processor, or a complex event stream processor as desired. FIG. 20 depicts an enterprise computing system 2004 that receives a large volume of incoming data from the a network 2000 (such as the Internet or other data communication networks including PSTN, T1 lines, WANs, LANs, VPNs, and the like). After this incoming data passes enterprise firewall 2002, it can be streamed through appliance 200 which receives the firewall output as an input data stream. Optionally the firewall output can also be passed directly to enterprise network 420 without passing through appliance 200 such that both appliance 200 and enterprise network 420 receive the firewall output.

Appliance 200 can thus be used to generate rule condition check results (and optionally additional secondary actions) for the incoming data stream as that data reaches the enterprise and before it lands in data storage somewhere within enterprise network 420. The data processed by appliance 200 can also include data originating from within the enterprise computing system 2004. Furthermore, appliance 200 can optionally be configured to output its generated rule condition results for delivery (or make its generated rule condition results available) to other processing entities within enterprise network 420 where rule-based post-processing can occur (such as taking one or more actions based on which rule conditions are shown to be satisfied within the enhanced stream produced by appliance 200). Further still, one or more terminals within enterprise network 420 can be configured to interface with appliance 200 to define the rule conditions and modules to be deployed in appliance 200.

Figure 21A:
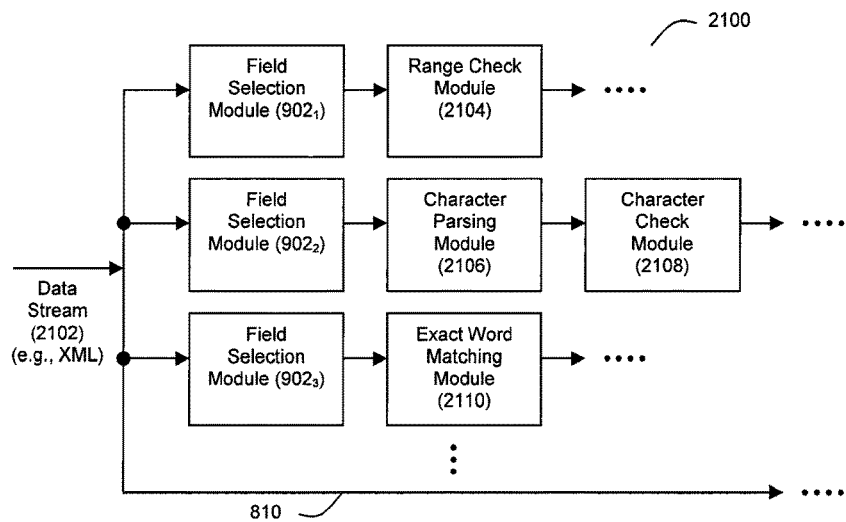
FIG. 21(a) depicts an exemplary event stream processing pipeline configured for data quality checking.

Accelerated stream processing in accordance with the embodiments of the present invention provides a myriad of beneficial uses. For example, one area where the inventors believe that a great need exists for low latency event stream processing is data quality checking and data integration. FIG. 21(a) depicts an exemplary pipeline 2100 which is configured to check data quality for a plurality of fields within a data stream 2102 (such as an XML data stream). Pipeline 2100 is preferably deployed on a coprocessor 450 in firmware. Each path's field selection module 910 can be configured to strip out fields within each record that are not relevant to that path's data quality checking task.

The first path of pipeline 2100 is configured to perform a range check operation on data fields within stream 2102 for which a rule exists that requires the data value for those fields to fall within specified ranges. Thus, field selection module $902_1$ is preferably configured to only pass fields within stream which have range constraints. Downstream from module $902_1$ is a range check module 2104. If range check module 2104 detects that a particular field's data value is outside of the range specified for that field by a rule condition, then range check module 2104 preferably produces a rule condition check result indicative of this error condition. In this way, the record with the invalid data range can be passed to an exception handling routine before being loaded into storage such as a database or the like.

Figure 21B:
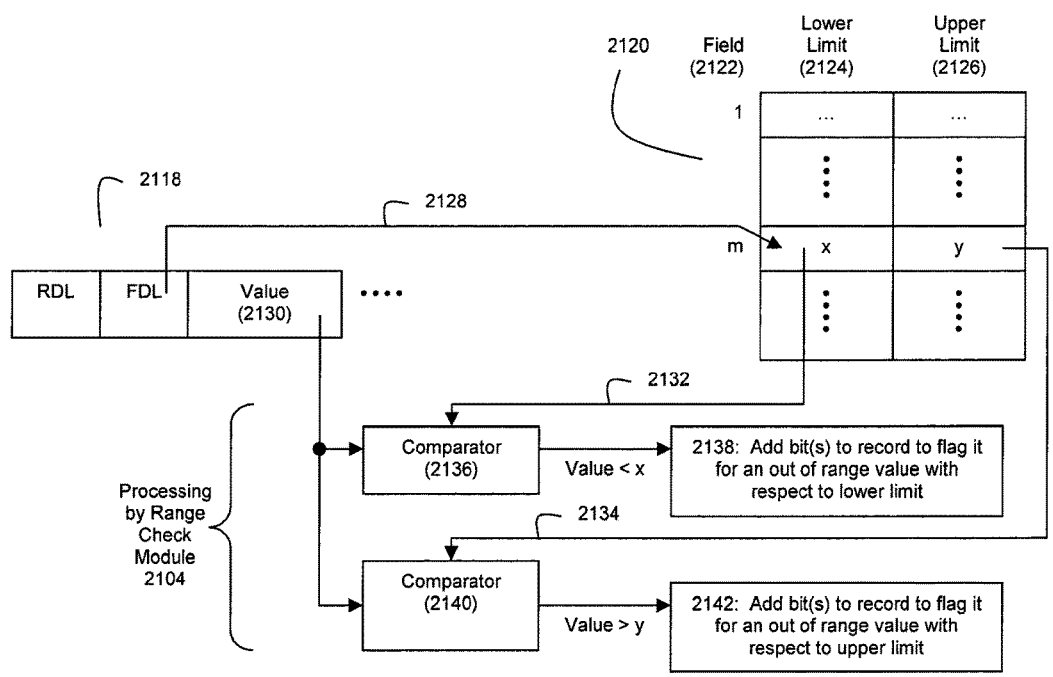
FIG. 21(b) depicts an exemplary mode of operation for a range check module within the pipeline of FIG. 21(a)

FIG. 21(b) depicts an exemplary mode of operation for the range check module 2104 of FIG. 21(a). Module 2104 preferably maintains (or has access to) a data table 2120. Data table 2120 stores a plurality of pairs of lower limits 2124 and upper limits 2126 indexed by a value 2122 corresponding to a field within stream 2102. Table 2120 can be populated with appropriate range limits for each field based on data quality rules for each field. As module 2104 receives a record 2118, module 2104 performs a lookup 2128 in table 2120 to retrieve the lower/upper limit pair indexed by a field identifier for that record's pertinent field. A comparator 2136 then compares value 2130 with the retrieved lower limit 2132. If value 2130 is less than the retrieved lower limit 2132, then module 2104 operates to add one or more bits to record 2118 to flag that record for an out of range value with respect to the pertinent field's lower limit. Preferably concurrently with the comparison performed by comparator 2136, comparator 2140 compares value 2130 with the retrieved upper limit 2134. If value 2130 is greater than the retrieved upper limit 2134, then module 2104 operates to add one or more bits to record 2118 to flag that record for an out of range value with respect to the pertinent field's upper limit. It should also be noted that an indirection table can be used by module 2104 to indirectly map a field identifier to entries in table 2120, thereby allowing the entries in table 2120 to be indexed in consecutive addresses.

The second path of pipeline 2100 is configured to perform a character check on those data fields within stream 2102 for which the characters must fall within a particular character set (e.g., the characters must be a number, must be a letter, must be a member of the ASCII character set, etc.). Thus, field selection module $902_2$ is preferably configured to only pass fields within stream which have a particular character set constraint. Downstream from module $902_2$ is a character parsing module 2106. Character parsing module 2106 operates to separate the characters within the select data fields. Character parsing module 2106 preferably operates in the manner of word parsing module 908 albeit for characters rather than words. Thereafter, character check module 2108 operates to determine if any character within the select field is not a member of the defined character set for that field. If module 2108 detects that a particular character value is not a member of a character set for that field as defined by a rule condition, then module 2108 preferably produces a rule condition check result indicative of this error condition. In this way, the record with the invalid character can be passed to an exception handling routine before being loaded into storage such as a database or the like. Module 2108 preferably operates using an exact matching module such as one based on the technology described above in connection with matching module 602.

The third path of pipeline 2100 is configured to perform a value check on those data fields within stream 2102 for which the value must be a member of a limited set of possible values (e.g., a "color" field which must take one value that is a member of the set {red, blue, green, white, black}). Thus, field selection module $902_3$ is preferably configured to only pass fields within stream which have a particular member set constraint (e.g., only the "color" fields of records within stream 2102 are passed by module $902_3$). Downstream from module $902_3$ is an exact word matching module 2110 that is keyed with the members of the pertinent member set (e.g., the keys are {red, blue, green, white, black}). If word matching module 2110 determines that the field value is not a member of the member set defined by the rule condition, then module 2110 preferably produces a rule condition check result indicative of this error condition. In this way, the record with the invalid field value can be passed to an exception handling routine before being loaded into storage such as a database or the like. Module 2110 preferably operates using an exact matching module such as one based on the technology described above in connection with matching module 602.

It should be noted that modules 2104, 2108, and/or 2110 can also be configured to generate one or more new events to indicate these error conditions rather than augmenting each of the affected records themselves.

Pipeline 2100 can be advantageously used in a data integration system such as an extract, transfer, load (ETL) system to provide an efficient means for ensuring that only quality data gets loaded into an enterprise's database(s). It should be understood that other data quality checking operations can be performed by a pipeline such as pipeline 2100 in a data integration system. For example, an additional data quality checking operation can be performed to identify whether data within select fields are properly formatted (e.g., ensuring that a bit length for a select field satisfies a rule condition, ensuring that a data value for a select field is right or left justified as required by a rule condition, etc.).

Figure 22:
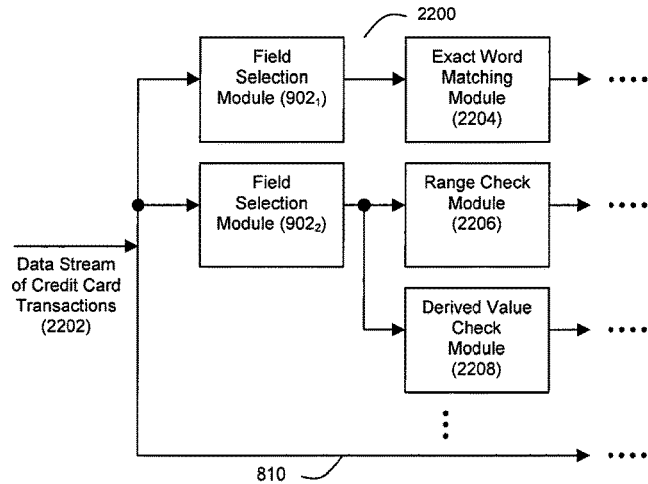
FIG. 22 depicts an exemplary event stream processing pipeline configured to process incoming credit card transaction records.

Another area where the inventors believe that a great need exists for low latency event stream processing with respect to business rules is the processing of high volumes of transactions such as credit card transactions. FIG. 22 depicts an exemplary pipeline 2200 which is configured to process a high volume data stream 2202 of credit card transactions. Pipeline 2200 is preferably deployed on a coprocessor 450 in firmware. Each path's field selection module 902 can be configured to strip out fields within each credit card transaction record that are not relevant to that path's rule-based processing task.

The first path of pipeline 2200 is configured to check each transaction record for a valid credit card number. Thus, field selection module $902_1$ is preferably configured to pass only the credit card number field of each record. An exact word matching module 2204 is configured with the set of valid credit card numbers as keys. Thus, if the credit card number within the credit card number field of a record within stream 2202 is valid, then module 2204 will find a hit on one of its stored keys. If a hit is not found on one of the stored keys, then one or more bits can be added to the pertinent record to indicate the error condition. Based on this error condition, an enterprise can be timely informed of the attempted use of an invalid credit card number and can decline authorization for the transaction.

The second path of pipeline 2200 is configured to provide security based on a range check for the purchase amounts in credit card transaction records. In many instances of credit card fraud, the perpetrator will attempt to test the validity of a stolen card number by first seeing if he/she can obtain a approval for a very small transaction with the stolen card number. If approved, the perpetrator later attempts a much larger purchase. Another risk posed with respect to credit card fraud is where the perpetrator attempts to purchase extremely expensive items with the stolen card number. While a large purchase amount itself may not necessarily indicate a credit card number is being fraudulently used, a cardholder or credit card company may nevertheless want to be timely informed when large purchases are made. To provide low latency warnings regarding such low value and high value credit card transactions, the second path of pipeline 2200 employs a range check module 2206 that operates in a manner similar to that described in connection with FIG. 21(b). Field selection module $902_2$ preferably operates to strip out fields from credit card transaction records so that only the fields pertinent to the range check remain (for example, the fields that identify a credit card number and purchase amount). Thereafter, range check module 2206 operates to generate a rule condition check result indicative of the security risk anomaly if a record's purchase amount is less than a lower alarm limit or higher than an upper alarm limit.

Figure 23:
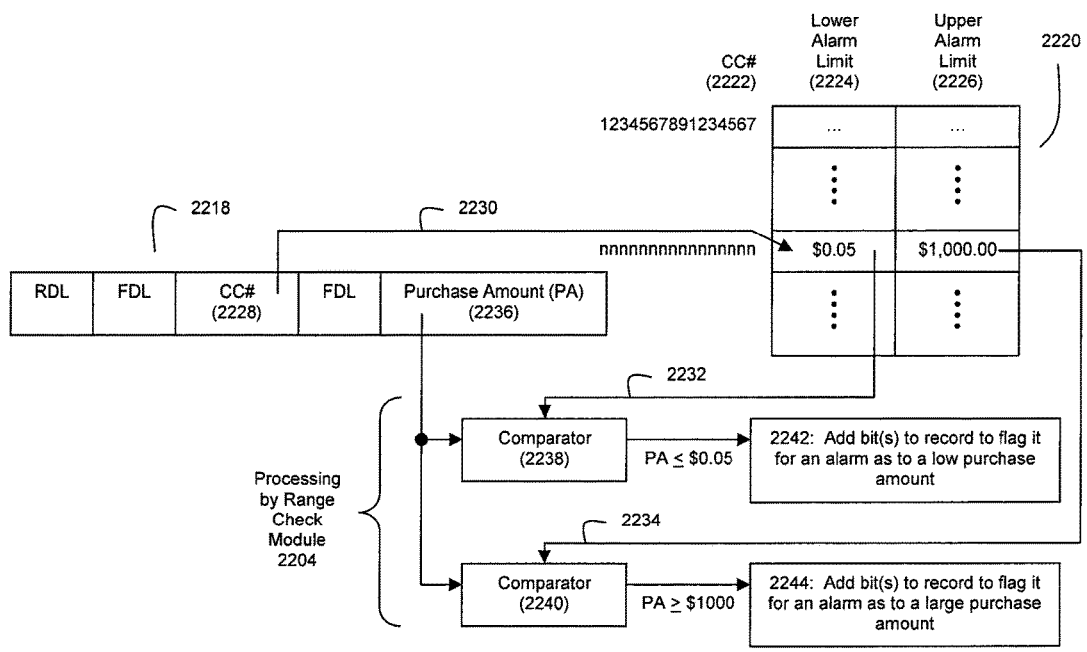
FIG. 23 depicts an exemplary mode of operation for a range check module within the pipeline of FIG. 22.

FIG. 23 depicts an exemplary mode of operation for range check module 2206. Range check module 2206 maintains or has access to data table 2220. Table 2220 preferably stores a lower alarm limit 2224 and upper alarm limit 2226 as pairs that are indexed by a value such as credit card number 2222. When the pertinent fields of a credit card transaction record 2218 are processed by module 2206, a lookup 2230 is performed in table 2220 using the credit card number 2228 within the record to thereby retrieve the pertinent lower alarm limit 2232 and the pertinent upper alarm limit 2234. A comparator 2238 performs a comparison operation between the record's purchase amount 2236 and the retrieved lower alarm limit 2232. If the purchase amount is less than or equal to the retrieved lower alarm limit, the module 2206 operates to add one or more bits to the pertinent record to flag it for an alarm as to the low purchase amount (step 2242). Concurrently with the operation of comparator 2238, comparator 2240 performs a comparison operation between the record's purchase amount 2236 and the retrieved upper alarm limit 2244. If the purchase amount is greater than or equal to the retrieved upper alarm limit, the module 2206 operates to add one or more bits to the pertinent record to flag it for an alarm as to the large purchase amount (step 2244). Such rule condition check results as provided at 2242 and 2244 allows a credit card company to make timely decisions such as denying the transaction, putting a hold on any further transactions with that credit card number, and contacting the card holder to inquire about the purchase.

The alarm limits present in table 2220 can be defined for each credit card number by a credit card company based on their knowledge in the industry or even defined by credit card holders themselves. Appropriate command instructions (received by pipeline 2200 by way of firmware socket module 404) can be used to populate table 2220 with appropriate values. It should be noted that a credit card company may optionally choose to use the same alarm limits for all credit card numbers, in which case the credit card number-based lookup into table 2220 would not be needed, and field selection module $902_2$ can be configured to also strip out the credit card number field from each record. It should also be noted that an indirection table can be used by module 2206 to indirectly map each credit card number to entries in table 2220, thereby allowing the entries in table 2220 to be indexed in consecutive addresses. Such an indirection table could be particularly useful if a credit card company chose to associate alarm limits with sets of credit card numbers rather than each credit card number individually. It should further be noted that modules 2204, 2206, and/or 2208 can also be configured to generate one or more new events to indicate these security risk conditions rather than augmenting each of the affected records themselves.

The third path of pipeline 2200 is configured to provide security based on rule condition checks for various derived values generated from the credit card transaction records. Module 2208 can be configured to compute any of a number of derived values that may be relevant to security issues. For example, an unusually large purchase amount may be a cause for alarm. However, statistical processing is needed to keep track of values such as the historic average purchase amount for a credit card number and the current month's average purchase amount for a credit card number and to make decisions as to what qualifies as unusual purchasing activity. Another indicator for a security risk would be a sudden surge in the number of transactions over periods such as months, days, etc. To be timely warned of such potentially problematic situations, low latency aggregation and derived value computations are needed within pipeline 2200. A derived value check module 2208 can provide such functionality.

Figure 24A:
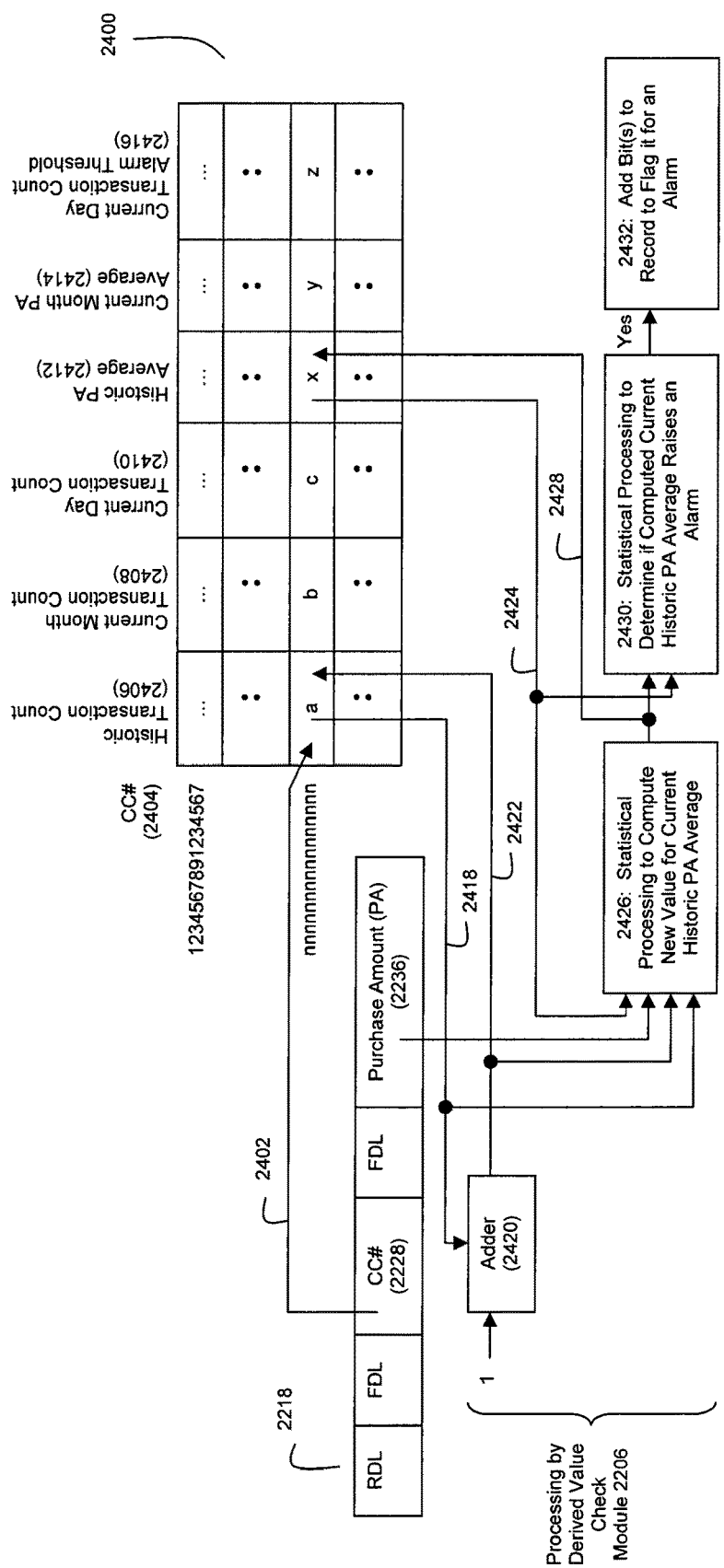
FIGS. 24(a)-(c) depict an exemplary mode of operation for a derived value check module within the pipeline of FIG. 22.
Figure 24B:
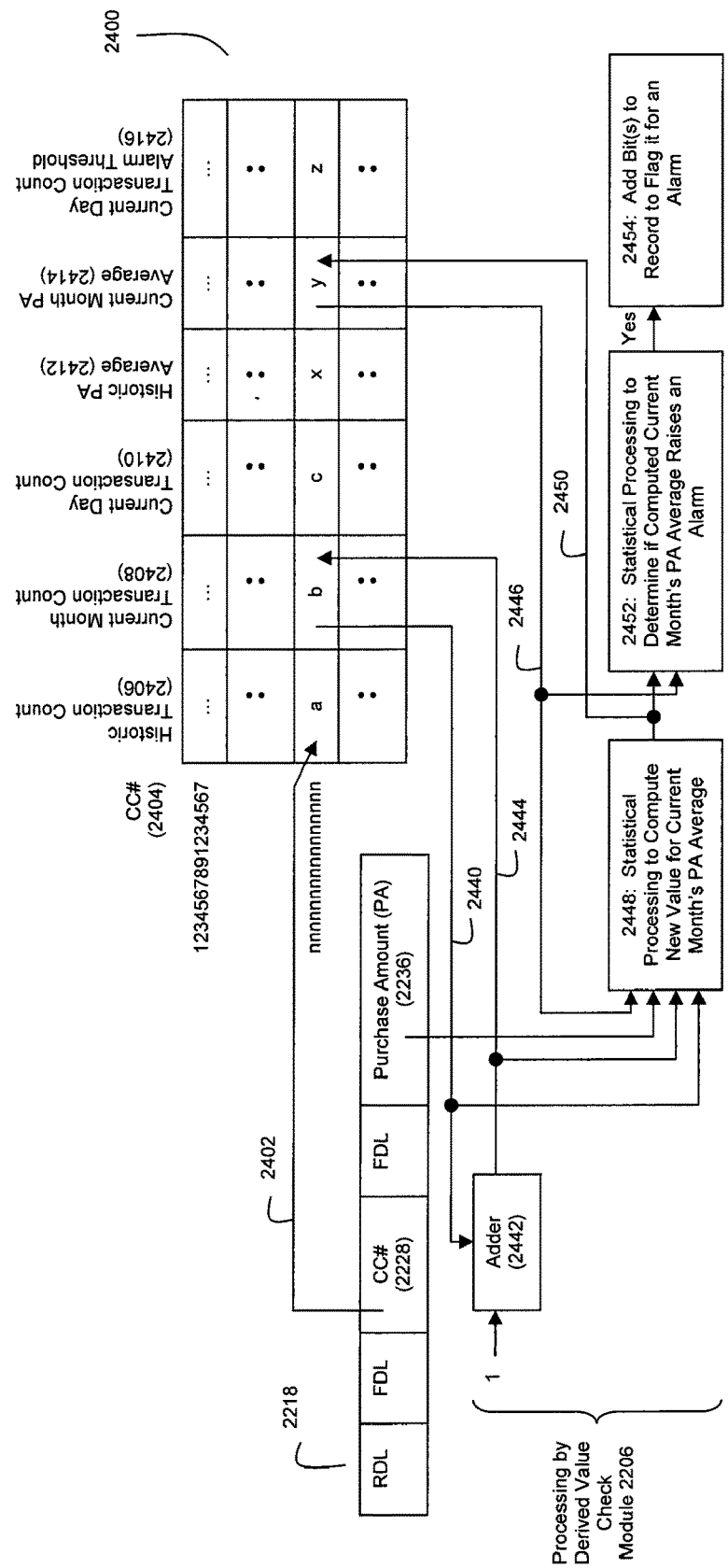
Figure 24C:
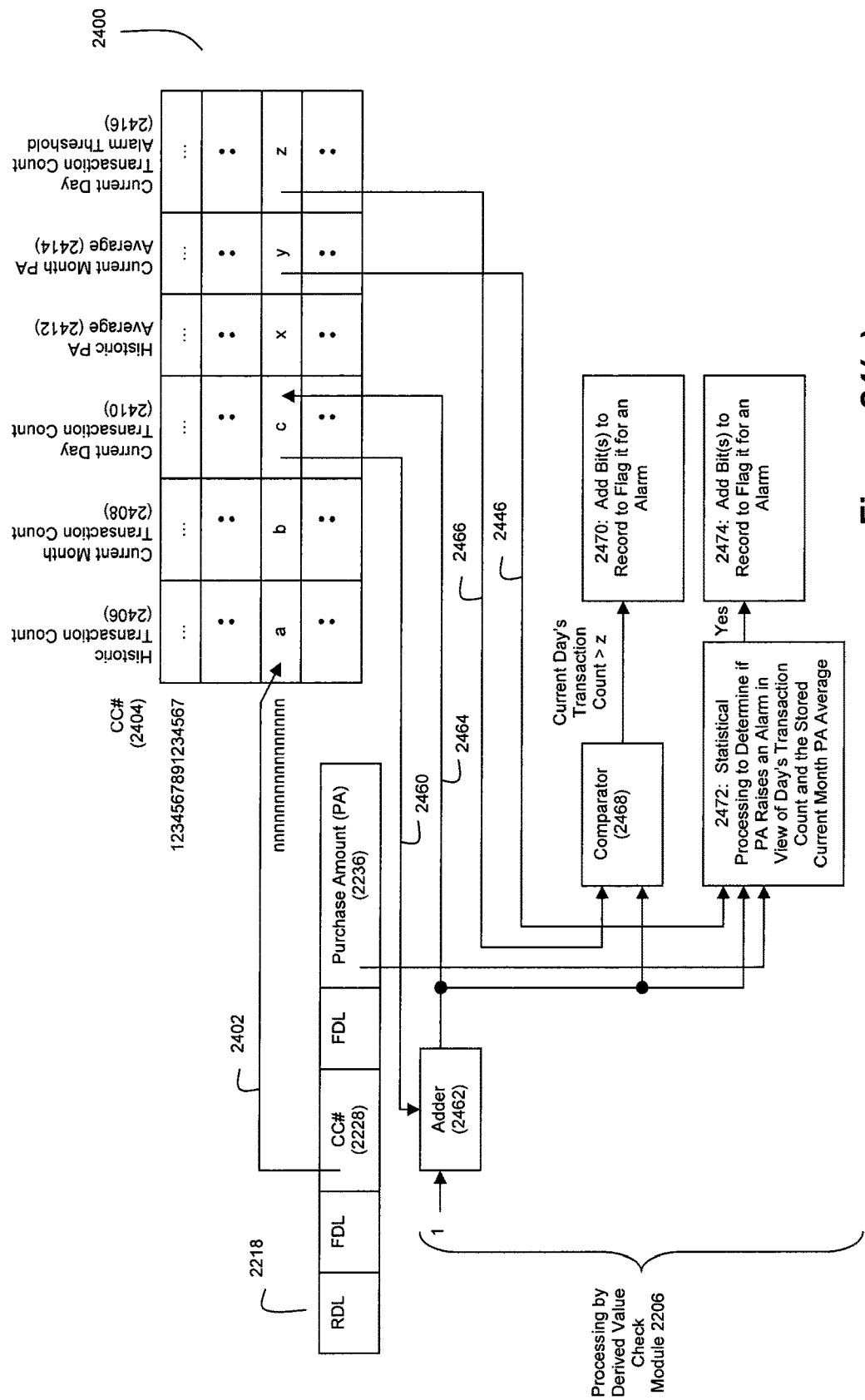

FIGS. 24(a)-(c) depict an exemplary mode of operation for a derived value check module 2208. Module 2208 preferably maintains or has access to data table 2400. Table 2400 preferably stores a plurality of values which are indexed by a value such as credit card number 2404. Examples of values which can be stored in table 2400 in association with each credit card number are a historic transaction count 2406 (which is representative of the total number of purchases made with a credit card number since that credit card number's inception), a current month transaction count 2408 (which is representative of the total number of purchases made with a credit card number over the course of the current month), a current day transaction count 2410 (which is representative of the total number of purchases made with a credit card number over the course of the current day), a historic average purchase amount 2412 (which is representative of the average purchase amount for a single transaction with a credit card number since that credit card number's inception), a current month average purchase amount 2414 (which is representative of the average purchase amount for a single transaction with a credit card number over the course of the current month), and a current day transaction count alarm threshold 2416 (which is representative of the number of transactions for a credit card number which, if reached in a single day, will set of an alarm to warn of potentially fraudulent activity). It should be readily understood that more or fewer values could be stored by table 2400.

As shown in FIG. 24(a), as module 2208 receives a record 2218, a lookup 2402 can be performed in table 2400 to retrieve the pertinent stored values associated with the record's credit card number 2228. Upon retrieval of the historic transaction count 2418 pertinent to record 2218, an adder 2420 operates to increment that historic transaction count to a new value 2422 which is then written back to table 2400 to update the card number's historic transaction count value. Thereafter, at step 2426, module 2208 operates to perform a statistical operation such as computing a new value for the historic average purchase amount. To do so, the historic gross purchase amount can be computed by multiplying the retrieved historic transaction count 2418 by the retrieved historic average purchase amount 2424. Thereafter, the current record's purchase amount 2236 can be added to the historic gross purchase amount and then divided by the new historic transaction count 2422 to arrive at the new value 2428 for the historic average purchase amount. This value 2428 can then be written back to table 2400. Thereafter, at step 2430, statistical processing can be performed to determine if the new historic average purchase amount 2428 exceeds some frame of reference with respect to the old historic average purchase amount 2424. For example, an increase in value that exceeds some frame of reference may cause module 2208 to add one or more bits to the record 2218 to flag it for an alarm (step 2432).

As shown in FIG. 24(b), similar processing as that shown in FIG. 24(a) can be performed by module 2208 with respect to monthly numbers. Thus, adder 2442 operates to increment the current month's transaction count 2440 to a new value 2444 which is then written back to table 2400 to update the card number's current month transaction count value. Thereafter, at step 2448, module 2208 operates to perform a statistical operation such as computing a new value for the current month's average purchase amount. To do so, the current month's gross purchase amount can be computed by multiplying the retrieved current month's transaction count 2440 by the retrieved current month's average purchase amount 2446. Thereafter, the current record's purchase amount 2236 can be added to the current month's gross purchase amount and then divided by the new current month's transaction count 244 to arrive at the new value 2450 for the current month's average purchase amount. This value 2450 can then be written back to table 2400. Thereafter, at step 2452, statistical processing can be performed to determine if the new current month's average purchase amount 2450 exceeds some frame of reference with respect to the old current month average purchase amount 2446. For example, an increase in value that exceeds some frame of reference may cause module 2208 to add one or more bits to the record 2218 to flag it for an alarm (step 2454).

FIG. 24(c) depicts a mode of operation for module 2208 with respect to daily numbers. Adder 2462 operates to compute a new value 2464 for the current day's transaction count using the retrieved current day's transaction count 2460. The new value 2464 is written back to table 2400. One security test for module 2208 is to see if the current day's transaction count has exceeded an alarm threshold. To do so, comparator 2468 performs a comparison operation between the new current day transaction count 2464 and the retrieved current day transaction count alarm threshold 2466. If the current day's transaction count 2464 exceeds this threshold, then module 2208 operates to add one or more bits to the record 2218 to flag it for an alarm (step 2470). Also, simultaneously with comparator 2468, the module 2208 can perform a statistical operation at step 2472 using data such as the new current day transaction count value 2464, the retrieved current month average purchase amount 2446, and the record's purchase amount 2236 to determine whether an alarm should be raised. If so, at step 2474, module 2208 operates to add one or more bits to the record 2218 to flag it for an alarm.

It should be noted that the types of operations performed by module 2208 with respect to FIGS. 24(a)-(c) are exemplary only, as a derived value check module 2208 can be configured to compute any of a number of derived values for rule condition checking. For example, the balance limits for a credit card number can be computed and tracked using module 2208 as transactions corresponding to new purchases stream in, together with the generation of attendant rule condition check results using balance-based rule conditions.

Appropriate command instructions (received by pipeline 2200 by way of firmware socket module 404) can be used to populate table 2400 with appropriate values for values such as threshold 2416. It should be noted that an indirection table can be used by module 2208 to indirectly map each credit card number to entries in table 2400, thereby allowing the entries in table 2400 to be indexed in consecutive addresses.

Another area where the inventors believe that low latency event stream processing can provide significant advantages is with respect to the routing and secure storage of information such as social security numbers and credit card numbers within an enterprise. In many instances, an enterprise may choose (or may be required by law) to handle sensitive personal information in a more secure manner than other forms of enterprise data. Examples of such information which warrants specialized handling include social security numbers and credit card numbers. Such data may need to be specially encrypted and/or stored in particular databases. To comply with such requirements, it is desirable for an event stream processing appliance 200 to implement business rules which identify those incoming data events which contain such specialized information and then ensure that those data events are properly handled and routed within the enterprise computing system. Thus, a coprocessor within appliance 200 can employ a regular expression pattern matching module to detect which incoming data events contain patterns indicative of a social security number (e.g., nnn-nn-nnnn), a credit card number (e.g., nnnn-nnnn-nnnn-nnnn), and the like. Upon detection of such patterns in the incoming data events, those data events can be flagged with rule condition check results for special handling, which may include encryption and/or storage in particular databases. Based on such enhancements within the data events, other components within enterprise computing system can ensure that the sensitive data events are routed to appropriate handling routines.

Yet another area where the inventors believe that low latency event stream processing can provide significant advantages is enterprise protection of trade secrets. In such an instance, an enterprise may wish to employ appliance 200 of FIG. 20 to also monitor outgoing data that is to be communicated outside the enterprise firewall to destinations within network 2000. Thus, a coprocessor within appliance 200 can scan outgoing data streams for the presence of data which matches bit strings corresponding to an enterprise's trade secrets. For example, if an enterprise maintains a valuable trade secret for "Formula X", it can program appliance 200 with a rule that essentially declares: "if "Formula X" is present within an outgoing data event, then block transmission of that data event until released by a person with appropriate authority." A matching module within the coprocessor can then detect whether "Formula X" is present in an outgoing data event. Upon detecting the presence of "Formula X" in the outgoing data event, the coprocessor can re-direct the outgoing event to a holding queue from which it will only be released in the event of approval by a person with appropriate authority. The matching module for this trade secret protection functionality can be programmed with a number of keys that are indicative of an enterprise's trade secrets (e.g., chemical formulae, customer lists, sales numbers, etc.) such that all outgoing data events are inspected to assess whether a trade secret will be potentially released.

Additional areas where the inventors believe that low latency event stream processing based on business rules would be helpful include the acceleration of XML payloads, streaming SQL, the processing of financial market feeds to provide functions such as financial risk management, processing high volume transactional data other than credit card transactions (e.g., general sales transactions, telephone call records, etc.), security incident monitoring and prevention, the collecting of auditing data for compliance monitoring, applications needing low latency aggregation and statistical computations, monitoring sensor data streams (e.g., RFID), the monitoring of pharmaceutical sales records to detect potential "hot spots" where an epidemic may be breaking out, and the monitoring of sales transactions to identify where inventories need to be quickly replenished.

Figure 25A:
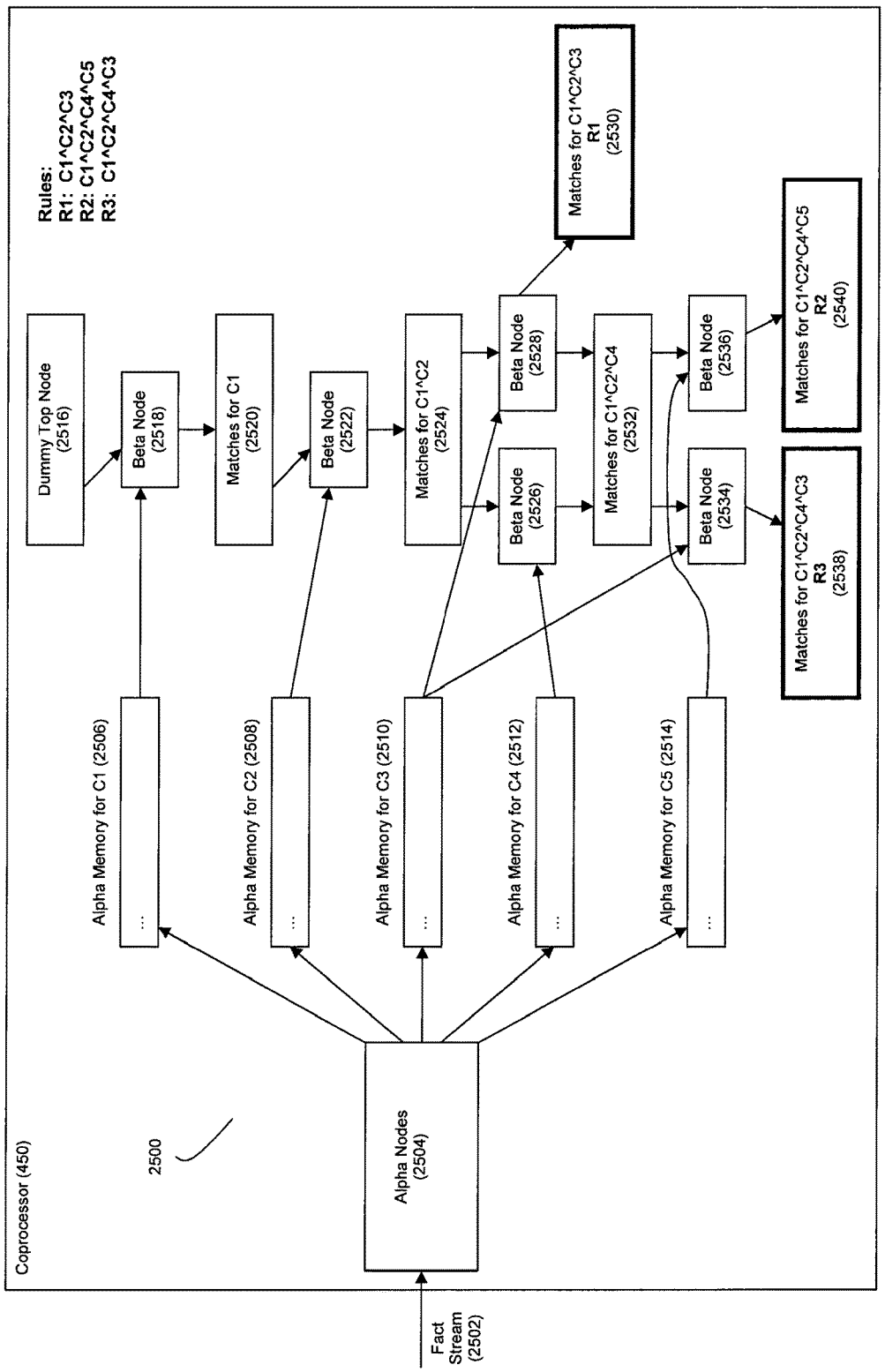
FIGS. 25(a) and (b) depict exemplary embodiments for a hardware-accelerated Rete network.
Figure 25B:
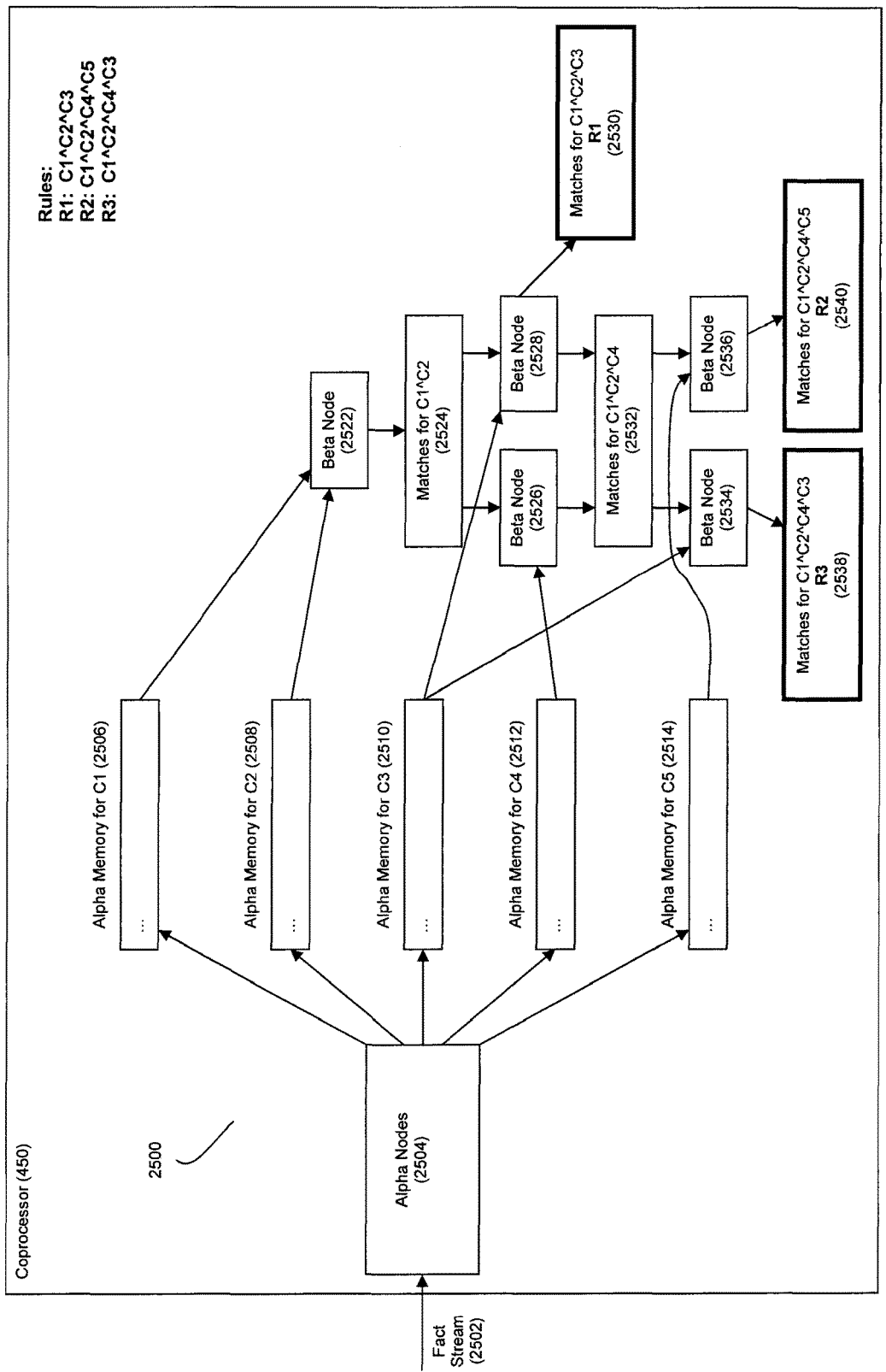

Another beneficial application for low latency event stream processing is the acceleration of a Rete network. FIGS. 25(a) and (b) depict an exemplary embodiment for a hardware-accelerated Rete network 2500. Preferably, the Rete network 2500 is deployed in whole or in part on coprocessor 450. The upper right hand corner of FIGS. 25(a) and (b) depict an exemplary rule set for Rete network 2500. In this example, rule R1 requires that rule conditions C1, C2, and C3 be satisfied, rule R2 requires that rule conditions C1, C2, C4, and C5 be satisfied, and rule R3 requires that rule conditions C1, C2, C4 and C3 be satisfied.

Alpha nodes 2504 receive an incoming fact stream and test these facts individually against the different rule conditions of the rules. The hardware-accelerated rule condition check operations described herein can be used by alpha nodes 2504 for this purpose (such as the matching operations, range check operations, threshold check operations, etc. as described above). Preferably, the alpha nodes 2504 are configured to perform these rule condition check operations for the different conditions on each fact in parallel with one another. Any facts which satisfy C1 are stored in alpha memory 2506. Any facts which satisfy C2 are stored in alpha memory 2508. Any facts which satisfy C3 are stored in alpha memory 2510. Any facts which satisfy C4 are stored in alpha memory 2512, and any facts which satisfy C5 are stored in alpha memory 2514. Preferably, these alpha memories are deployed in available memory space of the coprocessor 450. Furthermore, preferably the alpha nodes 2504 are deployed as firmware application modules in a processing pipeline of coprocessor 450.

Beta nodes within the Rete network then operate to check for whether any of the facts in the alpha memories satisfy the joinder of different rule conditions required by the rule set. Preferably, the beta nodes are also deployed on the coprocessor 450. Beta node 2518 reads facts out of alpha memory 2506 and compares those records with dummy data within a dummy top node to store any matching facts in beta memory 2520 corresponding to C1. Given that this is the topmost beta node in the network 2500, all facts within memory 2506 will be written to memory 2520. Thus, the Rete network 2500 can eliminate the dummy top node 2516, beta node 2518, and beta memory 2520 if desired.

Thereafter, beta node 2522 will read facts out of alpha memory 2508 and facts out of beta memory 2520 to find if any of the facts are overlapping. If so, these facts satisfy both C1 and C2, and the beta node 2522 writes these facts to beta memory 2524.

Next, beta node 2526 reads facts out of alpha memory 2512 and beta memory 2524 to find if any of the facts are overlapping. If so, these facts satisfy C1, C2, and C4 and the beta node 2526 writes these facts to beta memory 2532. In parallel with beta node 2526, beta node 2528 operates to read facts out of alpha memory 2510 and beta memory 2524 to find if any of the facts are overlapping. If so, these facts satisfy C1, C2, and C3, thereby meeting the requirements of rule R1. Beta node 2528 writes these R1-compliant facts to beta memory 2530. Thus, any facts (or combination of facts) present in memory 2530 are known to satisfy rule R1.

Next, beta node 2534 reads facts out of alpha memory 2510 and beta memory 2532 to find if any of the facts are overlapping. If so, these facts satisfy C1, C2, C4, and C3, thereby meeting the requirements of rule R3. Beta node 2534 writes these R3-compliant facts to beta memory 2538. In parallel with beta node 2538, beta node 2540 operates to read facts out of alpha memory 2514 and beta memory 2532 to find if any of the facts are overlapping. If so, these facts satisfy C1, C2, C4, and C5, thereby meeting the requirements of rule R2. Beta node 2536 writes these R2-compliant facts to beta memory 2540. Thus, any facts present in memory 2538 are known to satisfy rule R3 and any facts present in memory 2540 are known to satisfy R2.

Preferably, the beta nodes are also deployed in the coprocessor 450 (preferably as firmware application modules within the coprocessor's processing pipeline). Furthermore, the beta memories are also preferably deployed in available memory space of the coprocessor 450. Through hardware-acceleration of the alpha nodes and beta nodes in pipelined firmware application modules, the inventors believe that dramatic improvements in performance can be made for Rete networks.

While for the preferred embodiments disclosed herein the coprocessor 450 comprises a reconfigurable logic device 402 such as an FPGA, it should be noted that the coprocessor 450 can be realized using other processing devices. For example, the coprocessor 450 may comprise graphics processor units (GPUs), general purpose graphics processors, chip multi-processors (CMPs), dedicated memory devices, complex programmable logic devices, application specific integrated circuits (ASICs), and other I/O processing components. Moreover, it should be noted that appliance 200 may employ a plurality of coprocessors 450 in either or both of a sequential and a parallel multi-coprocessor architecture.

The modules described herein can be readily developed as firmware application modules by a practitioner of various embodiments of the invention using the techniques described in the above-referenced and incorporated U.S. Patent Application Publication 2006/0294059.

While the present invention has been described above in relation to its preferred embodiments, various modifications may be made thereto that still fall within the invention's scope. Such modifications to the invention will be recognizable upon review of the teachings herein. Accordingly, the full scope of the present invention is to be defined solely by the appended claims and their legal equivalents.

What is claimed is:

1. A stream processing method:
    streaming a plurality of data events through a member of the group consisting of (1) a reconfigurable logic device, (2) a graphics processor unit (GPU), and (3) a chip multi-processor (CMP), wherein the member includes a data processing pipeline, the pipeline including a plurality of parallel processing paths, the parallel processing paths including a first processing path and a second processing path in parallel with the first processing path;
    within the first processing path, the member (1) filtering the streaming data events to generate a first reduced stream of the data events, and (2) performing at least one processing operation on the first reduced event stream to generate a first plurality of results for association with the first reduced event stream, wherein the member performs the filtering step and the at least one processing operation within the first processing path in a pipelined manner such that the member performs the at least one processing operation on the first reduced event stream within the first processing path while simultaneously performing the filtering step within the first processing path on new streaming events;
    within the second processing path, the member (1) filtering the streaming data events to generate a second reduced stream of the data events, and (2) performing at least one processing operation on the second reduced event stream to generate a second plurality of results for association with the second reduced event stream, wherein the member performs the filtering step and the at least one processing operation within the second processing path in a pipelined manner such that the member performs the at least one processing operation on the second reduced event stream within the second processing path while simultaneously performing the filtering step within the second processing path on new streaming events; and the member performing the steps within the first processing path in parallel with the steps within the second processing path.

2. The method of claim 1 wherein the at least one processing operation within the first processing path comprises at least one of a matching operation, a range check operation, a character check operation, and a derived value check operation.

3. The method of claim 2 wherein the at least one processing operation within the second processing path comprises at least one of a matching operation, a range check operation, a character check operation, and a derived value check operation.

4. The method of claim 1 wherein the at least one processing operation in at least one of the parallel processing paths comprises a windowing operation that caches data from a plurality of events in a memory to support complex event processing within the pipeline.

5. The method of claim 4 wherein the at least one processing path that performs the windowing operation further performs a join operation downstream from the windowing operation to join a plurality of windows of streaming events according to a join key.

6. The method of claim 5 wherein the join key comprises an approximate join key.

7. The method of claim 1 further comprising the pipeline enriching the streaming events with the first and second plurality of results.

8. The method of claim 1 wherein the streaming events comprise a plurality of fields, and wherein the filtering steps comprise the member selecting which of the plurality of fields are to be included in the reduced event streams.

9. The method of claim 1 further comprising the pipeline performing a path merging operation downstream from the first and second parallel processing paths to merge data from the first and second parallel processing paths into a common stream.

10. The method of claim 1 wherein the first and second plurality of results comprise a plurality of rule condition checking results.

11. A method for processing a bit stream, the method comprising:
receiving a bit stream at a coprocessor;
the coprocessor processing at least a portion of the bit stream against at least one rule condition, wherein the processing step comprises:
performing a hardware-accelerated rule condition check operation on the bit stream portion that compares the bit stream portion with a plurality of rule conditions; and
in response to the performing step resulting in a finding that the bit stream portion satisfies at least one of the rule conditions, generating a rule condition check result that is indicative of a satisfaction of the at least one rule condition; and
enhancing the bit stream with at least one bit corresponding to the rule condition checking result.

12. The method of claim 11 wherein the hardware-accelerated rule condition check operation comprises a hardware-accelerated matching operation.

13. The method of claim 12 wherein the hardware-accelerated matching operation comprises a hardware-accelerated exact word matching operation.

14. The method of claim 12 wherein the hardware-accelerated matching operation comprises a hardware-accelerated approximate word matching operation.

15. The method of claim 12 wherein the hardware-accelerated matching operation comprises a hardware-accelerated regular expression pattern matching operation.

16. The method of claim 12 further comprising wherein the processing step further comprises:
filtering the received bit stream using the coprocessor to thereby provide a reduced bit stream for use by the performing step.

17. The method of claim 16 wherein the bit stream comprises a plurality of records, each record having at least one data field, the at least one data field having a data value, and wherein the filtering step comprises passing only data corresponding to at least one pre-selected data field to the performing step.

18. The method of claim 12 wherein the hardware-accelerated rule condition check operation comprises a hardware-accelerated range check operation.

19. The method of claim 12 wherein the hardware-accelerated rule condition check operation comprises a hardware-accelerated threshold check operation.

20. The method of claim 11 wherein the bit stream comprises a plurality of records, and wherein the enhancing step comprises generating a new record for insertion in the bit stream, the new record being indicative of the generated rule condition check result.

21. The method of claim 11 wherein the bit stream comprises a plurality of records, and wherein the enhancing step comprises appending a bit string indicative of the generated rule condition check result to the record for which the rule condition check result was generated.

22. The method of claim 11 further comprising:
passing the enhanced bit stream out of the coprocessor for post-processing that is based at least in part on the generated rule condition check result.

23. The method of claim 22 further comprising:
performing the post-processing, wherein the post-processing comprises routing at least a portion of the enhanced bit stream to a particular destination within a network based at least in part on the generated rule condition check result.

24. The method of claim 11 wherein the processing step further comprises delivering the received bit stream to a plurality of parallel paths, and wherein the processing step comprises independently performing the processing step within a plurality of the paths.

25. The method of claim 11 wherein the processing step further comprises:
computing an aggregate value based at least in part upon the bit stream portion;
determining whether a rule condition is satisfied based at least in part upon the computed aggregate value; and
in response to a determination that that rule condition is satisfied, generating a rule condition check result indicative of that rule condition's satisfaction.

26. The method of claim 11 wherein the processing step further comprises:
computing a derived value based at least in part upon the bit stream portion;
determining whether a rule condition is satisfied based at least in part upon the computed derived value; and
in response to a determination that that rule condition is satisfied, generating a rule condition check result indicative of that rule condition's satisfaction.

27. The method of claim 11 wherein the coprocessor comprises at least one of (1) a reconfigurable logic device, (2) a graphics processor unit (GPU), and (3) a chip multi-processor (CMP).

28. A method for processing a bit stream, the method comprising:
receiving a bit stream at a coprocessor;
the coprocessor processing at least a portion of the bit stream against at least one rule condition to thereby generate a rule condition checking result for the bit stream portion, the rule condition checking result being indicative of a rule condition being satisfied;
the coprocessor enhancing the bit stream with at least one bit corresponding to the rule condition checking result;
passing the enhanced bit stream out of the coprocessor for post-processing that is based at least in part on the generated rule condition check result; and
performing the post-processing, wherein the post-processing comprises (1) selecting a location within a network for storing at least a portion of the enhanced bit stream based at least in part on the generated rule condition check result and (2) storing that enhanced bit stream portion in the selected location.

29. The method of claim 28 wherein the coprocessor comprises at least one of (1) a reconfigurable logic device, (2) a graphics processor unit (GPU), and (3) a chip multiprocessor (CMP).

30. A method for processing a bit stream, the method comprising:
receiving a bit stream at a coprocessor, wherein the bit stream comprises a plurality of records, each record having at least one data field, the at least one data field having a data value; and
the coprocessor processing at least a portion of the bit stream against at least one rule condition to thereby generate a rule condition checking result for the bit stream portion, the rule condition checking result being indicative of a rule condition being satisfied; and
wherein the processing step further comprises (1) delivering the received bit stream to a plurality parallel paths, and (2) independently performing the processing step within a plurality of the paths, and wherein the independently performing step comprises:
within a first of the parallel paths, (1) filtering the bit stream to pass only data corresponding to at least one pre-selected data field, and (2) processing that passed data against at least one rule condition to thereby generate a rule condition check result for that passed data if that passed data satisfies that at least one rule condition; and
within a second of the parallel paths, (1) filtering the bit stream to pass only data corresponding to at least one pre-selected data field that is different than the at least one pre-selected data field of the first path, and (2) processing that passed data against at least one rule condition to thereby generate a rule condition check result for that passed data if that passed data satisfies that at least one rule condition.

31. The method of claim 30 further comprising merging data outputs for the plurality of parallel paths using the coprocessor.

32. The method of claim 31 further comprising delivering the received bit stream to the merging step via a bypass path, and wherein the merging step further comprises inserting the rule condition check result generated within the plurality of paths into the received bit stream at a plurality of locations.

33. The method of claim 30 wherein the coprocessor comprises at least one of (1) a reconfigurable logic device, (2) a graphics processor unit (GPU), and (3) a chip multiprocessor (CMP).

34. A method for processing a bit stream, the method comprising:
receiving a bit stream at a coprocessor; and
the coprocessor processing at least a portion of the bit stream against at least one rule condition to thereby generate a rule condition checking result for the bit stream portion, the rule condition checking result being indicative of a rule condition being satisfied, wherein the processing step comprises:
computing an aggregate value based at least in part upon the bit stream portion;
determining whether a rule condition is satisfied based at least in part upon the computed aggregate value; and
in response to a determination that that rule condition is satisfied, generating a rule condition check result indicative of that rule condition's satisfaction;
storing the aggregate value in a memory; and
retrieving the aggregate value from the memory as additional bit stream portions are processed by the processing step.

35. The method of claim 34 wherein the coprocessor comprises at least one of (1) a reconfigurable logic device, (2) a graphics processor unit (GPU), and (3) a chip multiprocessor (CMP).

36. A method for processing a bit stream, the method comprising:
receiving a bit stream at a coprocessor, wherein the bit stream comprises a plurality of records, each record having at least one data field, the at least one data field having a data value: and
the coprocessor processing at least a portion of the bit stream against at least one rule condition to thereby generate a rule condition checking result for the bit stream portion, the rule condition checking result being indicative of a rule condition being satisfied, and wherein the processing step comprises:
filtering the bit stream to pass only data corresponding to at least one pre-selected data field;
performing a range check on the each field of the passed data to determine whether the passed data has a data value within a range of acceptable values corresponding to at least one range-based rule condition; and
in response to a determination that that at least one range-based rule condition is satisfied, generating a rule condition check result indicative of that range-based rule condition's satisfaction.

37. The method of claim 36 further comprising:
enhancing the bit stream with at least one bit corresponding to the rule condition checking result.

38. The method of claim 37 wherein the coprocessor comprises a reconfigurable logic device.

39. The method of claim 38 wherein the reconfigurable logic device has firmware deployed thereon, wherein the firmware is configured to perform the processing step.

40. The method of claim 39 wherein the firmware is further configured to perform the enhancing step.

41. The method of claim 36 wherein each rule condition has a corresponding action, the method further comprising:
performing the action corresponding to a rule condition that is identified by the generated rule condition check result.

42. The method of claim 36 wherein the coprocessor comprises at least one of (1) a reconfigurable logic device, (2) a graphics processor unit (GPU), and (3) a chip multiprocessor (CMP).

43. A method for processing a bit stream, the method comprising:
  receiving a bit stream at a coprocessor; and
  the coprocessor processing at least a portion of the bit stream against at least one rule condition to thereby generate a rule condition checking result for the bit stream portion, the rule condition checking result being indicative of a rule condition being satisfied, and wherein the processing step comprises performing an approximate join operation with the coprocessor on data within the received bit stream.

44. The method of claim 43 wherein the coprocessor comprises at least one of (1) a reconfigurable logic device, (2) a graphics processor unit (GPU), and (3) a chip multiprocessor (CMP).

45. A method for processing a bit stream, the method comprising:
  receiving a bit stream at a coprocessor; and
  the coprocessor processing at least a portion of the bit stream against at least one rule condition to thereby generate a rule condition checking result for the bit stream portion, the rule condition checking result being indicative of a rule condition being satisfied, and wherein the processing step comprises performing a join operation with the coprocessor between data within the received bit stream and data stored in a database.

46. The method of claim 45 further comprising:
  enhancing the bit stream with at least one bit corresponding to the rule condition checking result.

47. The method of claim 45 wherein the coprocessor comprises at least one of (1) a reconfigurable logic device, (2) a graphics processor unit (GPU), and (3) a chip multiprocessor (CMP).

48. A system for processing a bit stream, the system comprising:
  a processor; and
  a coprocessor in communication with the processor, wherein the coprocessor comprises a reconfigurable logic device, wherein the reconfigurable logic device has firmware deployed thereon;
  wherein the coprocessor is configured to accept a bit stream;
  wherein the firmware is configured to process at least a portion of the bit stream against at least one rule condition to thereby generate a rule condition check result for the bit stream portion, the rule condition check result being indicative of the at least one rule condition being satisfied; and
  wherein the coprocessor is further configured to enhance the bit stream with at least one bit corresponding to the rule condition check result.

49. The system of claim 48 wherein the firmware is further configured to enhance the bit stream with at least one bit corresponding to the rule condition check result.

50. A system for processing a bit stream, the system comprising:
  a processor; and
  a coprocessor in communication with the processor;
  wherein the coprocessor is configured to (1) accept a bit stream, (2) process at least a portion of the bit stream against at least one rule condition to thereby generate a rule condition check result for the bit stream portion, the rule condition check result being indicative of a rule condition being satisfied, and (3) enhance the bit stream with at least one bit corresponding to the rule condition check result; and wherein, as part of the process operation, the coprocessor is further configured to (1) perform a rule condition check operation on the bit stream portion that compares the bit stream portion with a plurality of rule conditions, and (2) in response to finding a match between the bit stream portion and at least one of the rule conditions, generate a rule condition check result that is indicative of a satisfaction of the at least one rule condition.

51. The system of claim 50 wherein the rule condition check operation comprises a matching operation.

52. The system of claim 51 wherein the matching operation comprises an exact word matching operation.

53. The system of claim 51 wherein the matching operation comprises an approximate word matching operation.

54. The system of claim 51 wherein the matching operation comprises a regular expression pattern matching operation.

55. The system of claim 51 wherein the coprocessor is further configured to filter the accepted bit stream to thereby provide a reduced bit stream for use by the matching operation.

56. The system of claim 55 wherein the bit stream comprises a plurality of records, each record having at least one data field, the at least one data field having a data value, and wherein coprocessor is further configured to filter the accepted bit stream by passing only data corresponding to at least one pre-selected data field for use by the matching operation.

57. The system of claim 51 wherein the rule condition check operation comprises a range check operation.

58. The system of claim 51 wherein the rule condition check operation comprises a threshold check operation.

59. The system of claim 50 wherein the bit stream comprises a plurality of records, and wherein the coprocessor is further configured to enhance the bit stream by generating a new record for insertion in the bit stream, the new record being indicative of the generated rule condition check result.

60. The system of claim 50 wherein the bit stream comprises a plurality of records, and wherein the coprocessor is further configured to enhance the bit stream by appending a bit string indicative of the generated rule condition check result to the record for which the rule condition check result was generated.

61. The system of claim 50 wherein the coprocessor is further configured to pass the enhanced bit stream to the processor for post-processing that is based at least in part on the generated rule condition check result.

62. The system of claim 46 wherein the processor is configured to perform the post-processing, wherein the post-processing comprises a routing operation to route at least a portion of the enhanced bit stream to a particular destination within a network based at least in part on the generated rule condition check result.

63. The system of claim 50 wherein the coprocessor is further configured to process bits within the accepted bit stream within a plurality of parallel paths, at least a plurality of the paths being configured to independently process at least a portion of the bit stream against a plurality of rule conditions.

64. The system of claim 50 wherein the coprocessor is further configured to:
  compute an aggregate value based at least in part upon the bit stream portion;
  determine whether a rule condition is satisfied based at least in part upon the computed aggregate value; and in response to a determination that that rule condition is satisfied, generate a rule condition check result indicative of that rule condition's satisfaction.

65. The system of claim 50 wherein the coprocessor is further configured to:
compute a derived value based at least in part upon the bit stream portion;
determine whether a rule condition is satisfied based at least in part upon the computed derived value; and
in response to a determination that that rule condition is satisfied, generate a rule condition check result indicative of that rule condition's satisfaction.

66. The system of claim 50 wherein the coprocessor comprises at least one of (1) a reconfigurable logic device, (2) a graphics processor unit (GPU), and (3) a chip multi-processor (CMP).

67. A system for processing a bit stream, the system comprising:
a processor; and
a coprocessor in communication with the processor;
wherein the coprocessor is configured to (1) accept a bit stream, (2) process at least a portion of the bit stream against at least one rule condition to thereby generate a rule condition check result for the bit stream portion, the rule condition check result being indicative of a rule condition being satisfied, and (3) pass the enhanced bit stream to the processor for post-processing that is based at least in part on the generated rule condition check result; and
wherein the processor is configured to perform the post-processing, wherein the post-processing comprises (1) an operation to select a location within a network for storing at least a portion of the enhanced bit stream based at least in part on the generated rule condition check result and (2) an operation to store that enhanced bit stream portion in the selected location.

68. The system of claim 67 wherein the coprocessor comprises at least one of (1) a reconfigurable logic device, (2) a graphics processor unit (GPU), and (3) a chip multi-processor (CMP).

69. A system for processing a bit stream, the system comprising:
a processor; and
a coprocessor in communication with the processor;
wherein the coprocessor is configured to (1) accept a bit stream, wherein the bit stream comprises a plurality of records, each record having at least one data field, the at least one data field having a data value, and (2) process at least a portion of the bit stream against at least one rule condition to thereby generate a rule condition check result for the bit stream portion, the rule condition check result being indicative of a rule condition being satisfied; and
wherein, as part of the process operation, the coprocessor is further configured to process bits within the accepted bit stream within a plurality of parallel paths, at least a plurality of the paths being configured to independently process at least a portion of the bit stream against a plurality of rule conditions such that the coprocessor is further configured to:
within a first of the parallel paths, (1) filter the bit stream to pass only data corresponding to at least one pre-selected data field, and (2) process that passed data against at least one rule condition to thereby generate a rule condition check result for that passed data if that passed data satisfies that at least one rule condition; and
within a second of the parallel paths, (1) filter the bit stream to pass only data corresponding to at least one pre-selected data field that is different than the at least one pre-selected data field of the first path, and (2) process that passed data against at least one rule condition to thereby generate a rule condition check result for that passed data if that passed data satisfies that at least one rule condition.

70. The system of claim 69 wherein the coprocessor is further configured to perform a merge operation to merge data outputs for the plurality of parallel paths.

71. The system of claim 70 wherein one of the parallel paths comprises a bypass path over which the accepted bit stream is delivered to the merge operation, and wherein the merge operation is configured to insert data corresponding to the rule condition check results generated within the plurality of paths into the received bit stream at a plurality of locations.

72. The system of claim 69 wherein the coprocessor comprises at least one of (1) a reconfigurable logic device, (2) a graphics processor unit (GPU), and (3) a chip multi-processor (CMP).

73. A system for processing a bit stream, the system comprising:
a processor; and
a coprocessor in communication with the processor;
wherein the coprocessor is configured to (1) accept a bit stream, and (2) process at least a portion of the bit stream against at least one rule condition to thereby generate a rule condition check result for the bit stream portion, the rule condition check result being indicative of a rule condition being satisfied;
wherein, as part of the process operation, the coprocessor is further configured to compute an aggregate value based at least in part upon the bit stream portion;
determine whether a rule condition is satisfied based at least in part upon the computed aggregate value; and
in response to a determination that that rule condition is satisfied, generate a rule condition check result indicative of that rule condition's satisfaction; and
wherein the coprocessor is further configured to:
store the aggregate value in memory; and
retrieve the aggregate value from memory as additional bit stream portions are processed by the coprocessor.

74. The system of claim 73 wherein the coprocessor is further configured to enhance the bit stream with at least one bit corresponding to the rule condition checking result.

75. The system of claim 74 wherein the coprocessor comprises a reconfigurable logic device.

76. The system of claim 73 wherein each rule condition has a corresponding action, and wherein at least one of the group consisting of the processor and the coprocessor is configured to perform the action corresponding to a rule condition that is identified by the generated rule condition check result.

77. The system of claim 73 wherein the coprocessor comprises at least one of (1) a reconfigurable logic device, (2) a graphics processor unit (GPU), and (3) a chip multi-processor (CMP).

78. A system for processing a bit stream, the system comprising:
a processor; and
a coprocessor in communication with the processor;
wherein the coprocessor is configured to (1) accept a bit stream, wherein the bit stream comprises a plurality of records, each record having at least one data field, the at least one data field having a data value, and (2)

process at least a portion of the bit stream against at least one rule condition to thereby generate a rule condition check result for the bit stream portion, the rule condition check result being indicative of a rule condition being satisfied;

wherein, as part of the process operation, the coprocessor is further configured to:
- filter the bit stream to pass only data corresponding to at least one pre-selected data field;
- perform a range check on the each field of the passed data to determine whether the passed data has a data value within a range of acceptable values corresponding to at least one range-based rule condition; and
- in response to a determination that that at least one range-based rule condition is satisfied, generate a rule condition check result indicative of that range-based rule condition's satisfaction.

79. The system of claim 78 wherein the coprocessor comprises at least one of (1) a reconfigurable logic device, (2) a graphics processor unit (GPU), and (3) a chip multi-processor (CMP).

80. A system for processing a bit stream, the system comprising:
- a processor; and
- a coprocessor in communication with the processor;
- wherein the coprocessor is configured to (1) accept a bit stream, and (2) process at least a portion of the bit stream against at least one rule condition to thereby generate a rule condition check result for the bit stream portion, the rule condition check result being indicative of a rule condition being satisfied, and
- wherein, as part of the process operation, the coprocessor is further configured to perform an approximate join operation on data within the accepted bit stream.

81. The system of claim 80 wherein the coprocessor comprises at least one of (1) a reconfigurable logic device, (2) a graphics processor unit (GPU), and (3) a chip multi-processor (CMP).

82. A system for processing a bit stream, the system comprising:
- a processor; and
- a coprocessor in communication with the processor and a database;
- wherein the coprocessor is configured to (1) accept a bit stream, and (2) process at least a portion of the bit stream against at least one rule condition to thereby generate a rule condition check result for the bit stream portion, the rule condition check result being indicative of a rule condition being satisfied; and
- wherein, as part of the process operation, the coprocessor is further configured to perform a join operation between data within the accepted bit stream and data stored in the database.

83. The system of claim 82 wherein the coprocessor comprises at least one of (1) a reconfigurable logic device, (2) a graphics processor unit (GPU), and (3) a chip multi-processor (CMP).

* * * * *